US012646549B2

(12) United States Patent
Dokania et al.

(10) Patent No.: US 12,646,549 B2
(45) Date of Patent: Jun. 2, 2026

(54) NON-LINEAR POLAR MATERIAL BASED MULTI-CAPACITOR BIT-CELL WITH SHARED GAIN ELEMENT WITH SERIES TRANSISTOR

(71) Applicant: Kepler Computing Inc., San Francisco, CA (US)

(72) Inventors: Rajeev Kumar Dokania, Beaverton, OR (US); Mustansir Yunus Mukadam, Seattle, WA (US); Erik Unterborn, Cary, NC (US); Pramod Kolar, Cary, NC (US); Amrita Mathuriya, Portland, OR (US); Debo Olaosebikan, San Francisco, CA (US); Tanay Gosavi, Portland, OR (US); Noriyuki Sato, Palo Alto, CA (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 46 days.

(21) Appl. No.: 18/781,916

(22) Filed: Jul. 23, 2024

(65) Prior Publication Data

US 2024/0379144 A1     Nov. 14, 2024

Related U.S. Application Data

(63) Continuation of application No. 18/161,808, filed on Jan. 30, 2023, now Pat. No. 12,334,127.

(51) Int. Cl.
G11C 11/22            (2006.01)

(52) U.S. Cl.
CPC ........ G11C 11/221 (2013.01); G11C 11/2255 (2013.01); G11C 11/2257 (2013.01); G11C 11/2259 (2013.01); G11C 11/2273 (2013.01)

(58) Field of Classification Search
CPC .............................. G11C 11/221; G11C 11/22
(Continued)

(56) References Cited

U.S. PATENT DOCUMENTS

| | | | |
|---|---|---|---|
| 4,809,225 A | 2/1989 | Dimmler et al. | |
| 4,853,893 A | 8/1989 | Eaton, Jr. et al. | |

(Continued)

FOREIGN PATENT DOCUMENTS

| | | | |
|---|---|---|---|
| EP | 0798736 A2 | 10/1997 | |
| JP | H0982907 A | 3/1997 | |

(Continued)

OTHER PUBLICATIONS

Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.*

(Continued)

*Primary Examiner* — Muna A Techane
(74) *Attorney, Agent, or Firm* — MUGHAL GAUDRY & FRANKLIN PC

(57)            ABSTRACT

Described herein is a memory bit-cell that results in lower leakage and higher sensing margin. In at least one embodiment, a memory bit-cell comprises a plurality of capacitors, wherein an individual capacitor is coupled to a node and an individual plate-line. In at least one embodiment, memory bit-cell comprises a first transistor coupled to the node. In at least one embodiment, memory bit-cell comprises a second transistor coupled in series with the first transistor, wherein the second transistor is coupled to a bit-line, wherein the first transistor or the second transistor is controllable by a word-line, and wherein the word-line is parallel to the individual plate-line.

20 Claims, 54 Drawing Sheets

(58) Field of Classification Search
USPC ........................................................ 365/145
See application file for complete search history.

(56) References Cited

U.S. PATENT DOCUMENTS

| | | | |
|---|---|---|---|
| 5,086,412 | A | 2/1992 | Jaffe et al. |
| 5,218,566 | A | 6/1993 | Papaliolios |
| 5,270,967 | A | 12/1993 | Moazzami et al. |
| 5,381,364 | A | 1/1995 | Chern et al. |
| 5,383,150 | A | 1/1995 | Nakamura et al. |
| 5,539,279 | A | 7/1996 | Takeuchi et al. |
| 5,541,872 | A | 7/1996 | Lowrey et al. |
| 5,638,318 | A | 6/1997 | Seyyedy |
| 5,640,030 | A | 6/1997 | Kenney |
| 5,760,432 | A | 6/1998 | Abe et al. |
| 5,917,746 | A | 6/1999 | Seyyedy |
| 5,926,413 | A | 7/1999 | Yamada et al. |
| 5,969,380 | A | 10/1999 | Seyyedy |
| 6,002,608 | A | 12/1999 | Tanabe |
| 6,028,784 | A | 2/2000 | Mori et al. |
| 6,031,754 | A | 2/2000 | Derbenwick et al. |
| 6,043,526 | A | 3/2000 | Ochiai |
| 6,147,895 | A | 11/2000 | Kamp |
| 6,346,741 | B1 | 2/2002 | Buskirk et al. |
| 6,358,810 | B1 | 3/2002 | Dornfest et al. |
| 6,388,281 | B1 | 5/2002 | Jung et al. |
| 6,483,737 | B2 | 11/2002 | Takeuchi et al. |
| 6,500,678 | B1 | 12/2002 | Aggarwal et al. |
| 6,515,957 | B1 | 2/2003 | Newns et al. |
| 6,538,914 | B1 | 3/2003 | Chung |
| 6,548,343 | B1 | 4/2003 | Summerfelt et al. |
| 6,587,367 | B1 | 7/2003 | Nishimura et al. |
| 6,590,245 | B2 | 7/2003 | Ashikaga |
| 6,610,549 | B1 | 8/2003 | Aggarwal et al. |
| 6,643,163 | B2 * | 11/2003 | Takashima .............. G11C 7/12 |
| | | | 365/230.06 |
| 6,646,906 | B2 | 11/2003 | Salling |
| 6,656,301 | B2 | 12/2003 | Kirby |
| 6,656,748 | B2 | 12/2003 | Hall et al. |
| 6,713,342 | B2 | 3/2004 | Celii et al. |
| 6,717,838 | B2 | 4/2004 | Hosoi |
| 6,720,600 | B2 | 4/2004 | Okita |
| 6,728,128 | B2 | 4/2004 | Nishimura et al. |
| 6,734,477 | B2 | 5/2004 | Moise et al. |
| 6,795,331 | B2 | 9/2004 | Noro |
| 6,798,686 | B2 | 9/2004 | Takashima |
| 6,809,949 | B2 | 10/2004 | Ho |
| 6,819,584 | B2 | 11/2004 | Noh |
| 6,856,534 | B2 | 2/2005 | Rodriguez et al. |
| 6,873,536 | B2 | 3/2005 | Komatsuzaki |
| 6,906,944 | B2 | 6/2005 | Takeuchi et al. |
| 6,924,997 | B2 | 8/2005 | Chen et al. |
| 7,029,925 | B2 | 4/2006 | Celii et al. |
| 7,173,844 | B2 | 2/2007 | Lee et al. |
| 7,405,959 | B2 | 7/2008 | Koide et al. |
| 7,426,130 | B2 | 9/2008 | Jeon |
| 7,514,734 | B2 | 4/2009 | Aggarwal et al. |
| 7,642,099 | B2 | 1/2010 | Fukada et al. |
| 7,791,922 | B2 | 9/2010 | Doumae et al. |
| 7,812,385 | B2 | 10/2010 | Noda |
| 8,129,200 | B2 | 3/2012 | Kang |
| 8,177,995 | B2 | 5/2012 | Kobayashi et al. |
| 8,300,446 | B2 | 10/2012 | Qidwai |
| 8,441,833 | B2 | 5/2013 | Summerfelt et al. |
| 8,508,974 | B2 | 8/2013 | Clinton et al. |
| 8,665,628 | B2 | 3/2014 | Kawashima |
| 8,717,800 | B2 | 5/2014 | Clinton et al. |
| 8,865,628 | B2 | 10/2014 | Manabe et al. |
| 9,472,560 | B2 | 10/2016 | Ramaswamy et al. |
| 9,786,348 | B1 | 10/2017 | Kawamura et al. |
| 9,812,204 | B1 | 11/2017 | Yan et al. |
| 9,818,468 | B2 | 11/2017 | Müller |
| 9,830,969 | B2 | 11/2017 | Slesazeck et al. |
| 10,043,567 | B2 | 8/2018 | Slesazeck et al. |
| 10,354,712 | B2 | 7/2019 | Derner et al. |
| 10,600,808 | B2 | 3/2020 | Schröder |
| 10,847,201 | B2 | 11/2020 | Manipatruni et al. |
| 10,854,265 | B2 * | 12/2020 | Toops ................... G11C 11/221 |
| 10,872,905 | B2 | 12/2020 | Müller |
| 10,963,776 | B2 | 3/2021 | Mulaosmanovic et al. |
| 10,998,025 | B2 | 5/2021 | Manipatruni et al. |
| 11,482,270 | B1 | 10/2022 | Dokania et al. |
| 11,532,635 | B1 * | 12/2022 | Dokania ............. G11C 11/2257 |
| 2002/0079520 | A1 | 6/2002 | Nishihara et al. |
| 2002/0125517 | A1 | 9/2002 | Nakamura |
| 2002/0153550 | A1 | 10/2002 | An et al. |
| 2003/0012984 | A1 | 1/2003 | Ueda |
| 2003/0112650 | A1 | 6/2003 | Kang |
| 2003/0119211 | A1 | 6/2003 | Summerfelt et al. |
| 2003/0129847 | A1 | 7/2003 | Celii et al. |
| 2003/0141528 | A1 | 7/2003 | Ito |
| 2004/0027873 | A1 | 2/2004 | Nishihara |
| 2004/0089854 | A1 | 5/2004 | Chen et al. |
| 2004/0104754 | A1 | 6/2004 | Bruchhaus et al. |
| 2004/0129961 | A1 | 7/2004 | Araujo et al. |
| 2004/0184307 | A1 * | 9/2004 | Saito ..................... G11C 11/221 |
| | | | 365/145 |
| 2004/0233696 | A1 | 11/2004 | Kang |
| 2004/0245547 | A1 | 12/2004 | Stipe |
| 2005/0012126 | A1 | 1/2005 | Udayakumar et al. |
| 2005/0214954 | A1 | 9/2005 | Maruyama et al. |
| 2005/0230725 | A1 | 10/2005 | Aggarwal et al. |
| 2005/0244988 | A1 | 11/2005 | Wang et al. |
| 2006/0001070 | A1 | 1/2006 | Park et al. |
| 2006/0002170 | A1 | 1/2006 | Kumura et al. |
| 2006/0006447 | A1 | 1/2006 | Kim et al. |
| 2006/0073613 | A1 | 4/2006 | Aggarwal et al. |
| 2006/0073614 | A1 | 4/2006 | Hara |
| 2006/0134808 | A1 | 6/2006 | Summerfelt et al. |
| 2006/0258113 | A1 | 11/2006 | Sandhu et al. |
| 2007/0298521 | A1 | 12/2007 | Obeng et al. |
| 2008/0007987 | A1 * | 1/2008 | Takashima .............. G11C 11/22 |
| | | | 365/145 |
| 2008/0073680 | A1 | 3/2008 | Wang |
| 2008/0081380 | A1 | 4/2008 | Celii et al. |
| 2008/0101107 | A1 | 5/2008 | Shiga et al. |
| 2008/0107885 | A1 | 5/2008 | Alpay et al. |
| 2008/0191252 | A1 | 8/2008 | Nakamura et al. |
| 2009/0003042 | A1 | 1/2009 | Lee et al. |
| 2009/0103348 | A1 * | 4/2009 | Du .......................... G11C 11/22 |
| | | | 365/145 |
| 2012/0127776 | A1 | 5/2012 | Kawashima |
| 2012/0134196 | A1 | 5/2012 | Evans, Jr. et al. |
| 2012/0307545 | A1 | 12/2012 | McAdams et al. |
| 2012/0313218 | A1 | 12/2012 | Fujimori et al. |
| 2013/0147295 | A1 | 6/2013 | Shimizu |
| 2014/0208041 | A1 | 7/2014 | Hyde et al. |
| 2015/0069481 | A1 | 3/2015 | Sun et al. |
| 2015/0294702 | A1 | 10/2015 | Lee et al. |
| 2017/0069735 | A1 | 3/2017 | Oh et al. |
| 2017/0277459 | A1 | 9/2017 | Rodriguez et al. |
| 2017/0345831 | A1 | 11/2017 | Chavan et al. |
| 2018/0082981 | A1 | 3/2018 | Gowda |
| 2018/0226418 | A1 | 8/2018 | Morandi et al. |
| 2018/0286987 | A1 | 10/2018 | Lee et al. |
| 2018/0323309 | A1 | 11/2018 | Ando et al. |
| 2018/0331113 | A1 | 11/2018 | Liao et al. |
| 2019/0051642 | A1 | 2/2019 | Gupta Hyde et al. |
| 2019/0051815 | A1 | 2/2019 | Kakinuma et al. |
| 2019/0115353 | A1 | 4/2019 | O'Brien et al. |
| 2019/0138893 | A1 | 5/2019 | Sharma et al. |
| 2020/0004583 | A1 | 1/2020 | Kelly et al. |
| 2020/0051607 | A1 | 2/2020 | Pan et al. |
| 2020/0273867 | A1 | 8/2020 | Manipatruni et al. |
| 2020/0357453 | A1 | 11/2020 | Slesazeck et al. |
| 2021/0090662 | A1 | 3/2021 | Mennenga et al. |
| 2021/0111179 | A1 | 4/2021 | Shivaraman et al. |
| 2021/0142837 | A1 | 5/2021 | Yu et al. |
| 2021/0193209 | A1 | 6/2021 | Swami et al. |

(56) References Cited

U.S. PATENT DOCUMENTS

| | | | |
|---|---|---|---|
| 2021/0398580 | A1 | 12/2021 | Yuh |
| 2022/0076748 | A1 | 3/2022 | Vimercati |

FOREIGN PATENT DOCUMENTS

| | | |
|---|---|---|
| JP | H10242426 A | 9/1998 |
| JP | H10255484 A | 9/1998 |
| JP | H1174488 A | 3/1999 |
| JP | 2000174224 A | 6/2000 |
| JP | 2001237393 A | 8/2001 |
| JP | 2002026256 A | 1/2002 |
| JP | 2002158339 A | 5/2002 |
| JP | 2003123465 A | 4/2003 |
| JP | 2005057103 A | 3/2005 |
| JP | 2005142322 A | 6/2005 |
| JP | 2005322925 A | 11/2005 |
| JP | 2006164321 A | 6/2006 |
| JP | 3959341 B2 | 8/2007 |
| JP | 2008210955 A | 9/2008 |
| JP | 2010021544 A | 1/2010 |
| JP | 2011151370 A | 8/2011 |
| JP | 2017518632 A | 7/2017 |
| KR | 20050105695 A | 11/2005 |
| KR | 1020120124056 | 11/2012 |
| KR | 102333566 | 12/2021 |
| TW | 200718237 A | 5/2007 |
| TW | 200919705 A | 5/2009 |
| TW | 200935151 A | 8/2009 |
| TW | 201227879 A | 7/2012 |
| TW | 201725736 A | 7/2017 |
| WO | 20130147295 | 10/2013 |
| WO | 2013147295 A4 | 7/2014 |
| WO | 2015167887 A1 | 11/2015 |
| WO | 2021112247 A1 | 6/2021 |

OTHER PUBLICATIONS

Notice of Allowance notified Jan. 30, 2023 for U.S. Appl. No. 17/531,535.
Notice of Allowance notified Jul. 27, 2020 for U.S. Appl. No. 16/287,927.
Notice of Allowance notified Jun. 9, 2022 for U.S. Appl. No. 16/288,006.
Notice of Allowance notified Jun. 10, 2022 for U.S. Appl. No. 16/288,004.
Notice of Allowance notified Jun. 13, 2022 for U.S. Appl. No. 16/287,953.
Notice of Allowance notified Jun. 15, 2022 for U.S. Appl. No. 17/367,083.
Notice of Allowance notified Jun. 23, 2022 for U.S. Appl. No. 17/367,172.
Notice of Allowance notified Jun. 23, 2022 for U.S. Appl. No. 17/367,210.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Oct. 20, 2022 for Taiwan Patent Application No. 110129115.
Notice of Allowance notified Oct. 31, 2022 for U.S. Appl. No. 17/390,796.
Notice of Allowance notified Sep. 13, 2022 for U.S. Appl. No. 17/530,364.
Notice of Allowance notified Sep. 14, 2022 for U.S. Appl. No. 17/530,360.
Notice of Allowance notified Sep. 21, 2022 for U.S. Appl. No. 17/530,366.
Notice of Allowance notified Sep. 23, 2022 for U.S. Appl. No. 17/339,850.

Notice of Allowance notified Sep. 26, 2022 for U.S. Appl. No. 17/367,217.
Notice of Allowance notified Sep. 27, 2022 for U.S. Appl. No. 17/346,083.
Notice of Grant notified May 18, 2021 for Taiwan Patent Application No. 109106095.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Nov. 22, 2022 for Japanese Patent Application No. 2021-546864.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Restriction Requirement notified Aug. 5, 2022 for U.S. Appl. No. 17/359,325.
Restriction Requirement notified Aug. 26, 2022 for U.S. Appl. No. 17/390,796.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Second Office Action notified Jul. 26, 2022 for Taiwan Patent Application No. 110129115.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
1st Office Action notified Dec. 11, 2020 for Taiwan Patent Application No. 109106095.
1st Taiwan Office Action notified Mar. 3, 2022 for Taiwan Patent Application No. 110129115.
Advisory Action notified Jul. 25, 2022 for U.S. Appl. No. 17/339,850.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No.03CH37408), Kyoto, Japan, 2003, pp. 173-174.
Final Office Action notified Apr. 25, 2022 for U.S. Appl. No. 16/287,953.
Final Office Action notified Aug. 15, 2022 for U.S. Appl. No. 17/346,083.
Final Office Action notified Jun. 13, 2022 for U.S. Appl. No. 17/339,850.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
Final Office Action notified Sep. 12, 2022 for U.S. Appl. No. 17/367,217.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.

(56)  References Cited

OTHER PUBLICATIONS

International Search Report & Written Opinion notified May 24, 2024 for PCT Patent Application No. PCT/US2024/013401.

Jung, D. et al., "Highly manufacturable 1T1C 4 Mb FRAM with novel sensing scheme," International Electron Devices Meeting 1999. Technical Digest (Cat. No.99CH36318), Washington, DC, USA, 1999, pp. 279-282., International Electron Devices Meeting 1999. Technical Digest (Cat. No.99CH36318), Washington, DC, USA, 1999, pp. 279-282.

Non-Final Office Action notified Aug. 5, 2020 for U.S. Appl. No. 16/287,953.

Non-Final Office Action notified Aug. 5, 2020 for U.S. Appl. No. 16/288,004.

Non-Final Office Action notified Aug. 5, 2020 for U.S. Appl. No. 16/288,006.

Non-Final Office Action notified Aug. 16, 2022 for U.S. Appl. No. 17/367,217.

Non-Final Office Action notified Dec. 20, 2021 for U.S. Appl. No. 16/288,004.

Non-Final Office Action notified Jan. 18, 2022 for U.S. Appl. No. 16/287,953.

Non-Final Office Action notified Jan. 19, 2022 for U.S. Appl. No. 16/288,006.

Non-Final Office Action notified Jun. 13, 2022 for U.S. Appl. No. 17/346,083.

Non-Final Office Action notified Jun. 15, 2022 for U.S. Appl. No. 17/367,101.

Non-Final Office Action notified Jun. 26, 2020 for U.S. Appl. No. 16/287,876.

Non-Final Office Action notified Mar. 7, 2022 for U.S. Appl. No. 17/339,850.

Non-Final Office Action notified Mar. 30, 2022 for U.S. Appl. No. 17/346,083.

Non-Final Office Action notified Mar. 31, 2022 for U.S. Appl. No. 17/346,087.

Non-Final Office Action notified Nov. 4, 2022 for U.S. Appl. No. 17/530,362.

Non-Final Office Action notified Nov. 21, 2022 for U.S. Appl. No. 7/532,657.

Non-Final Office Action notified Nov. 28, 2022 for U.S. Appl. No. 17/532,552.

Non-Final Office Action notified Oct. 12, 2022 for U.S. Appl. No. 17/530,363.

Non-Final Office Action notified Oct. 26, 2022 for U.S. Appl. No. 17/531,577.

Non-Final Office Action notified Sep. 1, 2022 for U.S. Appl. No. 17/339,850.

Non-Final Office Action notified Sep. 7, 2022 for U.S. Appl. No. 17/530,360.

Notice of Allowance notified Apr. 20, 2022 for U.S. Appl. No. 17/359,311.

Notice of Allowance notified Aug. 8, 2022 for U.S. Appl. No. 17/529,258.

Notice of Allowance notified Aug. 17, 2022 for U.S. Appl. No. 17/346,087.

Notice of Allowance notified Aug. 22, 2022 for U.S. Appl. No. 7/390,791.

Notice of Allowance notified Aug. 25, 2022 for U.S. Appl. No. 17/367,101.

Notice of Allowance notified Aug. 31, 2022 for U.S. Appl. No. 17/359,325.

Notice of Allowance notified Jan. 12, 2021 for U.S. Appl. No. 16/287,876.

Notice of Allowance notified Jan. 20, 2023 for U.S. Appl. No. 17/532,657.

* cited by examiner

200

Top electrode

Bottom electrode

Linear dielectric

Cd x z

Figure 5A:
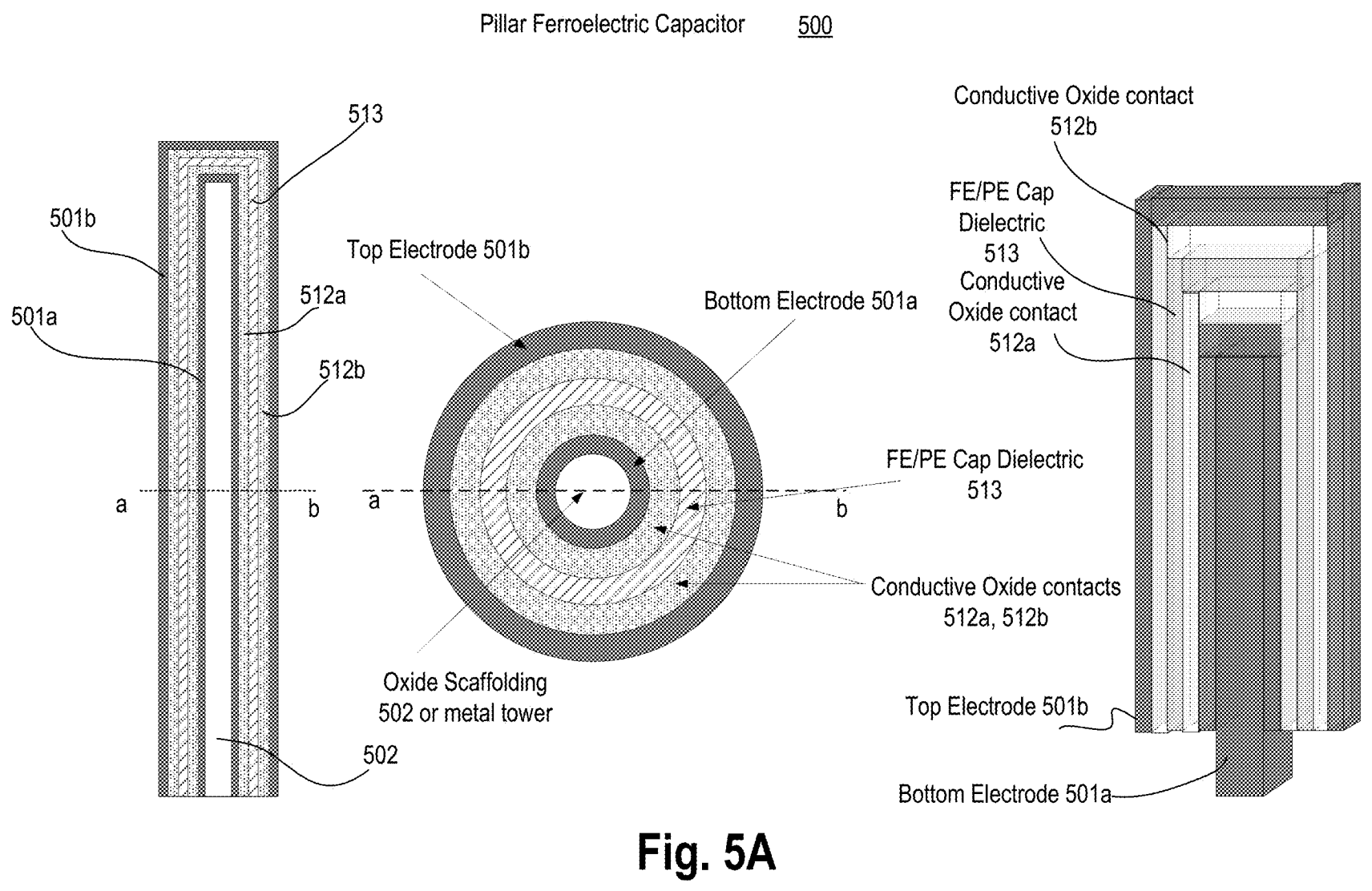

Pillar Ferroelectric Capacitor 500

Conductive Oxide contact 512b

FE/PE Cap Dielectric 513

Conductive Oxide contact 512a

Bottom Electrode 501a

FE/PE Cap Dielectric 513

Conductive Oxide contacts 512a, 512b

Top Electrode 501b

Bottom Electrode 501a

Top Electrode 501b

Oxide Scaffolding 502 or metal tower 502

Multi-element FE gain bit-cell
with series transistor

**Plate-lines parallel
to word-line**

Multi-element FE gain bit-cell
with series transistor

Plate-lines parallel
to word-line

Fig. 10

Multi-element FE gain bit-cell
with series transistor

**Plate-lines parallel
to word-line**

NON-LINEAR POLAR MATERIAL BASED MULTI-CAPACITOR BIT-CELL WITH SHARED GAIN ELEMENT WITH SERIES TRANSISTOR

CLAIM OF PRIORITY

This application claims priority to U.S. patent application Ser. No. 18/161,808, filed on Jan. 30, 2023, titled "NON-LINEAR POLAR MATERIAL BASED MULTI-CAPACITOR HIGH DENSITY BIT-CELL," and now issued as U.S. Pat. No. 12,334,127 on Jun. 17, 2025, which is incorporated by reference in its entirety for all purposes.

BACKGROUND

Memory bit-cells are arranged in rows and columns that form segments, arrays, or banks. When a bit-cell includes multiple capacitive devices for storing charge, size of one or more transistors of the bit-cell may increase to lower threshold voltage variation and to accommodate the multiple capacitive devices. Increasing size of the one or more transistors can add capacitive load to sense-line(s) or bit-line(s) coupled to the bit-cell. Higher capacitive load on sense-line(s) or bit-line(s) reduce sensing noise margin to accurately detect data stored in the bit-cell.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure may be understood more fully from the detailed description given below and from the accompanying drawings of various embodiments of the disclosure, which, however, should not be taken to limit the disclosure to the specific embodiments, but are for explanation and understanding only.

FIG. 5A illustrates a non-planar ferroelectric or paraelectric capacitor structure, in accordance with at least one embodiment.

FIG. 9 illustrates a multi-element gain bit-cell with plate-lines in parallel to a word-line, and where a transistor is coupled in series with a gain transistor which is coupled to a sense-line, in accordance with at least one embodiment.

FIG. 10 illustrates a multi-element gain bit-cell with plate-lines in parallel to a word-line, and where a transistor is coupled to a sense-line and in series with a gain transistor, in accordance with at least one embodiment.

FIG. 29 illustrates a multi-element gain bit-cell with plate-lines parallel to the word-line, where gain transistor is coupled to a sense-line which is in series with a transistor, in accordance with at least one embodiment.

FIG. 30 illustrates a multi-element gain bit-cell with plate-lines parallel to the word-line, where gain transistor is in series with a transistor which is coupled to a sense-line, in accordance with at least one embodiment.

DETAILED DESCRIPTION

Figure 1:
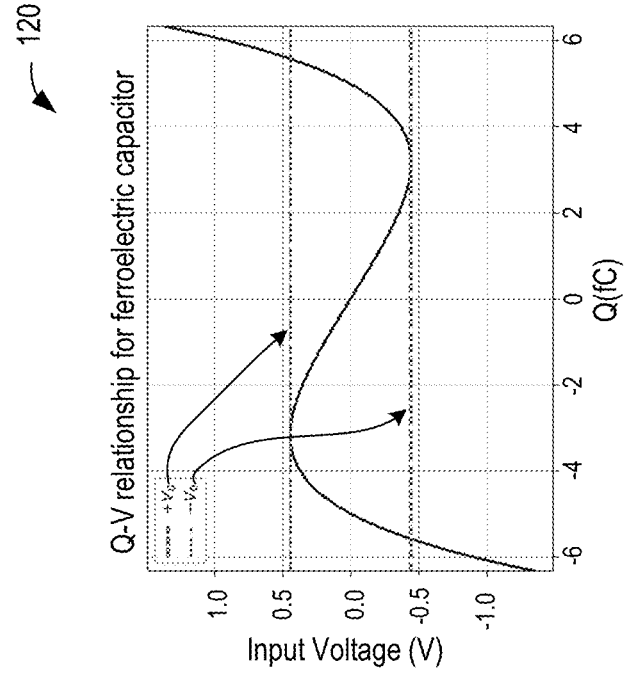
FIG. 1 illustrates a set of plots that show behavior of a ferroelectric capacitor, a paraelectric capacitor, and a linear capacitor.
Figure 1:
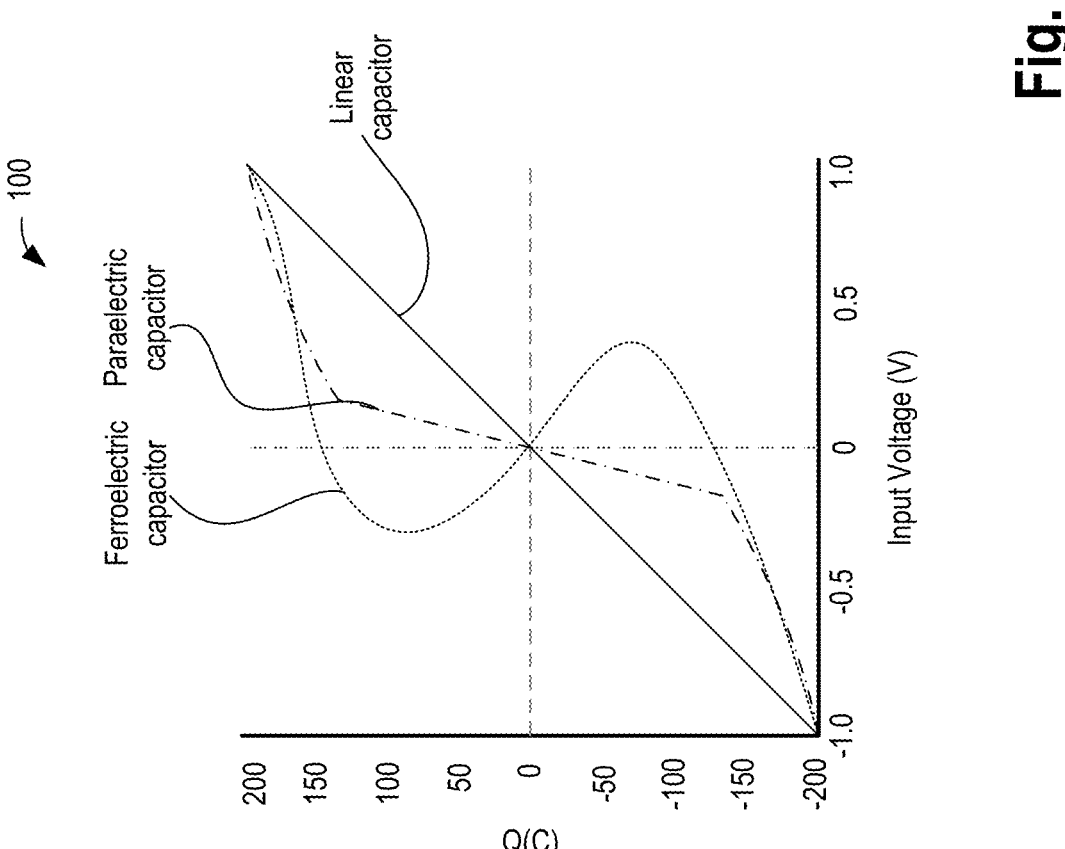

In at least one embodiment, a memory comprises a multi-element gain bit-cell which includes a plurality of capacitors. In at least one embodiment, an individual capacitor is coupled to a node and an individual plate-line. In at least one embodiment, multi-element gain bit-cell comprises a first transistor coupled to the node. In at least one embodiment, first transistor is a gain transistor which may be coupled to a reference Vs (e.g., Vdd/2, bias voltage, ground, etc.). In at least one embodiment, multi-element gain bit-cell comprises a second transistor coupled in series with the first transistor. In at least one embodiment, second transistor is coupled to a sense-line. In at least one embodiment, multi-element gain bit-cell comprises a third transistor (e.g., access transistor) coupled to the node and a bit-line. In at least one embodiment, third transistor is controllable by a word-line. In at least one embodiment, the word-line is parallel to the individual plate-line.

In at least one embodiment, second transistor is controllable by word-line. In at least one embodiment, first transistor is smaller in size than second transistor. In at least one embodiment, second transistor is controllable by a read word-line separate from word-line. In at least one embodiment, an individual capacitor comprises a non-linear polar material. In at least one embodiment, non-linear polar material is directly on the node. In at least one embodiment, non-linear polar material is one of a ferroelectric material, a paraelectric material, or a non-linear dielectric material. In at least one embodiment, non-linear polar material is doped with one or more elements of a 3d, 4d, 5d, 6d, 4f, and 5f series of a periodic table. In at least one embodiment, plurality of capacitors are planar capacitors that are arranged in a stacked and/or folded configuration. In at least one embodiment, bit-line is orthogonal to the word-line and the individual plate-line.

In at least one embodiment, second transistor is controllable to reduce leakage through node to sense-line. In at least one embodiment, leakage through first transistor is controlled during a read operation. In at least one embodiment, by reducing leakage through first transistor, sense margin for memory bit-cell is increased.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a paraelectric capacitor, and a linear capacitor, in accordance with at least one embodiment. Plot 100 compares transfer function for a linear capacitor, a ferroelectric (PE) capacitor (a nonlinear capacitor), and a paraelectric (FE) capacitor (a nonlinear capacitor). Here, x-axis is input voltage or voltage across a capacitor, while y-axis is charge on a capacitor. In at least one embodiment, ferroelectric (FE) material can be any suitable low voltage FE material that allows FE material to switch its state by a low voltage (e.g., 100 mV). In at least one embodiment, threshold in FE material has a highly nonlinear transfer function in polarization versus voltage response. In at least one embodiment, threshold is related to: a) nonlinearity of switching transfer function; and b) squareness of FE switching. In at least one embodiment, nonlinearity of switching transfer function is width of derivative of polarization versus voltage plot. In at least one embodiment, squareness is defined by a ratio of remnant polarization to saturation polarization, where perfect squareness will show a value of 1. In at least one embodiment, squareness of FE switching can be suitably manipulated with chemical substitution. For example, in $PbTiO_3$ a P-E (polarization-electric field) square loop can be modified by La or Nb substitution to create an S-shaped loop. In at least one embodiment, shape can be systematically tuned to ultimately yield a nonlinear dielectric. In at least one embodiment, squareness of FE switching can also be changed by granularity of an FE layer. In at least one embodiment, a perfectly epitaxial, single crystalline FE layer may show higher squareness (e.g., ratio is closer to 1) compared to a polycrystalline FE. In at least one embodiment, perfect epitaxial can be accomplished using lattice matched bottom and top electrodes. In at least one embodiment, BiFeO (BFO) can be epitaxially synthesized using a lattice matched $SrRuO_3$ bottom electrode yielding P-E loops that are square. In at least one embodiment, progressive doping with La may reduce squareness.

Plot 120 shows charge and voltage relationship for a ferroelectric capacitor, in accordance with at least one embodiment. In at least one embodiment, a capacitor with ferroelectric material is a nonlinear capacitor with its potential $V_F(Q_F)$ as a cubic function of its charge. Plot 120 illustrates characteristics of an FE material, in accordance with at least one embodiment. Plot 120 is a charge-voltage (Q-V) plot for a block of $Pb(Zr_{0.5}Ti_{0.5})O_3$ of area $(100 \text{ nm})^2$ and thickness 30 nm (nanometer), in accordance with at least one embodiment. Plot 120 shows local extrema at $+/-V_o$ indicated by dashed lines. Here, $V_c$ is coercive voltage. In applying a potential V across an FE material, its charge can be unambiguously determined for $|V| > V_o$. Otherwise, charge of an FE material is subject to hysteresis effects.

In at least one embodiment, FE material comprises a perovskite of type $ABO_3$, where 'A' and 'B' are two cations of different sizes, and 'O' is oxygen which is an anion that bonds to both cations. Generally, size of atoms of A is larger than size of B atoms. In at least one embodiment, FE material can be replaced with a non-linear polar material. In at least one embodiment, non-linear polar material is one of a ferroelectric, a paraelectric, or a non-linear dielectric material. In at least one embodiment, non-linear polar material is doped with one or more elements of a 3d, 4d, 5d, 6d, 4f, and 5f series of a periodic table. In at least one embodiment, non-linear polar material includes perovskite that can be doped (e.g., by La or lanthanides). In least one embodiment, non-linear polar material includes lead zirconium titanate (PZT), or PZT with a doping material, wherein doping material is one of La or Nb. In least one embodiment, non-linear polar material includes bismuth ferrite (BFO) with a doping material, wherein the doping material is one of lanthanum, one or more elements from lanthanide series of a periodic table, or one or more elements of a 3d, 4d, 5d, 6d, 4f, and 5f series of periodic table.

In at least one embodiment, non-linear polar material includes a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST). In at least one embodiment, non-linear polar material includes hexagonal ferroelectric which includes one of: $YMnO_3$ or $LuFeO_3$. In at least one embodiment, non-linear polar material includes hexagonal ferroelectrics of a type h-RMnO_3, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides.

In at least one embodiment, non-linear polar material includes hafnium oxide of a form $Hf_{(1-x)}E_xO_z$, wherein 'x' denotes a fraction, and E includes one of Al, Ca, Ce, Dy, Er, Gd, Ge, La, Sc, Si, Sr, Sn, Zr, or Y. In at least one embodiment, non-linear polar material includes $HfO_2$ doped with $E_y$, where E includes one of Al, Ca, Ce, Dy, Er, Gd, Ge, La, Sc, Si, Sr, Sn, or Y, and wherein 'y' is a fraction. In at least one embodiment, non-linear polar material includes, Al(1-x)Sc(x)N, Ga(1-x)Sc(x)N, Al(1-x)Y(x)N or Al(a)Mg(b)Nb(c)N wherein a, b, and c are respective compositional fractions. In at least one embodiment, non-linear polar material includes niobate type compounds including $LiNbO_3$, $LiTaO_3$, $LiTaO_2F_2$, $Sr_xBa_{1-x}Nb_2O_6$ where $0.32 \leq x \leq 0.8$, or $KSr_2Nb_5O_{15}$. In at least one embodiment, non-linear polar material includes an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100. In at least one embodiment, non-linear polar material includes a paraelectric material that comprises $SrTiO_3$, Ba(x)Sr(y)TiO3, $HfZrO_2$, Hf—Si—O, or a PMN-PT based relaxor ferroelectric.

In at least one embodiment, FE material is perovskite, which includes one or more of: La, Sr, Co, Sr, Ru, Y, Ba, Cu, Bi, Ca, or Ni. In at least one embodiment, metallic perovskites such as $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, or $NaTaO_3$, etc. may be used as FE material. In at least one embodiment, perovskites can be suitably doped to achieve a spontaneous distortion in a range of 0.3% to 2%. In at least one embodiment, for chemically substituted lead titanate such as Zr in Ti site; and La or Nb in Ti site, concentration of these substitutes is such that it achieves spontaneous distortion in range of 0.3% to 2%. In at least one embodiment, for chemically substituted BiFeO3, BrCrO3, or BuCoO3 class of materials, La, or rare earth substitution into Bi site can tune spontaneous distortion. In at least one embodiment, FE material is contacted with a conductive metal oxide that includes one of conducting perovskite metallic oxides exemplified by: La—Sr—CoO3, SrRuO3, La—Sr—MnO3, YBa2Cu3O7, Bi2Sr2CaCu2O8, and LaNiO3.

In at least one embodiment, FE material comprises a stack of layers including low voltage FE material between conductive oxides. In at least one embodiment, when FE material is a perovskite, conductive oxides are of type $AA'BB'O_3$. A' is a dopant for atomic site A, it can be an element from lanthanides series. B' is a dopant for atomic site B, it can be an element from transition metal elements, such as Sc, Ti, V, Cr, Mn, Fe, Co, Ni, Cu, or Zn. In at least one embodiment, A' may have same valency of site A, with a different ferroelectric polarizability. In at least one embodiment, when metallic perovskite is used for FE material, conductive oxides can include one or more of: $IrO_2$, $RuO_2$, $PdO_2$, $OsO_2$, or $ReO_3$. In at least one embodiment, perovskite is doped with La or lanthanides. In at least one embodiment, thin layer (e.g., approximately 10 nm) perovskite template conductors such as SrRuO3 coated on top of IrO2, RuO2, PdO2, and PtO2, which have a non-perovskite structure but higher conductivity to provide a seed or template for growth of pure perovskite ferroelectric at low temperatures, are used as conductive oxides. In at least one embodiment, conductive oxides include one or more of: Ir, In, Fe, Ru, Pd, Os, or Re.

In at least one embodiment, ferroelectric materials are doped with s-orbital material (e.g., materials for first period, second period, and ionic third and fourth periods). In at least one embodiment, f-orbital materials (e.g., lanthanides) are doped to ferroelectric material to make paraelectric material. In at least one embodiment, room temperature paraelectric materials include: SrTiO3, Ba(x)Sr(y)TiO3 (where x may be, for example, −0.05 or 0.5, and y may be for example, 0.95), HfZrO2, Hf—Si—O, La-substituted PbTiO3, or PMN-PT based relaxor ferroelectrics.

In at least one embodiment, FE material comprises one or more of: hafnium (Hf), zirconium (Zr), aluminum (Al), dilicon (Si), their oxides, or their alloyed oxides. In at least one embodiment, FE material includes one or more of: Al(1-x)Sc(x)N, Ga(1-x)Sc(x)N, Al(1-x)Y(x)N or Al(1-x-y)Mg(x)Nb(y)N, where x and y are fractions; y doped HfO2, where y includes one of: Al, Ca, Ce, Dy, Er, Gd, Ge, La, Sc, Si, Sr, Sn, or Y. In at least one embodiment, FE material includes one or more of: bismuth ferrite (BFO), lead zirconate titanate (PZT), BFO with doping material, or PZT with doping material, wherein doping material is one of Nb or La; and relaxor ferroelectrics such as PMN-PT.

In at least one embodiment, FE material includes bismuth ferrite (BFO) with a first doping material wherein the first doping material is one of lanthanum, any element from lanthanide series of periodic table, or one or more elements of a 3d, 4d, 5d, 6d, 4f, and 5f series of periodic table. In at least one embodiment, FE material includes lead zirconium titanate (PZT) or PZT with a second doping material, wherein the second doping material is one of La or Nb. In at least one embodiment, FE material includes a relaxor ferroelectric including one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In at least one embodiment, FE material includes hafnium oxides of form, Hf(1-x)Ex Oy where E can be Al, Ca, Ce, Dy, Er, Gd, Ge, La, Sc, Si, Sr, Sn, or Y. In at least one embodiment, FE material includes niobate type compounds LiNbO3, LiTaO3, lithium iron tantalum oxy fluoride, barium strontium niobate, sodium barium niobate, or potassium strontium niobate.

In at least one embodiment, FE material comprises multiple layers. In at least one embodiment, alternating layers of [Bi2O2]2+, and pseudo-perovskite blocks (Bi4Ti3O12 and related Aurivillius phases), with perovskite layers that are 'n' octahedral layers in thickness can be used. In at least one embodiment, FE material comprises organic material. In at least one embodiment, FE material comprises polyvinylidene fluoride or polyvinylidene difluoride (PVDF).

In at least one embodiment, FE material comprises hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). In at least one embodiment, ferroelectric phase is characterized by a buckling of layered $MnO_5$ polyhedra, accompanied by displacements of Y ions, which lead to a net electric polarization. In at least one embodiment, hexagonal FE includes one of: YMnO3 or LuFeO3. In at least one embodiment, when FE material comprises hexagonal ferroelectrics, conductive oxides are of A2O3 (e.g., In2O3, Fe2O3) and ABO3 type, where 'A' is a rare earth element and B is Mn.

In at least one embodiment, FE material comprises improper FE material. An improper ferroelectric is a ferroelectric where primary order parameter is an order mechanism such as strain or buckling of atomic order. In at least one embodiment, improper FE material are $LuFeO_3$ class of materials or super lattice of ferroelectric and paraelectric materials $PbTiO_3$ (PTO) and $SnTiO_3$ (STO), respectively, and $LaAlO_3$ (LAO) and STO, respectively. In at least one embodiment, a super lattice of [PTO/STO]n or [LAO/STO] n, where 'n' is between 1 and 100. In at least one embodiment, paraelectric material includes one of: $SrTiO_3$, $Ba_{(x)}$ $Sr_{(y)}TiO_3$ (where x may be, for example, –0.5, and y may be, for example, 0.95), $BaTiO_3$, $HfZrO_2$, Hf—Si—O, La-substituted $PbTiO_3$, or PMN-PT based relaxor ferroelectrics.

Figure 2:
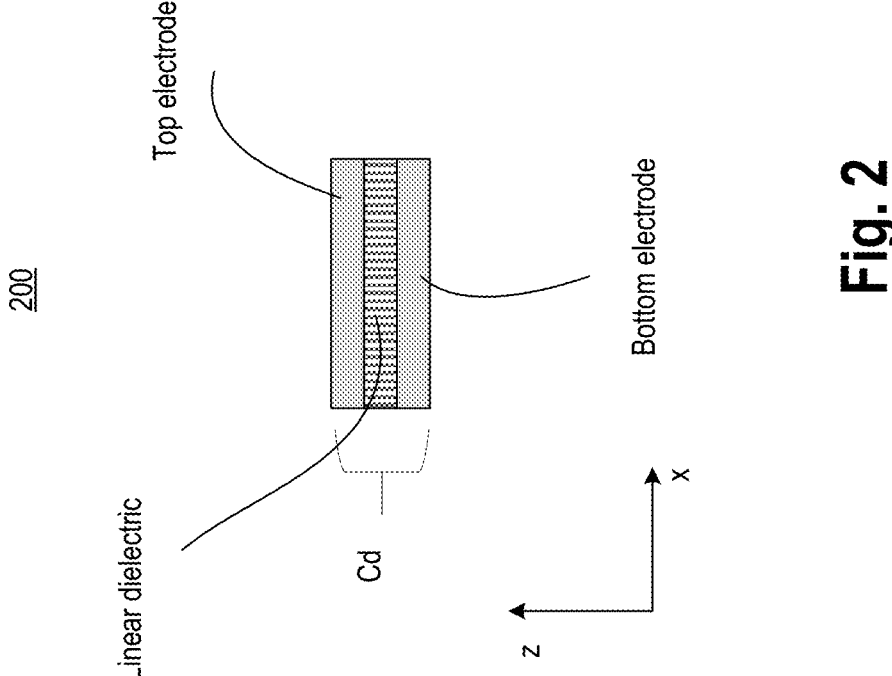
FIG. 2 illustrates a planar linear capacitor structure, in accordance with at least one embodiment.

FIG. 2 illustrates planar capacitor structure 200, in accordance with at least one embodiment. In at least one embodiment, capacitors for multi-input capacitive structures are linear capacitors. In at least one embodiment, capacitors can take any planar form. One such form is illustrated in FIG. 2, in accordance with at least one embodiment. In at least one embodiment, planar capacitor structure 200 is a metal-insulator-metal (MIM) capacitor comprising a bottom electrode, a top electrode, and a linear dielectric between top electrode and bottom electrode as shown. In at least one embodiment, conductive oxide layer(s) are formed between bottom electrode and linear dielectric. In at least one embodiment, conductive oxide layer(s) are formed between top electrode and linear dielectric. In at least one embodiment, conductive oxides include: $IrO_2$, $RuO_2$, $PdO_2$, $OsO_2$, or $ReO_3$. In at least one embodiment, conductive oxides are of form A2O3 (e.g., In2O3, Fe2O3) and ABO3 type, where 'A' is a rare earth element and 'B' is Mn.

In at least one embodiment, dielectric layer includes one or more of: SiO2, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, dielectric layer comprises linear dielectric material. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

Figure 3A:
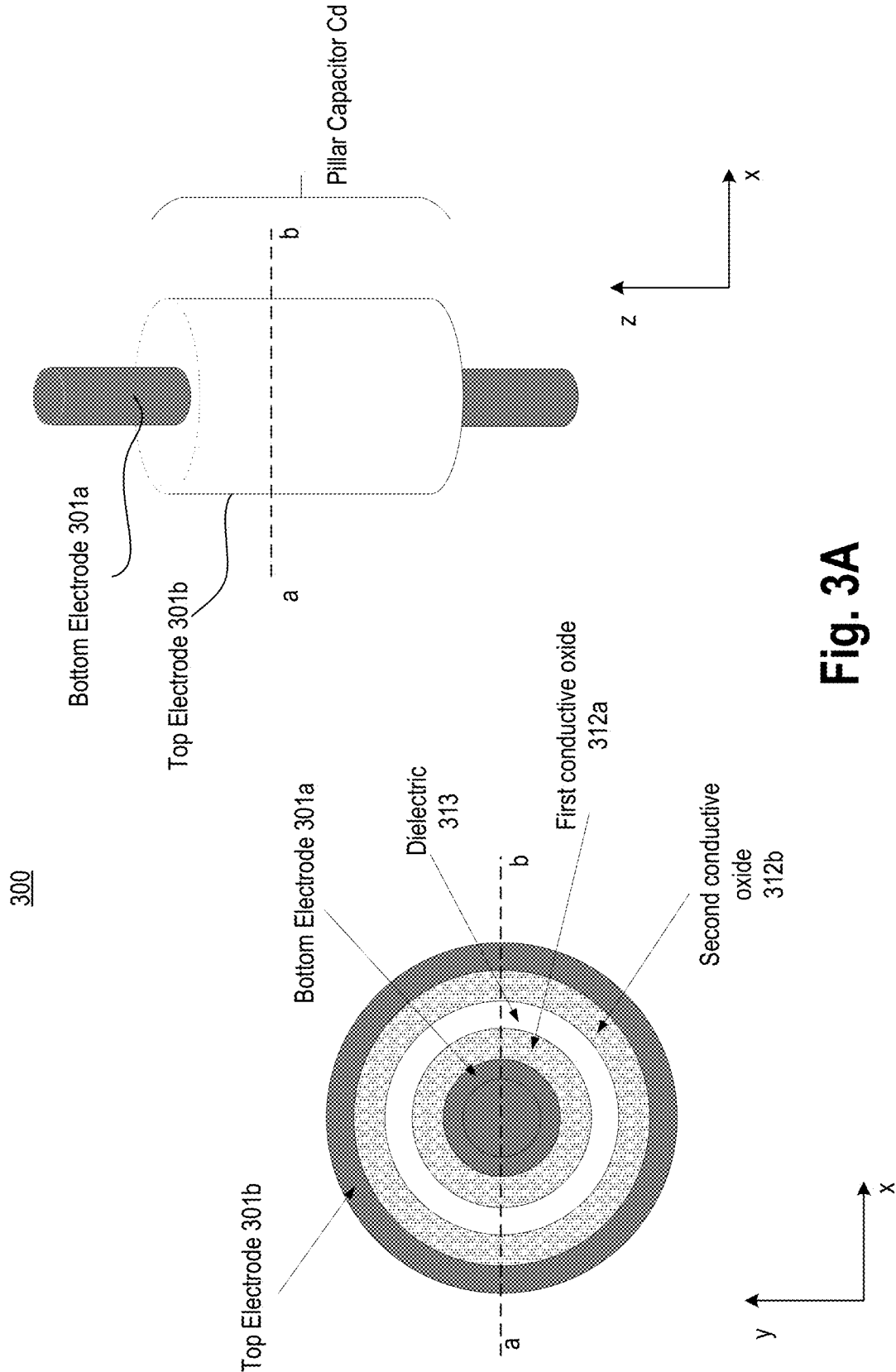
FIG. 3A illustrates a non-planar linear capacitor structure, in accordance with at least one embodiment.

FIG. 3A illustrates a non-planar capacitor structure 300, in accordance with at least one embodiment. In at least one embodiment, non-planar capacitor structure 300 is rectangular in shape. Taking cylindrical shaped case, in at least one embodiment, layers of non-planar capacitor structure 300 from center going outwards include bottom electrode 301a, first conductive oxide 312a, linear dielectric material 313, second conductive oxide 312b, and top electrode 301b. A cross-sectional view along "ab" dashed line is illustrated in middle of FIG. 3A. In at least one embodiment, conducting oxides are removed and linear dielectric is directly connected to top electrode 301b and bottom electrodes 301a. In at least one embodiment, linear dielectric material 313 can include any suitable dielectric, where thickness of dielectric film is a range of 1 nm to 20 nm. In at least one embodiment, linear dielectric material 313 comprises a higher-K dielectric material. In at least one embodiment, linear dielectrics include one of: $SIO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, or zirconium silicon oxide.

In at least one embodiment, first conductive oxide 312a is conformally deposited over bottom electrode 301a. In at least one embodiment, dielectric material 313 is conformally deposited over first conductive oxide 312a. In at least one embodiment, second conductive oxide 312b is conformally deposited over dielectric material 313. In at least one embodiment, top electrode 301b is conformally deposited over second conductive oxide 312b. In at least one embodiment, bottom electrode 301a is in center while top electrode 301b is on an outer circumference of non-planar capacitor structure 300.

In at least one embodiment, material for bottom electrode 301a may include one or more of: Cu, Al, Ag, Au, W, or Co, or their alloys. In at least one embodiment, material for first conductive oxide 312a include: $IrO_2$, $RuO_2$, $PdO_2$, $OsO_2$, or $ReO_3$. In at least one embodiment, conductive oxides are of form $A_2O_3$ (e.g., $In_2O_3$, $Fe_2O_3$) and $ABO_3$ type, where 'A' is a rare earth element and 'B' is Mn. In at least one embodiment, material for second conductive oxide 312b may be same as material for first conductive oxide 312a. In at least one embodiment, material for top electrode 301b may include one or more of: Cu, Al, Ag, Au, W, or Co, or their alloys.

In at least one embodiment, a first refractive intermetallic (not shown) is formed between dielectric material 313 and first conductive oxide 312a. In at least one embodiment, second refractive intermetallic (not shown) is formed between dielectric capacitor material 313 and second conductive oxide 312b. In at least one embodiment, first and second refractive intermetallic are directly adjacent to their respective conductive oxide layers and to dielectric capacitor material 313. In at least one embodiment, refractive intermetallic maintains capacitive properties of dielectric capacitor material 313. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, $TiAl_3$; Ni—Al such as $Ni_3Al$, NiAl3, NiAl; Ni—Ti, Ni—Ga, or $Ni_2MnGa$; FeGa or $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B and Mg can markedly enhance other properties. In at least one embodiment, thicknesses of layers of non-planar capacitor structure 300 in x-axis are in range of 1 nm to 30 nm. In at least one embodiment, refractive intermetallic layers are not used for non-planar capacitor structure 300.

Figure 3B:
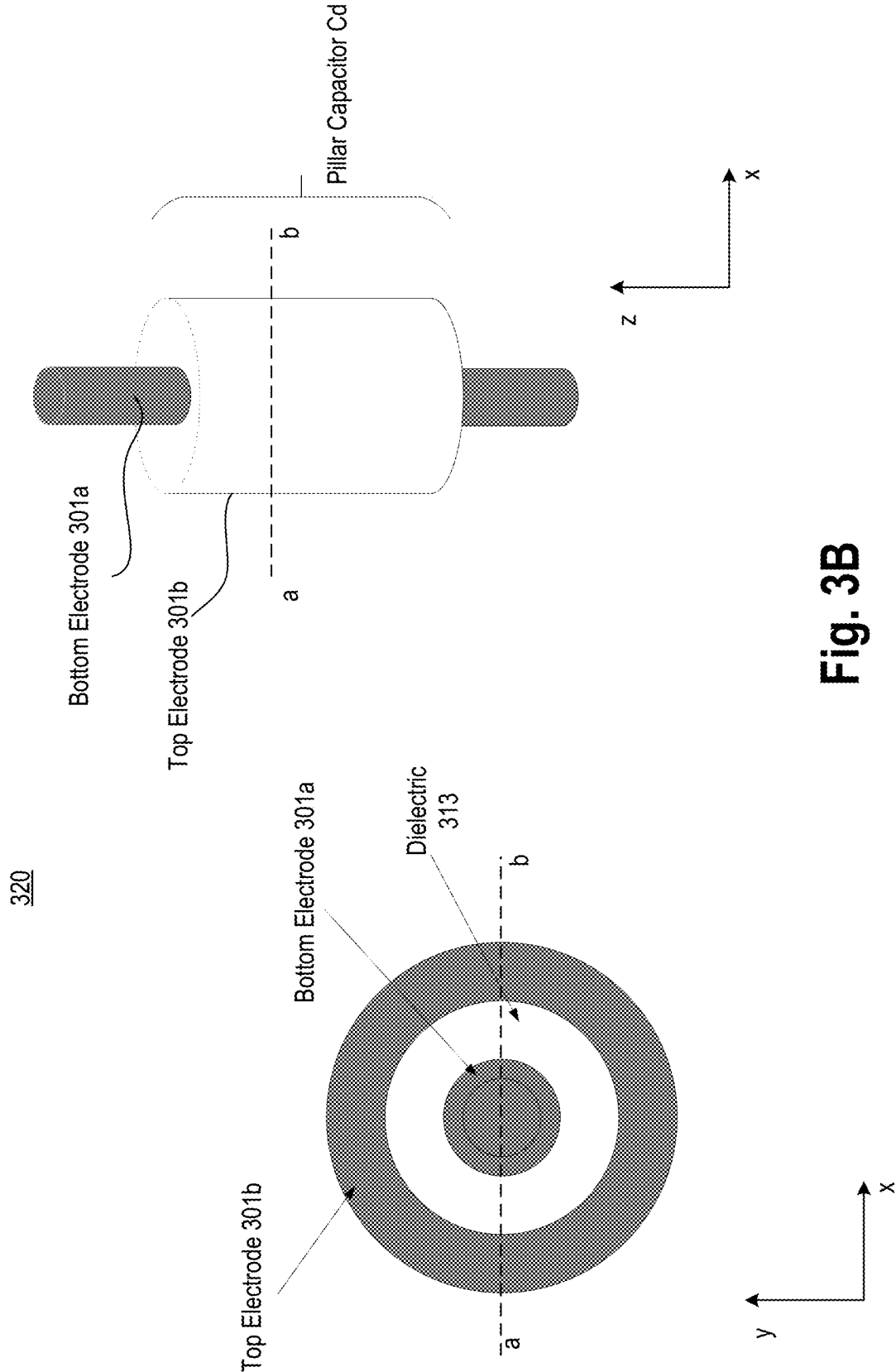
FIG. 3B illustrates a non-planar linear capacitor structure without conductive oxides, in accordance with at least one embodiment.

FIG. 3B illustrates a non-planar linear capacitor structure 320 without conductive oxides, in accordance with at least one embodiment. Compared to FIG. 3A, in at least one embodiment, linear dielectric 313 is adjacent to top electrode 310b and bottom electrode 301a.

Figures 4A, 4B, 4C:
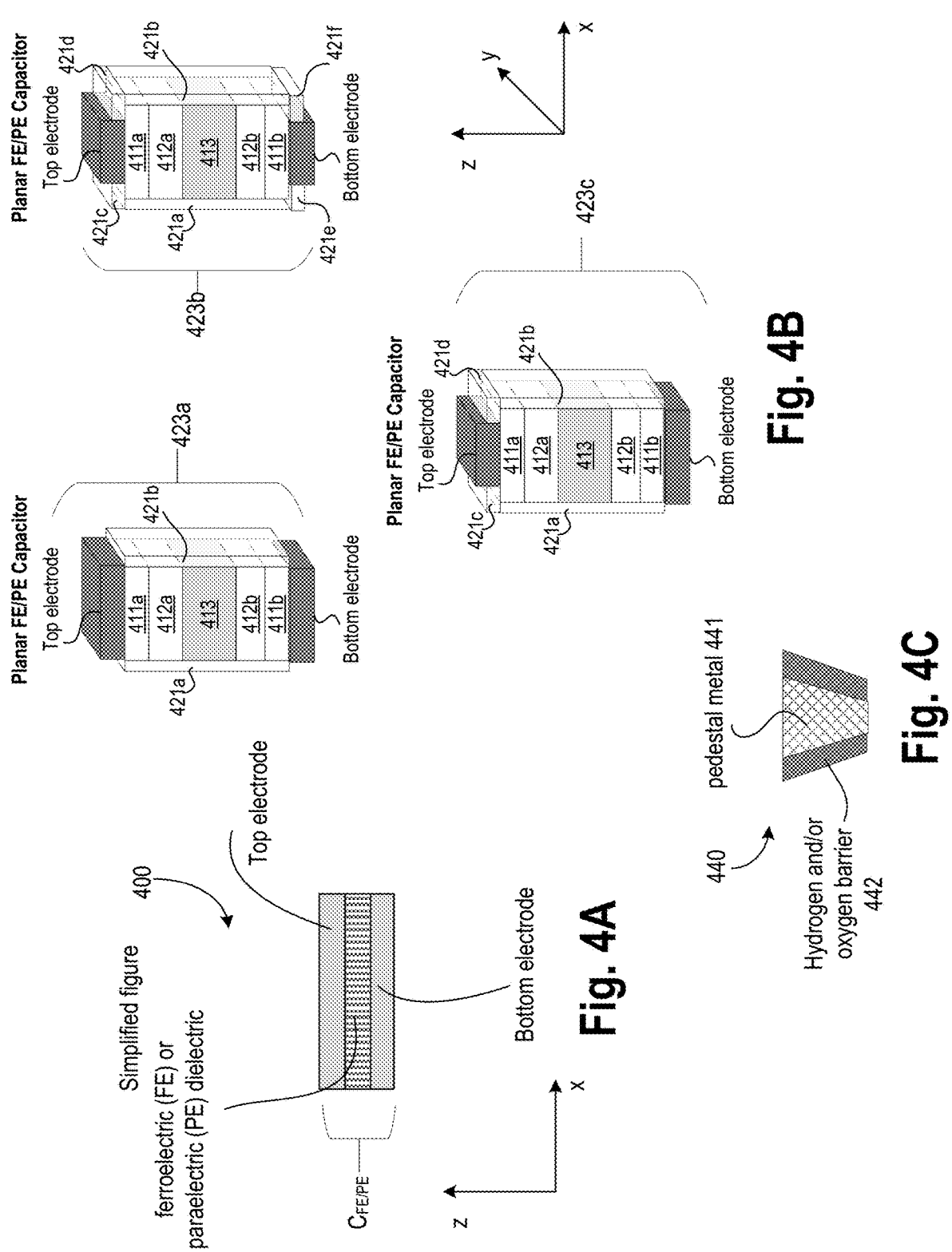
FIG. 4A illustrates a planar ferroelectric or paraelectric capacitor structure, in accordance with at least one embodiment.
FIG. 4B illustrates three planar ferroelectric or paraelectric capacitor structures, respectively, in accordance with at least one embodiment.
FIG. 4C illustrates a pedestal that connects to the top and/or bottom electrodes of the planar ferroelectric or paraelectric capacitor, in accordance with at least one embodiment.

FIG. 4A illustrates a planar ferroelectric or paraelectric capacitor structure, in accordance with at least one embodiment. FIG. 4B illustrates three planar ferroelectric or paraelectric capacitor structures, respectively, in accordance with at least one embodiment.

In at least one embodiment, capacitors are ferroelectric or paraelectric capacitors. In at least one embodiment, capacitors can take any planar form. One such simplified form is illustrated in FIG. 4A, in accordance with at least one embodiment. In at least one embodiment, planar capacitor structure 400 is a metal-insulator-metal (MIM) capacitor comprising a bottom electrode, a top electrode, and a ferroelectric dielectric between top electrode and bottom electrode as shown. In at least one embodiment, conductive oxide layer(s) are formed between bottom electrode and ferroelectric dielectric.

In at least one embodiment, planar capacitor 423a includes encapsulation portions 421a and 421b (also referred to as sidewall barrier seal) that are adjacent to side walls of plurality of layers of planar capacitor. In at least one embodiment, planar capacitor 423c incudes encapsulation portions 421c and 421d that are partially adjacent to encapsulation portions 421a and 421b, and refractive intermetallic 411a. In at least one embodiment, encapsulation portions 421a and 421b extend in z-plane. In at least one embodiment, encapsulation portions 421c and 421d terminate into a via (not shown). In at least one embodiment, material for encapsulation portions 421c and 421d is same as those for encapsulation portions 421a and 421b. In at least one embodiment, barrier material for encapsulation portions 421a and 421b includes one or more of an oxide of: Ti, Al, or Mg.

In at least one embodiment, planar capacitor 423b includes encapsulation portions 421e and 421f that are partially adjacent to encapsulation portions 421a and 421b, and refractive intermetallic 411b. In at least one embodiment, encapsulation portions 421c and 421f terminate into a via (not shown). In at least one embodiment, encapsulation portions 421e and 421f extend in an x-plane. In at least one embodiment, material for encapsulation portions 421e and 421f is same as those for encapsulation portions 421a and 421b. In at least one embodiment, material for encapsulation portions 421a and 421b includes one or more of: Ti—Al—O, $Al_2O_3$, MgO, or nitride. In at least one embodiment, material for encapsulation portions 421a and 421b is a sidewall barrier (e.g., insulative material) that protects stack of layers from hydrogen and/or oxygen diffusion. In at least one embodiment, sidewall barrier material is not an interlayer dielectric (ILD) material. In at least one embodiment, lateral thickness (along x-axis) of encapsulation portions 421a and 421b (insulating material) is in a range of 0.1 nm to 20 nm. In at least one embodiment, sidewall barriers are in direct contact with ILD.

In at least one embodiment, planar capacitors 423a, 423b, and 423c comprise several layers stacked together to form a planar capacitor. In at least one embodiment, these layers may extend in an x-plane when capacitor is a planar capacitor. In at least one embodiment, stack of layers includes refractive intermetallic 411a and refractive intermetallic 411b as a barrier material, conductive oxides 412a and 412b, and ferroelectric material 413. In at least one embodiment, ferroelectric material 413 can be any of ferroelectric materials discussed herein. In at least one embodiment, refractive intermetallic 411a and refractive intermetallic 411b are removed, and electrodes are in direct contact with conductive oxides 412a and 412b.

In at least one embodiment, refractive intermetallic 411a refractive intermetallic 411b maintains ferroelectric properties of ferroelectric capacitor. In absence of refractive intermetallic 411a and refractive intermetallic 411b, ferroelectric material 413 of a capacitor may lose its potency. In at least one embodiment, refractive intermetallic 411a and refractive intermetallic 411b comprises Ti and Al (e.g., TiAl compound). In at least one embodiment, refractive intermetallic 411a and refractive intermetallic 411b comprises one or more of Ta, W, and/or Co. In at least one embodiment, refractive intermetallic 411a and refractive intermetallic 411b includes a lattice of Ta, W, and/or Co.

In at least one embodiment, refractive intermetallic 411a and refractive intermetallic 411b is part of a barrier layer which is a super lattice of a first material and a second material, wherein first material includes Ti and Al (e.g., TiAl), and second material includes Ta, W, or Co (e.g., layers of Ta, W, and/or Co together). In at least one embodiment, lattice parameters of barrier layer are matched with lattice parameters of conductive oxides and/or ferroelectric material 413.

In at least one embodiment, refractive intermetallic 411a and refractive intermetallic 411b includes one of: Ti—Al such as Ti$_3$Al, TiAl, TiAl$_3$; Ni—Al such as Ni$_3$Al, NiAl$_3$, NiAl; Ni—Ti, Ni—Ga, or Ni$_2$MnGa; FeGa or Fe$_3$Ga; borides, carbides, or nitrides. In at least one embodiment, TiAl material comprises Ti-(45-48)Al-(1-10)M (at X trace amount %), with M being at least one element from: V, Cr, Mn, Nb, Ta, W, or Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta) or combined properties. In at least one embodiment, additions such as Si, B, and Mg can markedly enhance other properties. In at least one embodiment, refractive intermetallic 411a is coupled to a top electrode. In at least one embodiment, refractive intermetallic 411a is a barrier layer. In at least one embodiment, encapsulation portions 421a and 421b (insulating material) is placed around refractive intermetallic 411a, conductive oxide 412a, ferroelectric material 413, conductive oxide 412b, and refractive intermetallic 411b along while top and bottom surfaces of refractive intermetallic 411a and refractive intermetallic 411b are exposed for coupling to metal layers, vias, or a metallic pedestal.

In at least one embodiment, conductive oxide layer(s) are formed between top electrode and ferroelectric dielectric. In at least one embodiment, conductive oxides include: IrO$_2$, RuO$_2$, PdO$_2$, OsO$_2$, or ReO$_3$. In at least one embodiment, conductive oxides are of form A2O3 (e.g., In$_2$O$_3$, Fe$_2$O$_3$) and ABO$_3$ type, where 'A' is a rare earth element and 'B' is Mn. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

FIG. 4C illustrates pedestal 440 that connects to top and/or bottom electrodes of planar ferroelectric or paraelectric capacitor, in accordance with at least one embodiment. In at least one embodiment, pedestal 440 comprises pedestal metal 441 and sidewall barrier 442. In at least one embodiment, sidewall barrier 442 includes materials to protect hydrogen and/or oxygen from interacting with pedestal metal 441. In at least one embodiment, sidewall barrier 442 comprises Ti—Al—O, Al$_2$O$_3$, MgO, or nitride. In at least one embodiment, pedestal metal 441 includes one of Cu, Al, Ag, Au, W, or Co.

FIG. 5A illustrates a non-planar ferroelectric (FE) or paraelectric (PE) capacitor structure, in accordance with at least one embodiment. In at least one embodiment, non-planar capacitor structure 500 is rectangular in shape. Taking cylindrical shaped case, in at least one embodiment, layers of non-planar capacitor structure 500 from center going outwards include bottom electrode 501a, first conductive oxide 512a, ferroelectric (FE) or paraelectric (PE) dielectric material 513, second conductive oxide 512b, and top electrode 501b. In at least one embodiment, conducting oxides are removed and FE/PE dielectric is directly connected to top electrode 501b and bottom electrode 501a. In at least one embodiment, ferroelectric dielectric material 513 can include any suitable dielectric, where thickness of FE/PE dielectric film is a range of 1 nm to 20 nm. In at least one embodiment, FE/PE dielectric material 513 includes any one of materials discussed herein for ferroelectrics or paraelectric. In at least one embodiment, central region 502 of non-planar capacitor structure 500 is filled with oxide or an insulative material. In at least one embodiment, central region 502 is filled with metal that abuts with bottom electrode 501a to form a thicker bottom electrode.

In at least one embodiment, first conductive oxide 512a is conformally deposited over bottom electrode 501a. In at least one embodiment, FE/PE dielectric material 513 is conformally deposited over first conductive oxide 512a. In at least one embodiment, second conductive oxide 512b is conformally deposited over FE/PE dielectric material 513. In at least one embodiment, top electrode 501b is conformally deposited over second conductive oxide 512b. In at least one embodiment, bottom electrode 501a is in center while top electrode 501b is on an outer circumference of non-planar capacitor structure 500.

In at least one embodiment, material for bottom electrode 501a may include one or more of: Cu, Al, Ag, Au, W, Co, or their alloys. In at least one embodiment, material for first conductive oxide 512a include: IrO$_2$, RuO$_2$, PdO$_2$, OsO$_2$, or ReO$_3$. In at least one embodiment, conductive oxides are of form A$_2$O$_3$ (e.g., In$_2$O$_3$, Fe$_2$O$_3$) and ABO$_3$ type, where 'A' is a rare earth element and 'B' is Mn. In at least one embodiment, material for second conductive oxide 512b may be same as material for first conductive oxide 512a. In at least one embodiment, material for top electrode 501b may include one or more of: Cu, Al, Ag, Au, W, or Co, or their alloys.

In at least one embodiment, a first refractive intermetallic layer (not shown) is formed between dielectric material 513 and first conductive oxide 512a. In at least one embodiment, a second refractive intermetallic layer (not shown) is formed between FE/PE dielectric capacitor material 513 and second conductive oxide 512b. In at least one embodiment, first and second refractive intermetallic layers are directly adjacent to their respective conductive oxide layers and to FE/PE dielectric capacitor material 513. In at least one embodiment, refractive intermetallic maintains capacitive properties of dielectric capacitor material 513. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as Ti$_3$Al, TiAl, TiAl$_3$; Ni—Al such as Ni$_3$Al, NiAl$_3$, NiAl; Ni—Ti, Ni—Ga, or Ni$_2$MnGa; FeGa or Fe$_3$Ga; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B, or Mg can markedly enhance other properties. In at least one embodiment, thicknesses of layers of non-planar capacitor structure 500 in x-axis are in range of 1 nm to 30 nm. In at least one embodiment, refractive intermetallic layers are not used for non-planar capacitor structure 500.

Figure 5B:
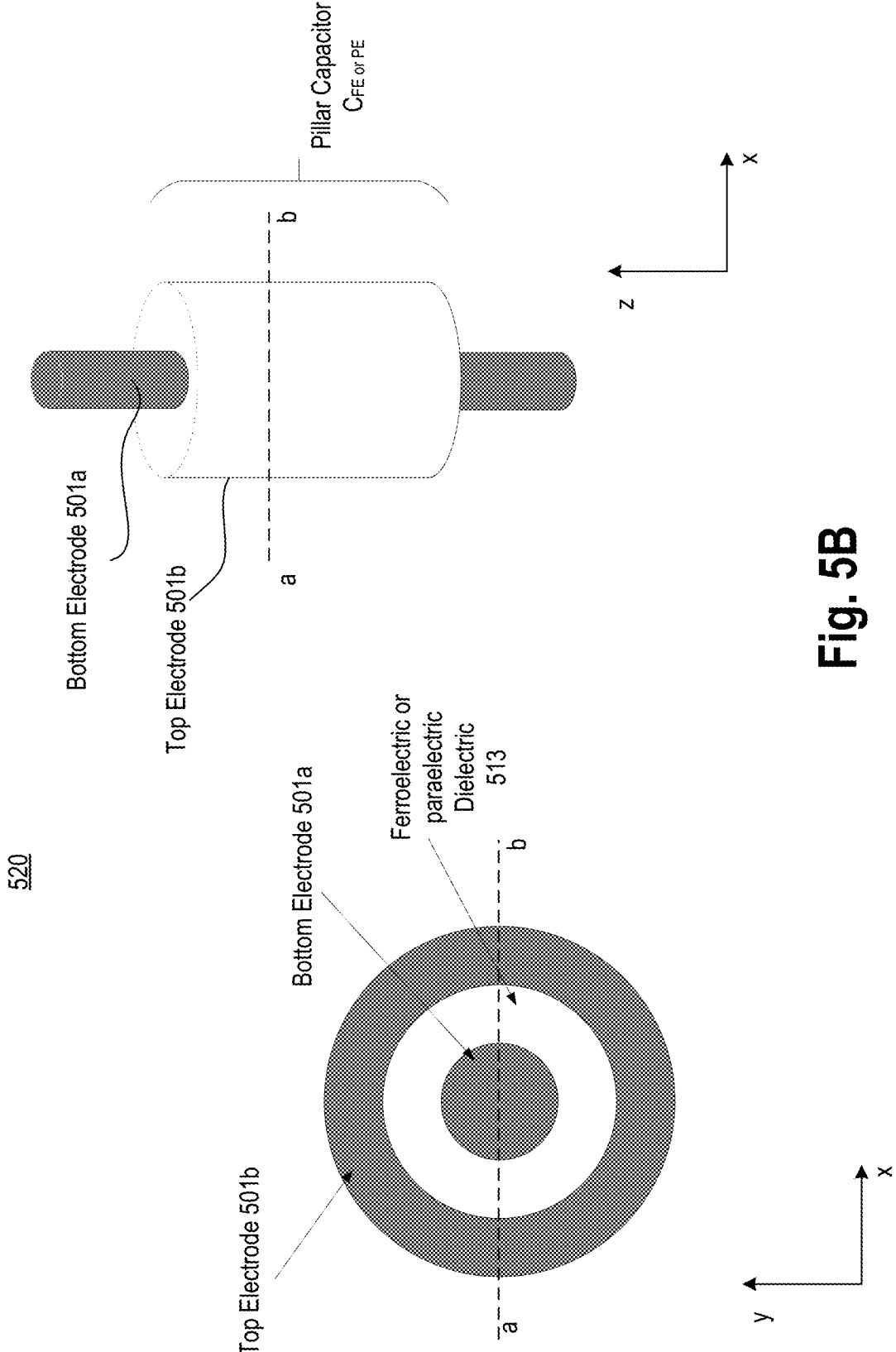
FIG. 5B illustrates a non-planar ferroelectric or paraelectric capacitor structure without conductive oxides, in accordance with at least one embodiment.

FIG. 5B illustrates a non-planar ferroelectric or paraelectric capacitor structure 520 without conductive oxides, in accordance with at least one embodiment. Compared to non-planar capacitor structure 500, here, first conductive oxide 512a and second conductive oxide 512b are removed and ferroelectric material 513 is adjacent to top electrode 501b and bottom electrode 501a as shown, in at least one embodiment.

In at least one embodiment, ferroelectric material can be replaced with anti-ferroelectric material. In at least one embodiment, anti-ferroelectric (AFE) material includes lead zirconate titanate (PZT) with high Zr doping, La-doped PZT with high Zr doping, $HfSiO_2$ with high Si doping, $HfZrO_2$ (HZO) with high Zr doping, $ZrO_2$, $PbZrO_3$ (lead zirconate), $NH_4H2PO_4$ (ammonium dihydrogen phosphate (ADP)), $NaNbO_3$ (sodium niobate), and K doped $NaNbO_3$, etc. Table 1 describes some bulk anti-ferroelectric materials, with various physical/chemical modifications for enhancing energy storage density, in at least one embodiment.

memory, in accordance with at least one embodiment. In at least one embodiment, architecture 600 comprises memory array 601 and controller logic 606 (also referred to as refresh logic). In at least one embodiment, memory array 601 comprises memory with non-linear polar material. In at least one embodiment, memory array 601 includes bit-cells that comprise at least one transistor and at least one capacitor coupled to it, where capacitor has non-linear polar material.

In at least one embodiment, memory array 601 includes a plurality of memory banks (e.g., 603-1 through 603-N, where 'N' is a number). In at least one embodiment, each memory bank (e.g., 603-1) includes a plurality of memory words (e.g., memory word 607). In at least one embodiment, each memory word includes a plurality of memory bit-cells. For sake of simplicity, other memory components are not shown such as write drivers, column multiplexers, sense-amplifiers, etc.

In at least one embodiment, controller logic 606 comprises endurance hardware and/or software to provide memory endurance to memory array 601. In at least one embodiment, memory endurance ensures write and/or read operations from memory array 601 are reliable. Write endurance is number of programs and erase cycles that when applied to a memory block, bank, or word before memory block, bank, or word, becomes unreliable. In at least one embodiment, endurance mechanisms include a wear leveling scheme that uses index rotation, outlier compensation to handle weak bits, and random swap injection to mitigate wear out attacks. For sake of simplicity, memory banks are

TABLE 1

| Material name | Physical/Chemical Modifications | Energy Density (J/cm³) | Electric Field (kV/cm) |
|---|---|---|---|
| (Pb0.97La0.02)(Zr0.97Ti0.03) O3 | 3 wt % glass (PbO—B2O3—SiO2—ZnO) | 3.1 | 581 |
| (Pb0.97La0.02)(Zr0.97Ti0.03) O3 | without glass | 1.4 | 581 |
| Pb0.99Nb0.02[(Zr0.57Sn0.43)1—yTiy]0.98O3 | with half electrode | 1.30 | 70 |
| Pb0.99Nb0.02[(Zr0.57Sn0.43)1—yTiy]0.98O3 | with full electrode | 1.19 | 70 |
| (Pb0.94—xLa0.04Bax) [(Zr0.60Sn0.40)0.841Ti0.16] O3 | x = 0 (0 MPa) | 0.35 | 30 |
| (Pb0.94—xLa0.04Bax) [(Zr0.60Sn0.40)0.841Ti0.16] O3 | x = 0.02 (20 MPa) | 0.38 | 30 |
| Pb0.99Nb0.02[(Zr0.60Sn0.40)0.95Ti0.05] O3 | — | 0.62 | 56 |
| Pb0.97La0.02(Zr0.56Sn0.35Ti0.09) O3 | 4 wt % glass (CdO—Bi2O3—PbO—ZnO—Al2O3—B2O3—SiO2) | 3.3 | 150 |
| Pb0.97La0.02(Zr0.56Sn0.35Ti0.09) O3 | Without glass | 1.9 | 110 |
| (Pb0:97La0:02)(Zr0:92Sn0:05Ti0:03) O3 | 3% glass (0.8PbO-0.2B2O3) | 7.4 | 475 |
| (Pb0:97La0:02)(Zr0:92Sn0:05Ti0:03) O3 | Without glass | 4.5 | 320 |
| Pb0.97La0.02(Zr0.95Ti0.05) O3 | — | 12.4 | 1120 |
| (Pb0.85Ba0.08Sr0.03La0.03)(Zr0.74Sn0.22Ti0.04) | — | 1.2 | 100 |
| (Bi1/2Na1/2)0.94Ba0.06] La0.8Zr0.2TiO3 | — | 1.58 | 85 |
| (Ba0.1La0.02)(Zr0.675Sn0.275Ti0.05) O3 | — | 2.05 | 70 |
| 0.75(0.80Bi1/2Na1/2TiO3-0.20Bi1/2K1/2TiO3)—0.25SrTiO3 | — | 0.84 | 100 |
| Pb0.97La0.02(Zr0.50Sn0.45Ti0.05) O3 | — | 5.6 | 400 |
| (Pb0.858Ba0.1La0.02Y0.008)(Zr0.65Sn0.3Ti0.05) O3—(Pb0.97La0.02)(Zr0.9Sn0.05Ti0.05) O3 | — | 4.65 | 200 |
| 0.89Bi0.5Na0.5TiO3-0.06BaTiO3-0.05K0.5Na0.5NbO3 | double stage sintering | 0.90 | 100 |
| (Pb0.858Ba0.1La0.02Y0.008)(Zr0.65Sn0.3Ti0.05) O3—(Pb0.97La0.02)(Zr0.9Sn0.05Ti0.05) O3 | spark plasma sintering | 6.40 | 275 |
| (Pb0.858Ba0.1La0.02Y0.008)(Zr0.65Sn0.3Ti0.05) O3—(Pb0.97La0.02)(Zr0.9Sn0.05Ti0.05) O3 | conventional sintering | 4.65 | 200 |
| (Nal xCax) (Nb1 xZrx) O3 x = 0.04 | conventional sintering | 0.91 | 130 |
| (Pb0.92La0.04Ba0.02)[(Zr0.60Sn0.40)0.84Ti0.16] O3 | at 90 MPa | 0.91 | 60 |
| 0.91(Bi0.5Na0.5)TiO3-0.07BaTiO3-0.02(K0.5Na0.5)NbO3 | at 100 MPa | 0.387 | 60 |
| (Pb0.96La0.04)(Zr0.90Ti0.10) O3 | at 100 MPa | 0.698 | 60 |

Figure 6A:
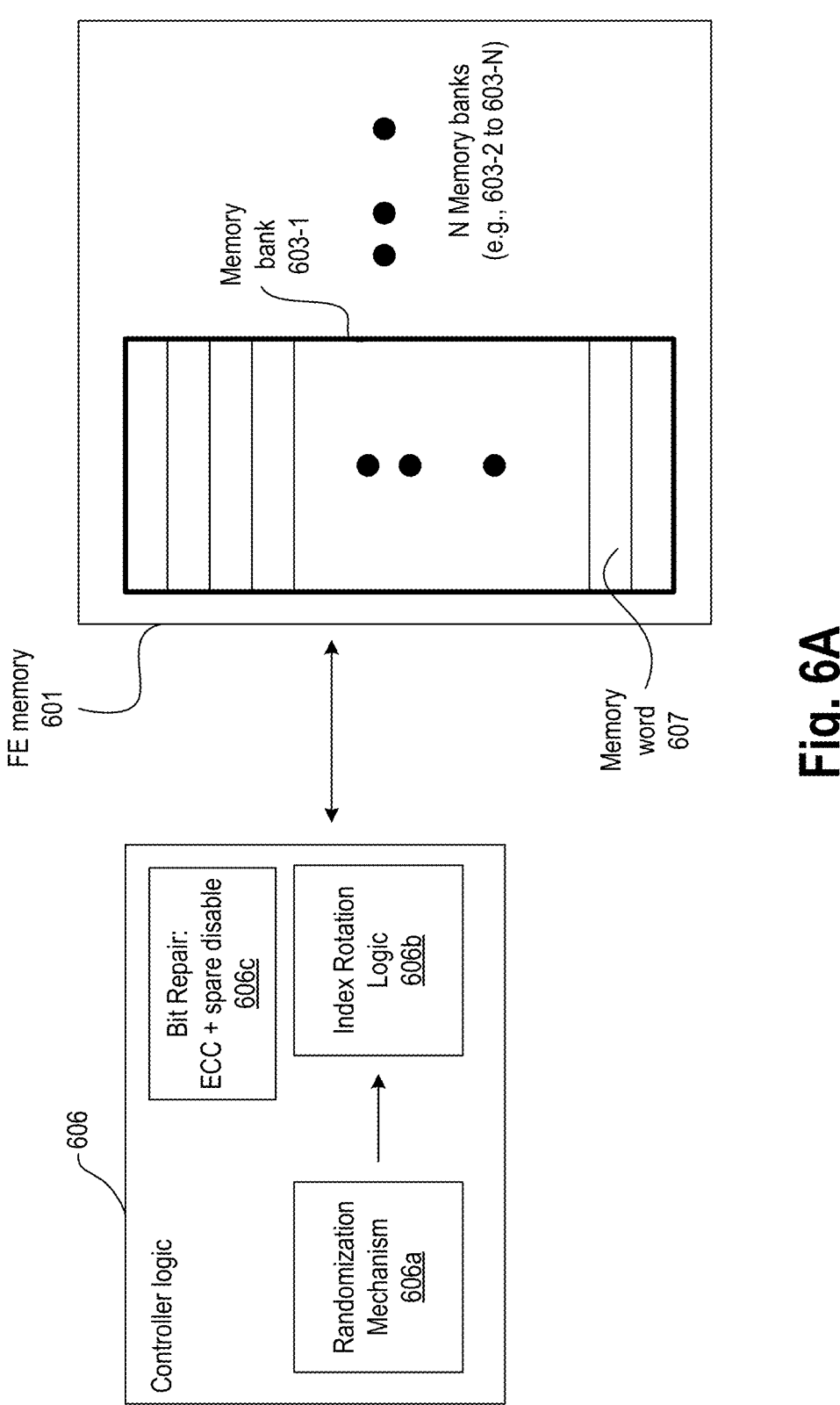
FIG. 6A illustrates a high-level endurance enhancement architecture for a paraelectric (PE) or ferroelectric (FE) memory, in accordance with at least one embodiment.

FIG. 6A illustrates high-level endurance enhancement architecture for paraelectric (PE) or ferroelectric (FE)

generally referred to as reference 603 instead of a particular memory bank reference (e.g., 603-1, 603-2, etc.). At least one embodiment described to general reference are applicable to an individual particular reference. In at least one embodiment, description of memory bank 603 is applicable for memory banks 603-1, 603-2, through 603-N.

In at least one embodiment, controller logic 606 comprises random invertible bit matrix 606a, index rotation logic 606b, and bit repair logic 606c. In at least one embodiment, index rotation logic 606b enables random swap injection which randomizes index rotation to obfuscate mapping from addresses to rotated indexes. In at least one embodiment, index rotation logic 606b randomizes rotation of gap words in memory bank 603. Malicious users (or attackers) may write programs that deliberately track wear leveling scheme described herein. These attackers may attempt to alter a memory reference pattern to continue to stress a single physical line even as wear leveling scheme assigns that physical line to different addresses. In at least one embodiment, index rotation logic 606b provides a facility to make tracking of physical lines difficult. In at least one embodiment, this facility makes a random decision (e.g., using an externally generated random number) to either swap or not each time a swap opportunity arises. In at least one embodiment, over time randomness injected into swapping process makes tracking cache lines more difficult.

In at least one embodiment, index rotation logic 606b is used for implementing a wear leveling scheme. In at least one embodiment, index rotation logic 606b rotates addresses throughout memory bank 603 to perform a wear leveling function. In various embodiments, index rotation logic 606b ensures that memory requests are spread across memory locations rather than a single memory location.

In at least one embodiment, bit repair logic 606c includes double error correcting, or triple error detecting error correction code (ECC) to discover new bit errors and spare disable which eliminate memory words with particularly high error rates. In at least one embodiment, spare disable involves having a buffer of spare cache lines. In at least one embodiment, when cache lines are particularly unreliable, spare disable can swap out unreliable cache lines for reliable spares. In at least one embodiment, spares may be implemented with memory technology other than FE memory such as static random-access memory (SRAM). In at least one embodiment, bit repair logic 606c addresses problem of weak memory bits. In at least one embodiment, each cache line or word 607 in memory bank 603 includes a valid bit. In at least one embodiment, valid bit indicates whether data associated with that line/word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, various endurance mechanisms discussed herein can be used in any combination or order. In at least one embodiment, some memory products may select one or more of endurance mechanisms instead of all three discussed herein. In at least one embodiment, some memory products may apply all three endurance mechanisms to achieve most endurance for memory array 601. In at least one embodiment, endurance mechanisms are applied to memory array 601 to maximize usage of such memory.

Figure 6B:
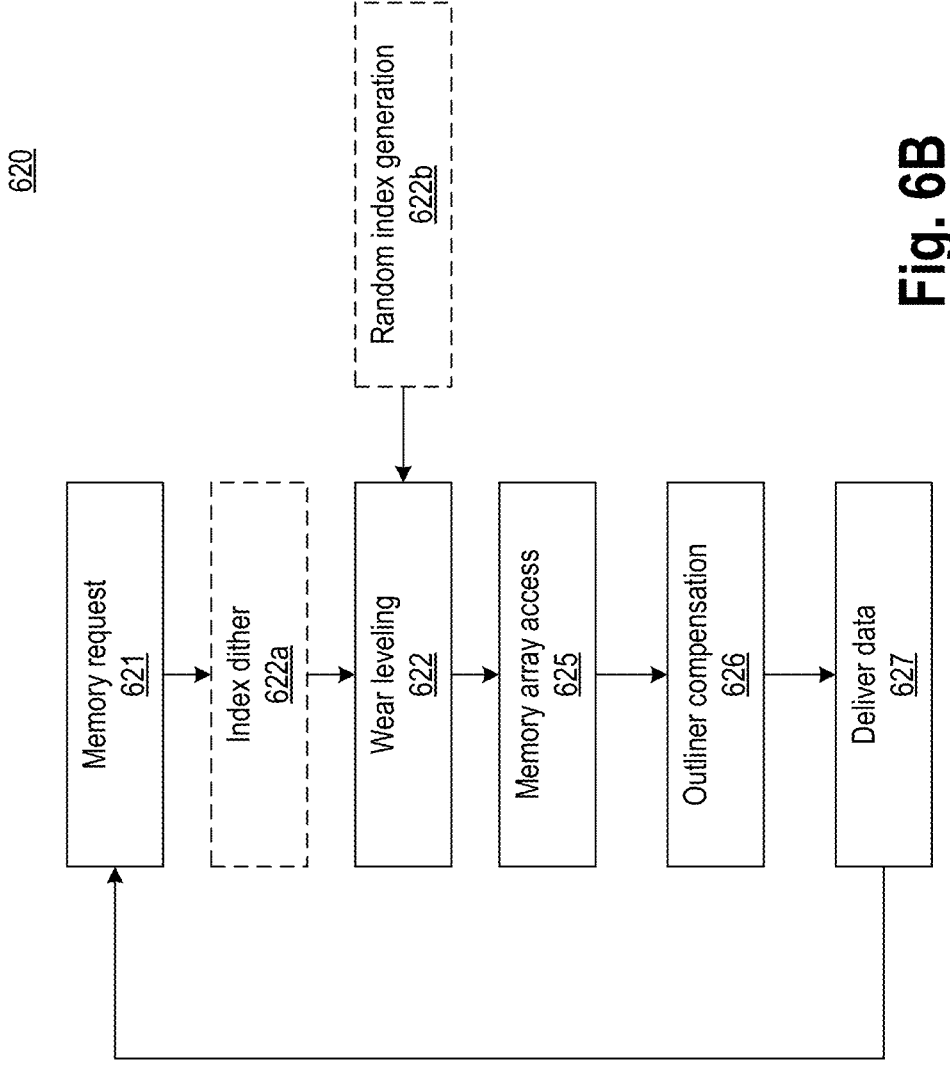
FIG. 6B illustrates a flowchart of memory endurance for PE and FE memory, in accordance with at least one embodiment.

FIG. 6B illustrates flowchart 620 of memory endurance for PE and FE memory, in accordance with at least one embodiment. While blocks in flowchart 620 are illustrated in a particular order, order can be modified, in at least one embodiment. In at least one embodiment, some blocks may be performed before others based on whether read or write operations are being performed. In at least one embodiment, various blocks can be implemented in hardware, software, or a combination of them.

At block 621, in at least one embodiment, controller logic 606 sends a memory request to memory array 601. In at least one embodiment, this request may be a read request or a write request. In at least one embodiment, if it is a write request, controller logic 606 applies wear leveling scheme at block 622. In at least one embodiment, wear leveling scheme is linear in that a gap word or gap cache line is swapped with an adjacent word or cache line. In at least one embodiment, wear leveling is dithered as indicated by block 622a. In at least one embodiment, index or pointer to gap word or gap cache line is used to swap gap word or gap cache line with either an adjacent cell with one higher index or address or with an adjacent cell with one lower index or address. As such, in at least one embodiment, wear leveling is dithered.

In at least one embodiment, wear leveling is randomized. In at least one embodiment, a random index is generated at block 622b. In at least one embodiment, random index is then used to swap gap word or gap cache line with an adjacent or a non-adjacent word or cache line. In at least one embodiment, random index is dithered. In at least one embodiment, dithered random index is then used for wear leveling.

In at least one embodiment, if memory request is a read access (as indicated by block 625), outlier compensation is applied as indicated by block 626. At block 626, in at least one embodiment, controller logic 606 addresses problem of weak memory bits by checking a valid bit for memory word being addressed or accessed. In at least one embodiment, valid bit indicates whether data associated with that line or word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, after ECC is applied, requested data is provided to controller logic 606 as indicated by block 627. In at least one embodiment, memory endurance for non-linear polar material based memory is enhanced by endurance mechanisms. In at least one embodiment, this allows more read and write operations to memory before any memory block, bank, or word becomes unreliable. In at least one embodiment, capacitors for each bit-cell in memory 601 (which can also be a FE or PE memory) are arranged in a stack and fold manner.

Figure 7:
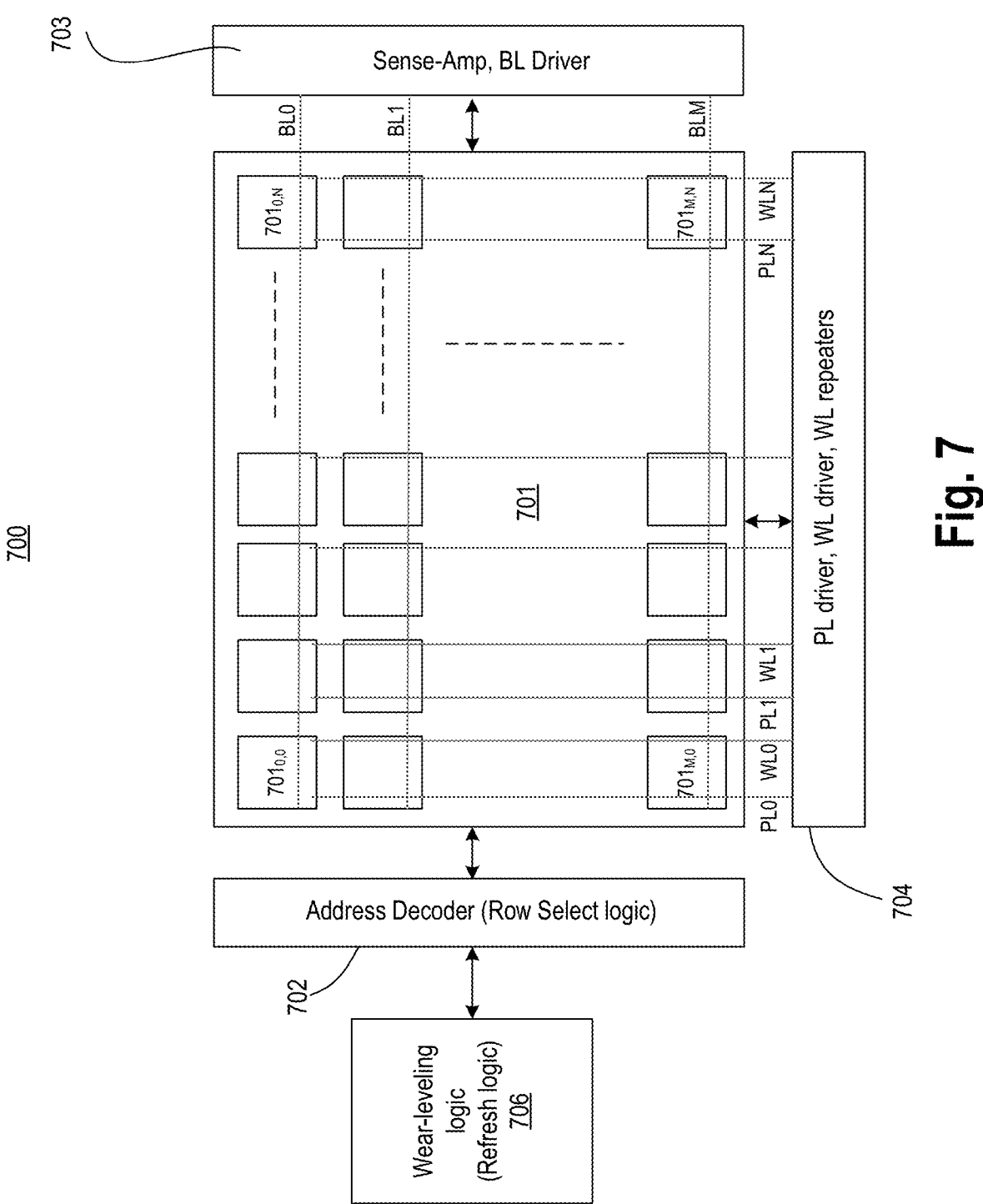
FIG. 7 illustrates an M×N memory array of bit-cells and corresponding periphery circuitry, in accordance with at least one embodiment.

FIG. 7 illustrates apparatus 700 comprising an M×N memory array of bit-cells and corresponding periphery circuitry, in accordance with at least one embodiment. In at least one embodiment, apparatus 700 comprises M×N memory array 701 of bit-cells, logic circuitry 702 for address decoding, and logic circuitry 703 for sense amplifier, write drivers, and plate-line (PL) drivers 704. In at least one embodiment, wear-leveling logic (e.g., refresh logic) 706 is coupled to memory array 701. In at least one embodiment, plate-lines PL0, PL1, through PLN are parallel to word-lines WL0, WL1, through WLN while bit-lines BL0, BL1 through BLM are orthogonal to plate-lines and word-lines, where 'M' and 'N' are greater than 1. In at least one embodiment, individual memory bit-cells in memory array 701 are organized in rows and columns. For example, memory bit-cells $701_{0,0}$ through $701_{M,N}$ are organized in an array.

In at least one embodiment, an individual memory bit-cell (e.g., $701_{0,0}$) is a multi-element gain bit-cell. An example of multi-element gain bit-cell is described with reference to FIG. 8, in accordance with at least one embodiment. In at least one embodiment, an individual memory bit-cell (e.g., $701_{0,0}$) is a multi-element gain bit-cell, where gain transistor is coupled in series with a transistor. Examples of such a memory bit-cells are described with reference to FIGS. 9-10, in accordance with at least one embodiment. In at least one embodiment, an individual memory bit-cell (e.g., $701_{0,0}$) is a multi-element gain bit-cell where capacitor is replaced with a memory element. Examples of such memory bit-cells are described with reference to FIGS. 28-29, in accordance with at least one embodiment.

Figure 8:
FIG. 8 illustrates a multi-element gain bit-cell with plate-lines in parallel to a word-line, in accordance with at least one embodiment.
Figure 8:
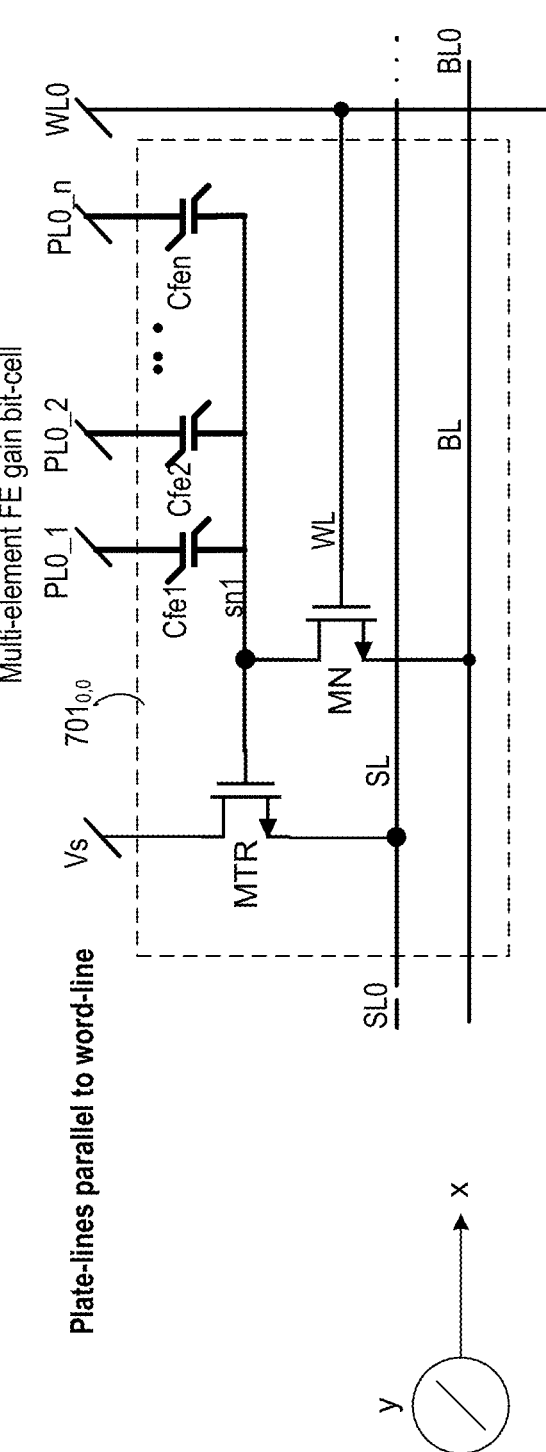

FIG. 8 illustrates a multi-element gain bit-cell 800 with plate-lines (PLs) in parallel to a word-line (WL), in accordance with at least one embodiment. In at least one embodiment, a bit-cell (e.g., $701_{0,0}$) comprises n-type select transistor MN (e.g., access transistor), n-type transistor MTR (e.g., gain transistor), bit-line (BL), word-line (WL), sense-line (SL), and 'n' number of non-linear polar material based capacitors Cfe1 through Cfen. In at least one embodiment, gate terminal of the n-type transistor MN is coupled to WL (e.g., WL1). In at least one embodiment, drain or source terminal of the n-type transistor MN is coupled to BL. In at least one embodiment, first terminals of each of capacitors Cfe1 through Cfen is coupled to a storage node sn1. In at least one embodiment, storage node sn1 is coupled to a source or drain terminal of n-type transistor MN and to a gate of transistor MTR. In at least one embodiment, drain or source terminal of MTR is coupled to a bias voltage Vs. In at least one embodiment, Vs is a programmable voltage that can be generated by any suitable source. In at least one embodiment, Vs voltage helps in biasing the gain transistor in conjunction with the sense-voltage that builds at sn1 node. In at least one embodiment, source or drain terminal of transistor MTR is coupled to SL (e.g., SL1). In at least one embodiment, transistor MTR can be a p-type transistor. In at least one embodiment, transistor MTR can be a combination of a p-type transistor and an n-type transistor (e.g., in a transmission gate configuration where both gates are coupled to node sn1).

In at least one embodiment, second terminals of each of capacitors Cfe1 through Cfen is coupled to a corresponding plate-line (PL). In at least one embodiment, second terminal of Cfe1 is coupled to PL0_1, second terminal of Cfe2 is coupled to PL0_2, and so on. Apparatus 700 has n-number of PLs (e.g., PL0_1 through PL0_n) per column which are parallel to a WL (e.g., WL0) for that column, in accordance with some embodiments. In at least one embodiment, SL is parallel to BL.

In at least one embodiment, non-linear polar material based capacitors Cfe1 through Cfen are planar capacitors such as those discussed herein. In at least one embodiment, non-linear polar material based capacitors Cfe1 through Cfen are pillar capacitors such as those discussed herein. In at least one embodiment, non-linear polar material is directly on node sn1. In at least one embodiment, non-linear polar material based capacitors Cfe1 through Cfen are vertically stacked and horizontally folded allowing for tall bit-cells (e.g., higher in the z-direction) but with x-y footprint two transistors. In at least one embodiment, by folding capacitors, diffusion capacitance on BL reduces for a given array size, which improves reading speed. In at least one embodiment, folding capacitors lowers effective routing capacitance on BL.

In at least one embodiment, larger footprint in x-y direction of multi-element ferroelectric (FE) gain bit-cell compared to footprint in x-y direction of one transistor and multi-capacitor based bit-cell, vertical height of the capacitor can be reduced as the capacitors can expand in the x-y direction more than before for a given height. In at least one embodiment, capacitors are folded more effectively. In at least one embodiment, n/2 capacitors per metal or via layer can be packed. In at least one embodiment, more capacitors can be stacked in multi-element FE gain bit-cell because storage node sn1 is decoupled from the BL. In at least one embodiment, multi-element FE gain bit-cell reduces thickness scaling requirement for the pillar capacitor. In at least one embodiment, polarization density requirements are reduced for multi-element FE gain bit-cell compared to a 1TnC bit-cell (e.g., a 1T1C bit-cell but with n number of capacitors).

In at least one embodiment, x-y footprint is determined by the size of transistor MN and its connections to BL, WL, and storage node sn1. In at least one embodiment, footprint can still be decided by other factors such as: number of capacitors that connect to node; how capacitors are arranged, e.g., more folding on same node versus stacking; effective size constraints on those capacitors; and number of capacitors that share the same bit-cell. In at least one embodiment, PL (e.g., PL0_1, PL0_2, . . . . PL_n) controls which cell within the same access transistor gets programmed, and value of programming.

In at least one embodiment, BL acts as a sense-line. In at least one embodiment, voltage on BL (e.g., sense voltage) can create disturbance on other bit-lines during read operation. In at least one embodiment, to mitigate such disturbances, multi-element FE gain bit-cell (e.g., $701_{0,0}$) is periodically refreshed (e.g., every 1 second). In at least one embodiment, periodic refresh is minimized by refreshing in active mode of operation that can be coupled with advance schemes for wear leveling. In at least one embodiment, in standby mode (e.g., low power mode), multi-element FE gain bit-cell (e.g., $801_{0,0}$) is not refreshed as there is no disturb mechanism during standby. In at least one embodiment, multi-element FE gain bit-cell (e.g., $701_{0,0}$) relies on isolating read mode from BL or SL capacitance by isolating through access transistor MN, where MN transistor facilitates pre-charging the sn1 node, prior to read operation.

In at least one embodiment, there is a possibility of disturbance at the storage node sn1 during read operation. In at least one embodiment, PL is toggled for other capacitors to the average value of the disturbance that will be seen on the sn1 node. In at least one embodiment, when a read pulse of some polarity is applied at PL of capacitor to be read, a non-zero voltage is applied on other PLs of multi-element FE gain bit-cell (e.g., $701_{0,0}$), that matches expected disturbance seen on shared node. In at least one embodiment, PL driver is configured to support driving different voltage levels on different PLs. In at least one embodiment, wear-leveling logic 606 provides one or more endurance mechanisms for the multi-element FE gain bit-cells. One of the endurance mechanisms involves refreshing of the data content in capacitor(s).

In at least one embodiment, gain transistor MTR is sized to reduce its threshold (Vt) variation. In at least one embodiment, Vt variation is reduced by increasing size of gain transistor MTR. In some cases, leakage on sense-line (SL) increases due to multiple bit-cells coupled to SL within a memory array. Leakage on SL may cause signal sensing issues on SL.

Here, symbol '/' in figures next to signal names indicates that those interconnects or wires extend in and out of a page (e.g., Vs, PL0_1 through PL0_n, WL) while interconnects without symbol '/' (e.g., BL0, SL0) extend orthogonal to those interconnects. In at least one embodiment, bit-line and sense-line extend along an x-axis while word-line and plate-lines extend along y-axis. In at least one embodiment, capacitors Cfe1 through Cfen are stacked along a z-direction.

Figure 9:
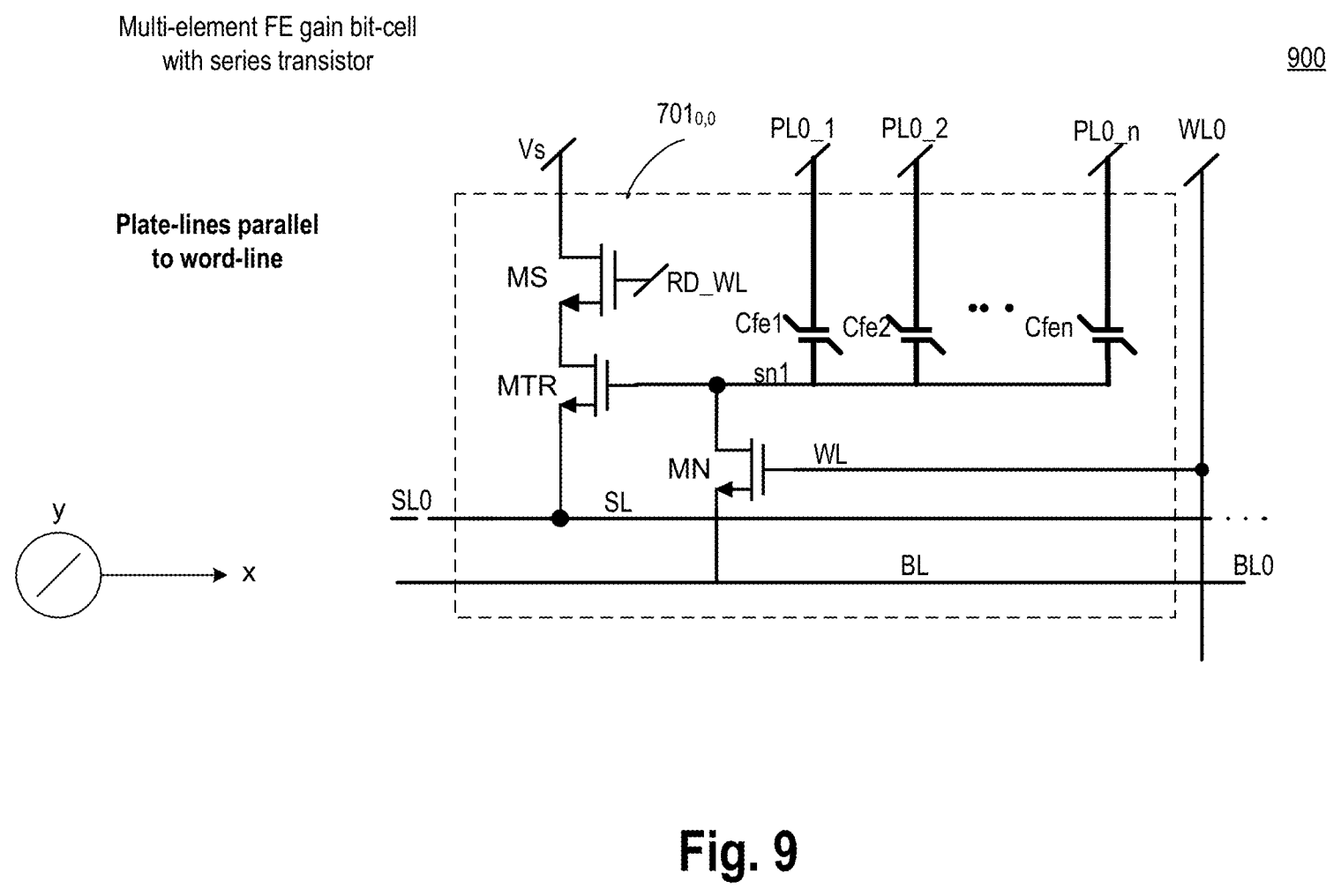

FIG. 9 illustrates multi-element gain bit-cell 900 with plate-lines in parallel to a word-line, and where a transistor is coupled in series with a gain transistor which is coupled to a sense-line, in accordance with at least one embodiment. FIG. 9 is described with reference to FIG. 8. In at least one embodiment, leakage on SL is reduced per bit-cell by coupling a series transistor MS with gain transistor MTR. In at least one embodiment, series transistor MS is controlled by a word-line (WL). In at least one embodiment, series transistor MS is controlled by a read word-line (RD_WL). In at least one embodiment, gate terminal of series transistor MS is controlled by RD_WL. In at least one embodiment, RD_WL is parallel to plate-lines PL0_1 through PL0_n and BL. In at least one embodiment, source terminal of series transistor MS is connected to or coupled to sense-line (SL) (e.g., SL0). In at least one embodiment, drain terminal of series transistor MS is coupled to reference Vs. In at least one embodiment, n-type transistors can be replaced with p-type transistors and polarity of control signals (e.g., RW_WL and WL) can be modified for correction operation of memory bit0cell. In at least one embodiment, a mix of p-type and n-type transistors may be used for transistors of bit-cell 900. In at least one embodiment, size of series transistor is smaller than size of gain transistor MTR. In at least one embodiment, during read phase series transistor MS is turned on during a read phase to reduce leakage on SL.

Figure 10:
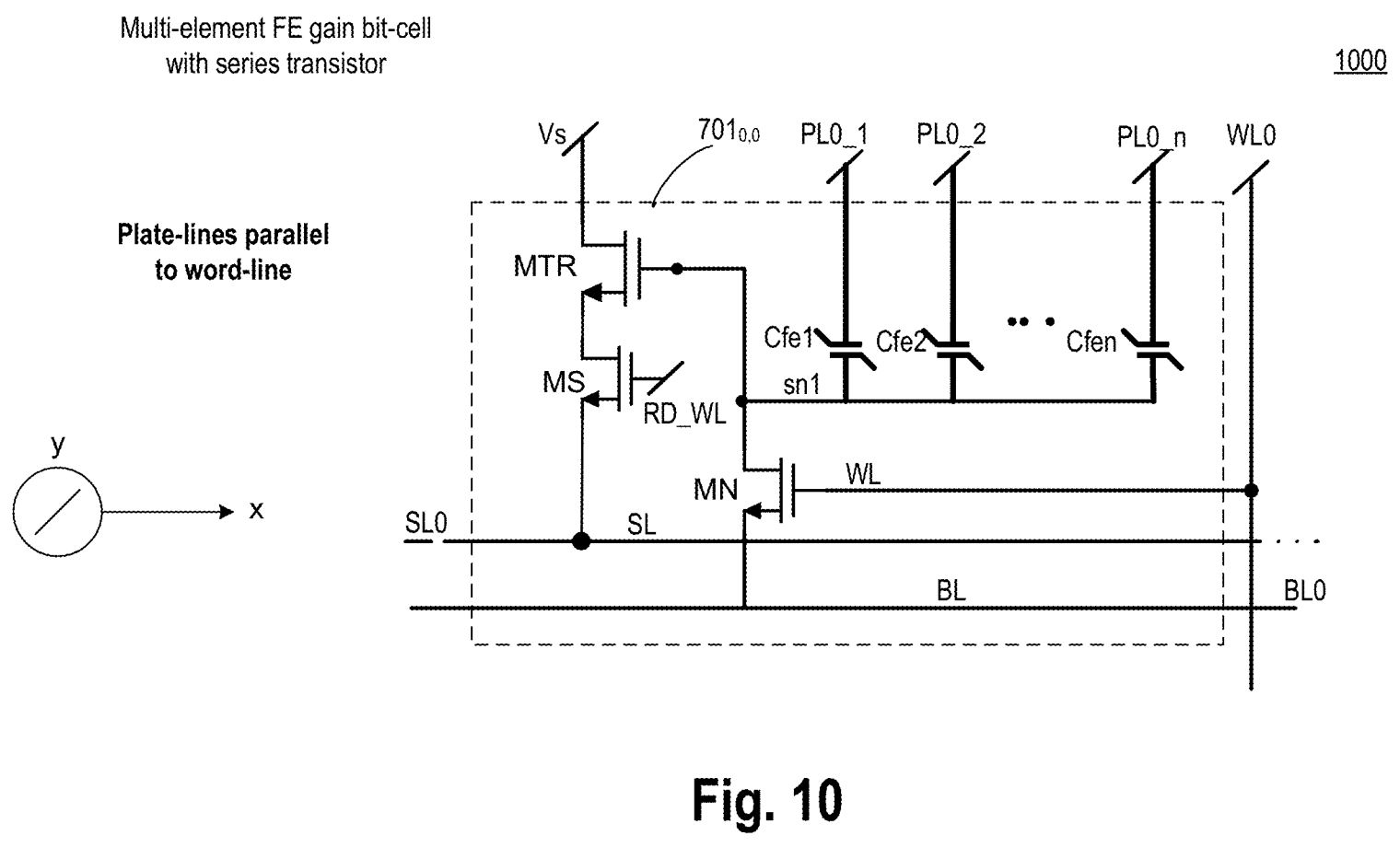

FIG. 10 illustrates a multi-element gain bit-cell 1000 with plate-lines in parallel to a word-line, and where a transistor is coupled to a sense-line and in series with a gain transistor, in accordance with at least one embodiment. FIG. 10 is described with reference to FIG. 9. In at least one embodiment, source terminal of series transistor MS is connected to or coupled to SL instead of gain transistor MTR. In at least one embodiment, drain terminal of series transistor MS is connected to source terminal of gain transistor MTR. In at least one embodiment, gate terminal of gain transistor is connected to storage node sn1. In at least one embodiment, drain terminal of gain transistor is connected to reference Vs. In at least one embodiment, series transistor MS when connected to SL instead of reference Vs reduces turn-on resistance (R-on) induced variation related issues. In at least one embodiment, series transistor MS when connected to SL instead of reference Vs lowers parasitic capacitance and resistance on SL compared to configuration of FIG. 9 because larger gain transistor MTR is not seen by SL and because series transistor MS is much smaller in size the gain transistor MTR.

Figure 11:
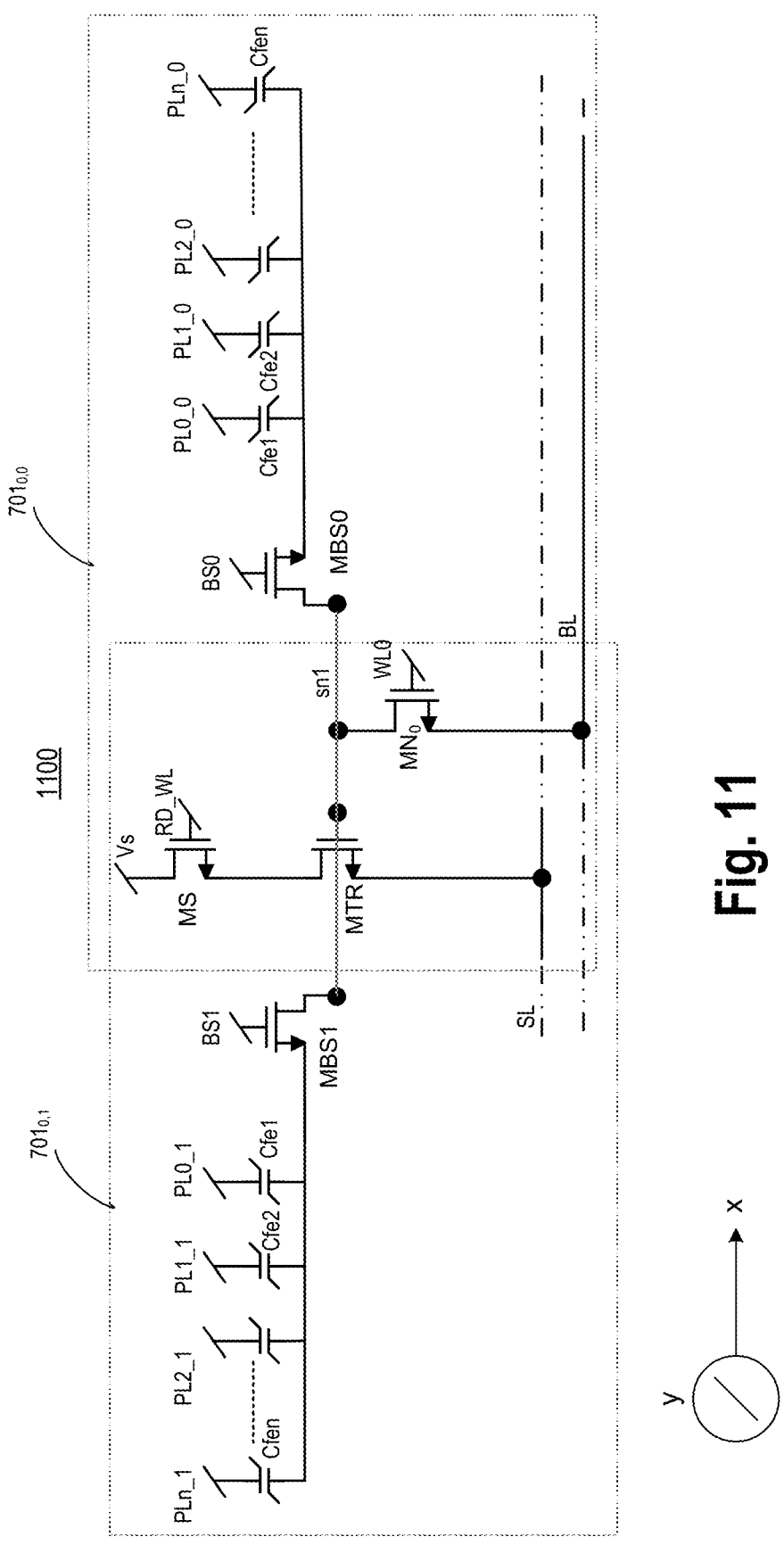
FIG. 11 illustrates an apparatus along a same bit-line with two sets of multiplexed capacitors and a shared circuit controllable by a word-line, where a transistor is coupled in series with a gain transistor which is coupled to a sense-line, in accordance with at least one embodiment.

FIG. 11 illustrates apparatus 1100 along a same bit-line with two sets of multiplexed capacitors and a shared circuit controllable by a word-line, where a transistor is coupled in series with a gain transistor which is coupled to a sense-line, in accordance with at least one embodiment. In at least one embodiment, apparatus 1100 comprises three devices of a multi-element ferroelectric gain bit-cell that are shared with two sets of capacitors that are selectable by select transistors MBS0 and MBS1. In at least one embodiment, three devices include gain transistor MTR, series transistor MS, and access transistor MN (e.g., $MN_0$). In at least one embodiment, select transistor MNS0 and select transistor MNS1 are controllable by controls BS0 and BS1, respectively. In at least one embodiment, select transistors MNS0 and MNS1 selectively couple storage node sn1 to a set of capacitors.

In at least one embodiment, first set of capacitors Cfe1 through Cfen are coupled to a first set of plate-lines (e.g., PL0_0 through PLn_0 as shown), where one terminal of first set of capacitors Cfe1 through Cfen is coupled to a first common node which is coupled to select transistor MNS0. In at least one embodiment, first common node is coupled to non-ferrielectric materials of capacitors directly. In at least one embodiment, second set of capacitors Cfe1 through Cfen are coupled to a second set of plate-lines (e.g., PL0_1 through PLn_1 as shown), where one terminal of second set of capacitors Cfe1 through Cfen is coupled to a second common node which is coupled to select transistor MNS1. In at least one embodiment, second common node is coupled to non-ferrielectric materials of capacitors directly.

In at least one embodiment, sharing larger gain transistor MTR and smaller series transistor MS and access transistor MN with more sets of capacitors than just one set of capacitors allows for effectively having two bit-cells (e.g., bit-cells $701_{0,0}$ and $701_{0,1}$) that share same transistors, same bit-line (BL) and sense-line (SL).

In at least one embodiment, apparatus 1100 allows for sharing larger gain transistor MTR and smaller series transistor MS and access transistor MN with more sets of capacitors than just one set of capacitors. In at least one embodiment, sharing these transistors effectively enables a lower number of capacitors per bit-cells because area cost of these transistors is hidden by at least two sets of capacitors, which can be stacked above these transistors. In at least one embodiment, by sharing storage node sn1 with two sets of selectable capacitors, amount of voltage or charge disturb seen on storage node sn1 is reduced because each set of capacitors can have fewer number of capacitors than just multi-element gain bit-cell 800 or multi-element gain bit-cell 900 that would have more capacitive load on storage node sn1. In at least one embodiment, apparatus 1100 allows for more storage capacity (since there can be more capacitors than multi-element gain bit-cell 800 or multi-element gain bit-cell 900) while reducing disturb effects on storage node sn1, which in turn can result in lower polarization density requirements for capacitors. In at least one embodiment, series transistor MS is removed, and reference bias or reference voltage Vs is directly connected to source or drain of gain transistor MTR.

Figure 12:
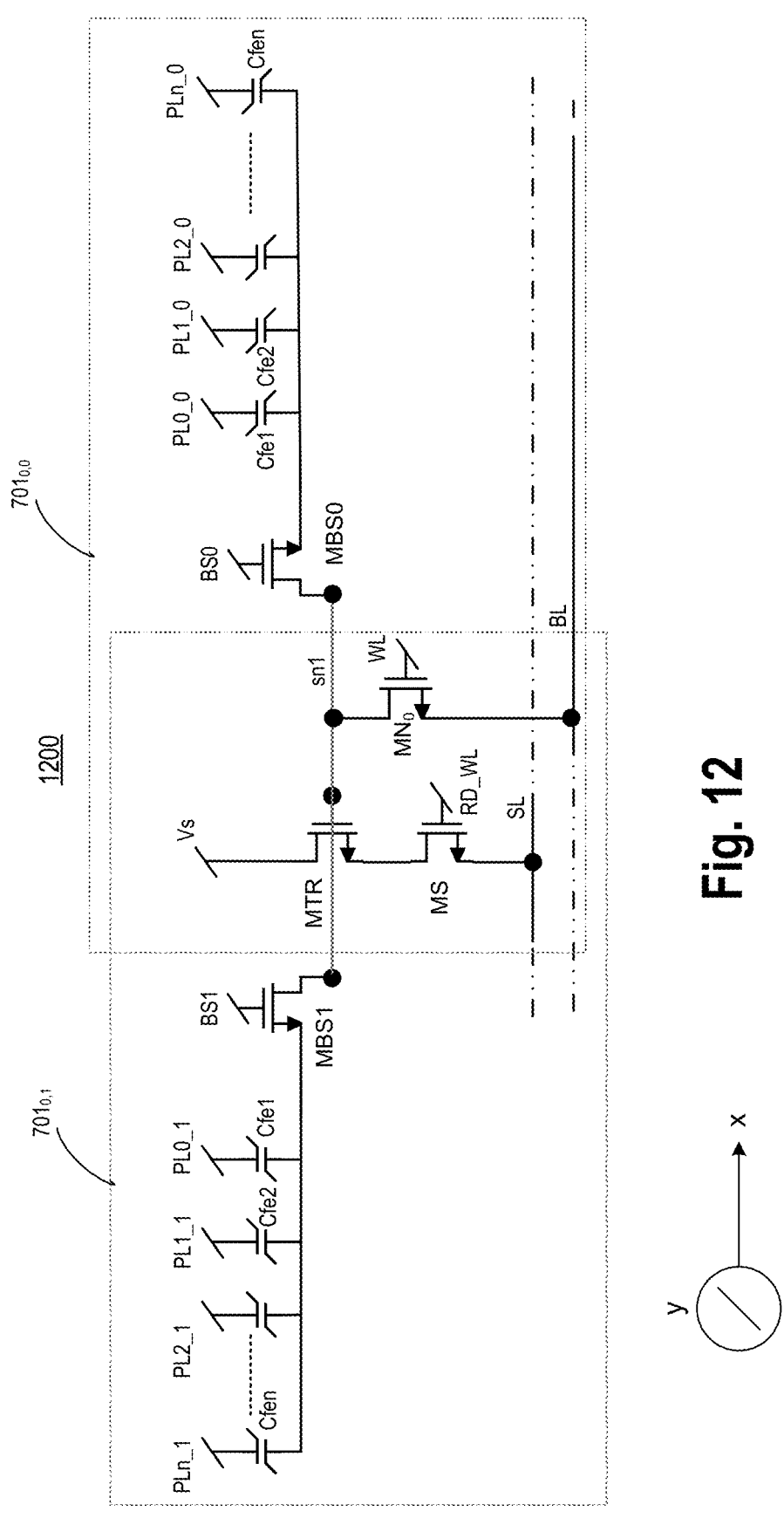
FIG. 12 illustrates an apparatus along a same bit-line with two sets of multiplexed capacitors and a shared circuit controllable by a word-line, where a transistor is coupled to a sense-line and in series with a gain transistor, in accordance with at least one embodiment.

FIG. 12 illustrates apparatus 1200 along a same bit-line with two sets of multiplexed capacitors and a shared circuit controllable by a word-line, where a transistor is coupled to a sense-line and in series with a gain transistor, in accordance with at least one embodiment. In at least one embodiment, apparatus 1200 is like apparatus 1100 but with different configuration of series transistor MS of shared circuitry. In at least one embodiment, source terminal of series transistor MS is connected to or coupled to SL instead of gain transistor MTR. In at least one embodiment, drain terminal of series transistor MS is connected to source terminal of gain transistor MTR. In at least one embodiment, gate terminal of gain transistor is connected to storage node sn1. In at least one embodiment, drain terminal of gain transistor is connected to reference Vs. In at least one embodiment, series transistor MS when connected to SL instead of reference Vs reduces turn-on resistance (R-on) induced variation related issues. In at least one embodiment, series transistor MS when connected to SL instead of reference Vs lowers parasitic capacitance and resistance on SL compared to configuration of FIG. 11 because larger gain transistor MTR is not seen by SL and because series transistor MS is much smaller in size the gain transistor MTR. In at least one embodiment, series transistor MS is removed, and SL is directly connected to source or drain of gain transistor MTR.

Figure 13:
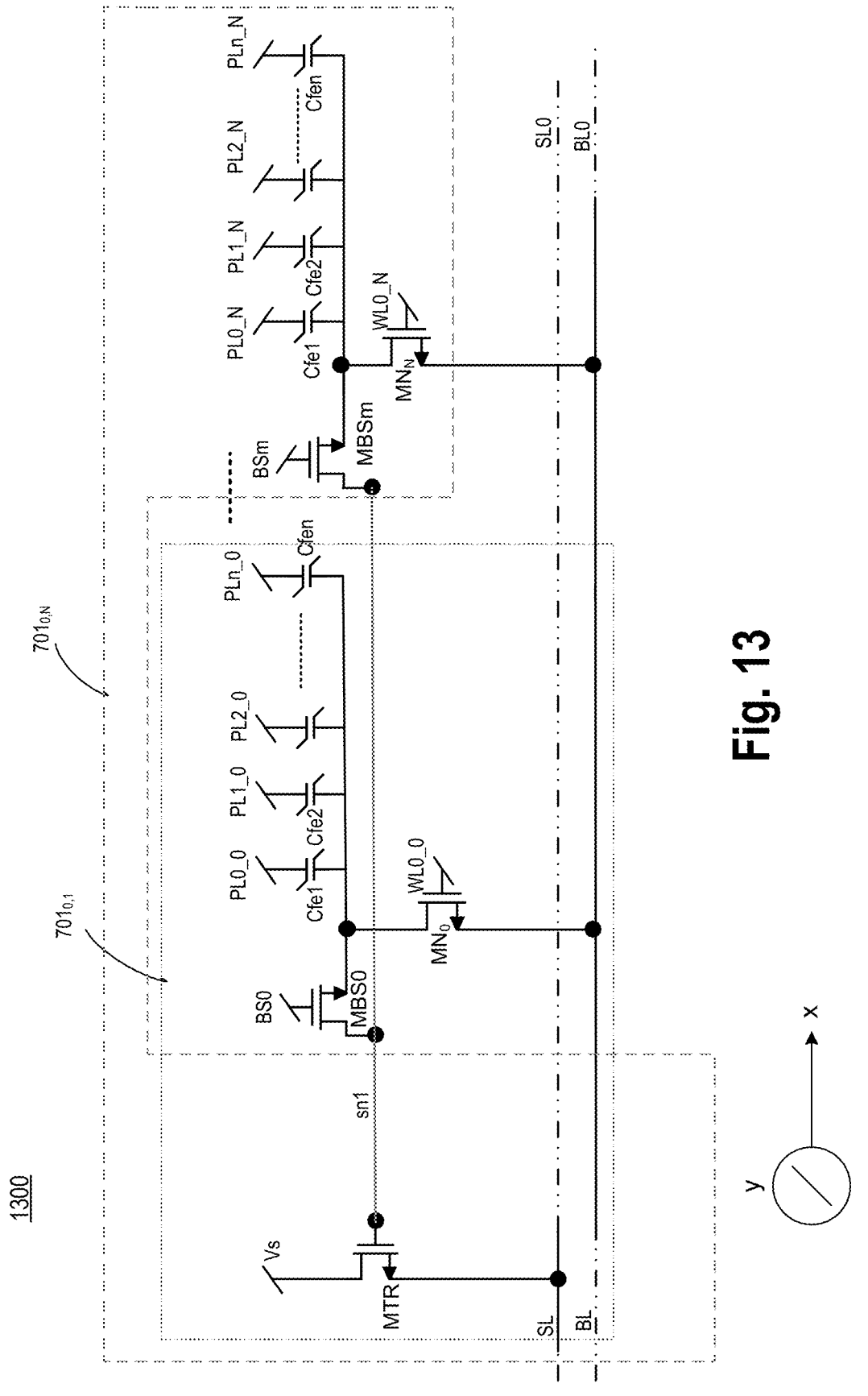
FIG. 13 illustrates an apparatus along a same bit-line with multiple sets of multiplexed capacitors with n-way sharing (e.g., along x-axis) of a gain transistor with no series coupled transistor, in accordance with at least one embodiment.

FIG. 13 illustrates apparatus 1300 along a same bit-line with multiple sets of multiplexed capacitors with n-way sharing (e.g., along x-axis) of a gain transistor with no series coupled transistor, in accordance with at least one embodiment. In at least one embodiment, gain transistor MTR is shared n-way (e.g., along same path as bit-line) with m number of sets of capacitors. In at least one embodiment, each set of capacitors has its corresponding set of plate-lines that extend orthogonal to bit-line BL (e.g., BL0) and sense-line SL (e.g., SL0). In at least one embodiment, each set of capacitors is coupled to storage node sn1 via its corresponding select transistor (e.g., select transistor MBS0 which its controllable by BS0, and MNSm which is controllable by BSm). In at least one embodiment, access transistor is not shared but each set of capacitors has an associated access transistor which is controllable by a separate word-line, hence n-way sharing (e.g., access transistor $MN_0$ is controllable by word-line WL0_0 and access transistor MN0 is coupled to bit-line (e.g., BL0) and common node of first set of capacitors). In at least one embodiment, select transistor $MN_n$ is controllable by Nth word-line WL0_N and access transistor $MN_N$ is coupled to same bit-line (e.g., BL0) and common node of Nth set of capacitors. In at least one embodiment, same gain transistor MTR is shared by multiple bit-cells, where each bit-cell along an x-axis comprises a set of capacitors, select transistor and access transistor (e.g., bit-cells $701_{0,1}$ through $701_{0,N}$ share same gain transistor MTR).

Figure 14:
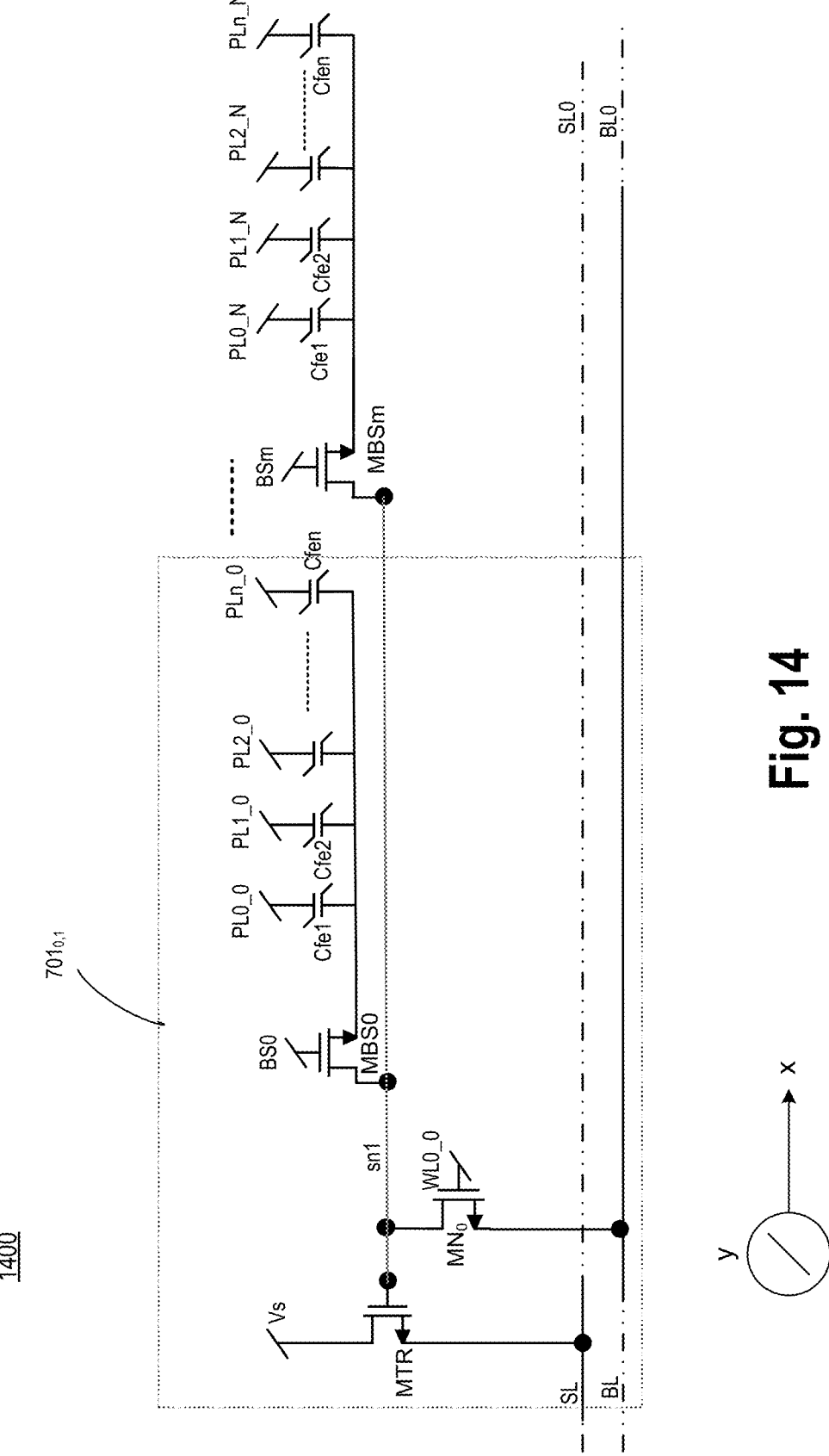
FIG. 14 illustrates an apparatus along a same bit-line with multiple sets of multiplexed capacitors with a shared gain transistor with no series coupled transistor, in accordance with at least one embodiment.

FIG. 14 illustrates apparatus 1400 along a same bit-line with multiple sets of multiplexed capacitors with a shared gain transistor with no series coupled transistor, in accordance with at least one embodiment. In at least one embodiment, gain transistor MTR and access transistor MN (e.g., MN0) is shared with a plurality of sets of multiplexed capacitors. In at least one embodiment, m number of select transistors MBS (e.g., MBS0 through MBSm) are used to select m number of sets of capacitors that are selectively coupled to a same bit-line (e.g., BL0) and sense-line (e.g., SL0). In at least one embodiment, storage node s1 is connected to select transistors (e.g., MBS0 through MBSm). In at least one embodiment, all sets of capacitors are accessible for read or write using one word-line (e.g., WL0_0), which is coupled to one bit-line (e.g., BL0). In at least one embodiment, number of bit-cells along a same bit-line (e.g., BL0) share same gain transistor MTR and same access transistor (e.g., $MN_0$).

Figure 15:
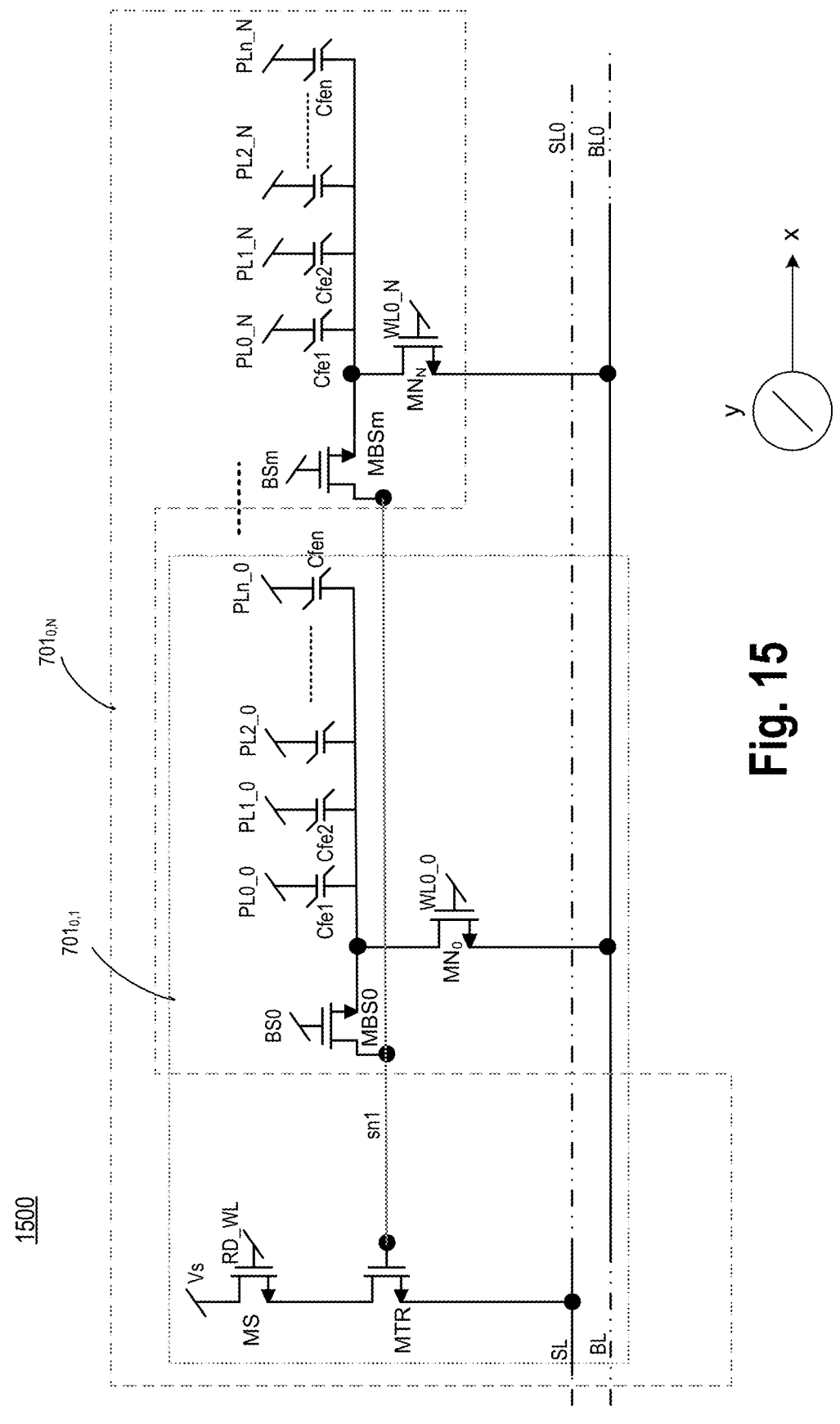
FIG. 15 illustrates an apparatus along a same bit-line with multiple sets of multiplexed capacitors with n-way sharing of a gain transistor coupled to a sense-line and coupled to a series transistor, in accordance with at least one embodiment.

FIG. 15 illustrates apparatus 1500 along a same bit-line with multiple sets of multiplexed capacitors with n-way sharing of a gain transistor coupled to a sense-line and coupled to a series transistor, in accordance with at least one embodiment. In at least one embodiment, apparatus 1500 is like apparatus 1300 but for configuration of shared circuitry. In at least one embodiment, shared circuitry includes gain transistor MTR and series transistor MS controllable by RD_WL, where gain transistor MTR is directly connected to a sense-line SL (e.g., $SL_0$) while series transistor is coupled to reference Vs.

In at least one embodiment, shared circuitry is shared n-way (e.g., along same path as bit-line) with m number of sets of capacitors. In at least one embodiment, each set of capacitors has its corresponding set of plate-lines that extend orthogonal to bit-line BL (e.g., BL0) and sense-line SL (e.g., SL0). In at least one embodiment, each set of capacitors is coupled to storage node sn1 via its corresponding select transistor (e.g., select transistor MBS0 which its controllable by BS0, and MNSm which is controllable by BSm). In at least one embodiment, access transistor is not shared but each set of capacitors has an associated access transistor which is controllable by a separate word-line, hence n-way sharing (e.g., access transistor $MN_0$ is controllable by word-line WL0_0 and access transistor MN0 is coupled to bit-line (e.g., BL0) and common node of first set of capacitors). In at least one embodiment, select transistor $MN_N$ is controllable by Nth word-line WL0_N and access transistor $MN_N$ is coupled to same bit-line (e.g., BL0) and common node of Nth set of capacitors. In at least one embodiment, same gain transistor MTR is shared by multiple bit-cells, where each bit-cell along an x-axis comprises a set of capacitors, select transistor and access transistor (e.g., bit-cells $701_{0,1}$ through $701_{0,N}$ share same gain transistor MTR).

Figure 16:
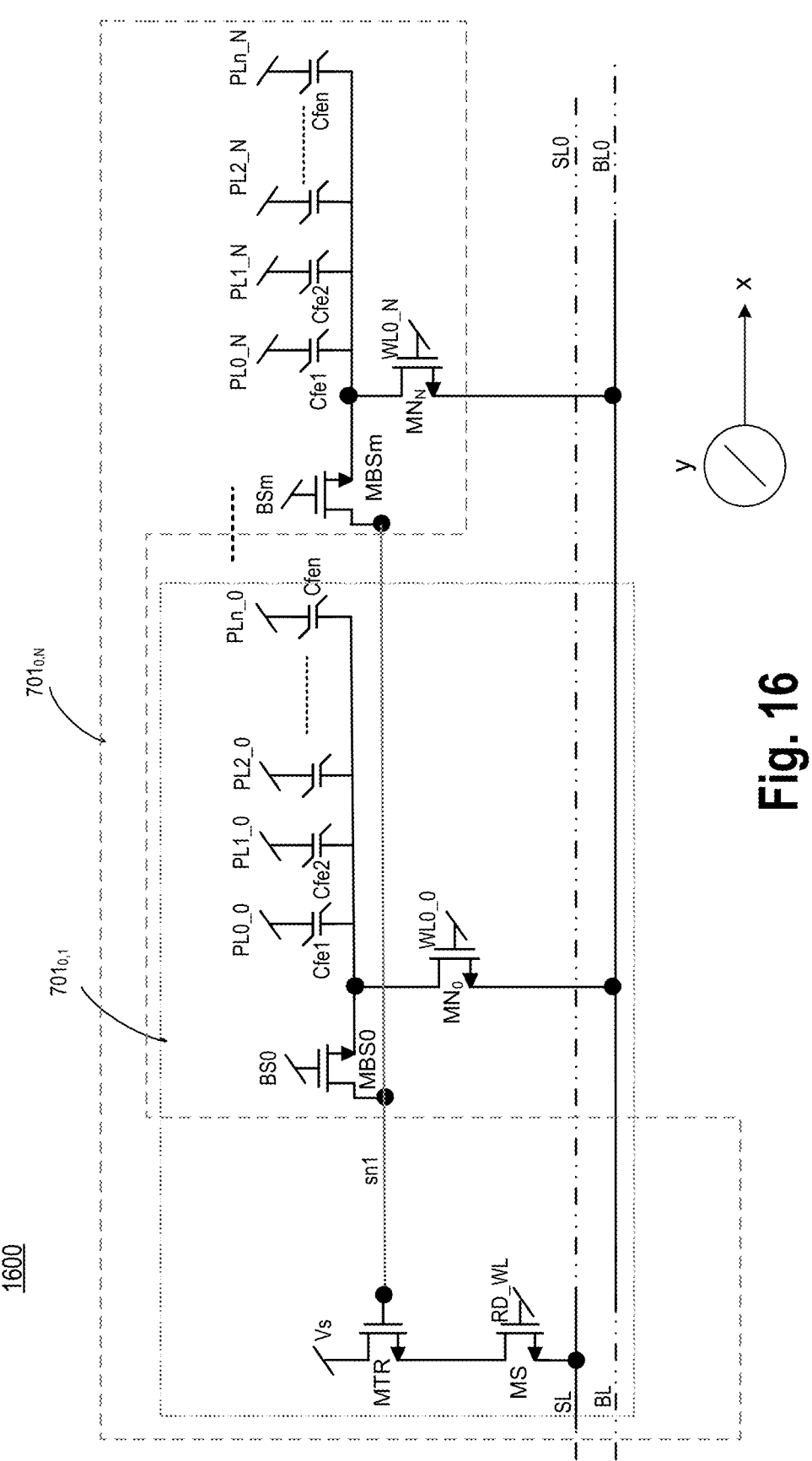
FIG. 16 illustrates an apparatus along a same bit-line with multiple sets of multiplexed capacitors with n-way sharing (e.g., along x-axis) of a gain transistor coupled to a series transistor which is coupled to a sense-line, in accordance with at least one embodiment.

FIG. 16 illustrates apparatus 1600 along a same bit-line with multiple sets of multiplexed capacitors with n-way sharing (e.g., along x-axis) of a gain transistor coupled to a series transistor which is coupled to a sense-line, in accordance with at least one embodiment. In at least one embodiment, apparatus 1600 is like apparatus 1500 but with different configuration of shared circuitry.

In at least one embodiment, shared circuitry includes gain transistor MTR and series transistor MS controllable by RD_WL, where gain transistor MTR is directly connected to a sense-line SL (e.g., SL0) while series transistor is coupled to reference Vs. In at least one embodiment, source terminal of series transistor MS is connected to or coupled to SL instead of gain transistor MTR. In at least one embodiment, drain terminal of series transistor MS is connected to source terminal of gain transistor MTR. In at least one embodiment, gate terminal of gain transistor is connected to storage node sn1. In at least one embodiment, drain terminal of gain transistor is connected to reference Vs. In at least one embodiment, series transistor MS when connected to SL instead of reference Vs reduces turn-on resistance (R-on) induced variation related issues. In at least one embodiment, series transistor MS when connected to SL instead of reference Vs lowers parasitic capacitance and resistance on SL compared to configuration of FIG. 15 because larger gain transistor MTR is not seen by SL and because series transistor MS is much smaller in size the gain transistor MTR.

Figure 17:
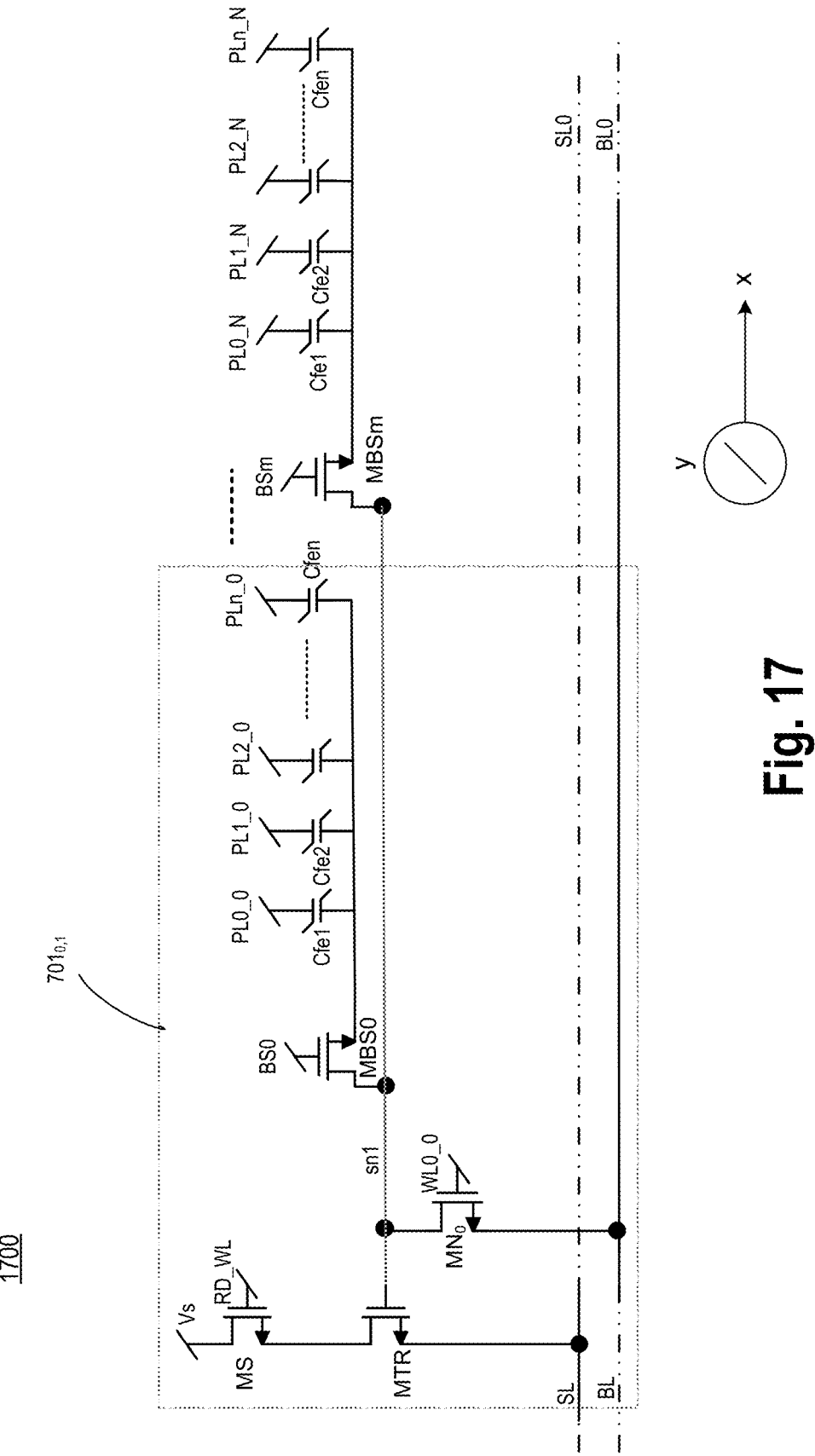
FIG. 17 illustrates an apparatus along a same bit-line which is an extension of apparatus of FIG. 11 with multiple sets of multiplexed capacitors (along x-axis) and a shared circuit controllable by a word-line, where a transistor is coupled in series with a gain transistor which is coupled to a sense-line, in accordance with at least one embodiment.

FIG. 17 illustrates apparatus 1700 along a same bit-line which is an extension of apparatus of FIG. 11 with multiple sets of multiplexed capacitors (along x-axis) and a shared circuit controllable by a word-line, where a transistor is coupled in series with a gain transistor which is coupled to a sense-line, in accordance with at least one embodiment. In at least one embodiment, apparatus 1700 is like apparatus 1400 but with different configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs.

In at least one embodiment, shared circuitry is shared n-way (e.g., along same path as bit-line) with m number of sets of capacitors. In at least one embodiment, each set of capacitors has its corresponding set of plate-lines that extend orthogonal to bit-line BL (e.g., BL0) and sense-line SL (e.g., SL0). In at least one embodiment, each set of capacitors is coupled to storage node sn1 via its corresponding select transistor (e.g., select transistor MBS0 which its controllable by BS0, and MNSm which is controllable by BSm). In at least one embodiment, access transistor is shared and each set of capacitors is controllable by a same word-line (e.g., WL0_0) by access transistor MN (e.g., $MN_0$), hence n-way sharing of gain transistor MTR. In at least one embodiment, select transistor $MN_N$ is controllable by Nth word-line WL0_N and access transistor $MN_N$ is coupled to same bit-line (e.g., BL0) and common node of Nth set of capacitors. In at least one embodiment, same gain transistor MTR, series transistor MS, and access transistor MN is shared by multiple bit-cells, where each bit-cell along an x-axis comprises a set of capacitors and a select transistor (e.g., bit-cells $701_{0,1}$ through $701_{0,N}$ share same gain transistor MTR, series transistor MS, and access transistor MN).

Figure 18:
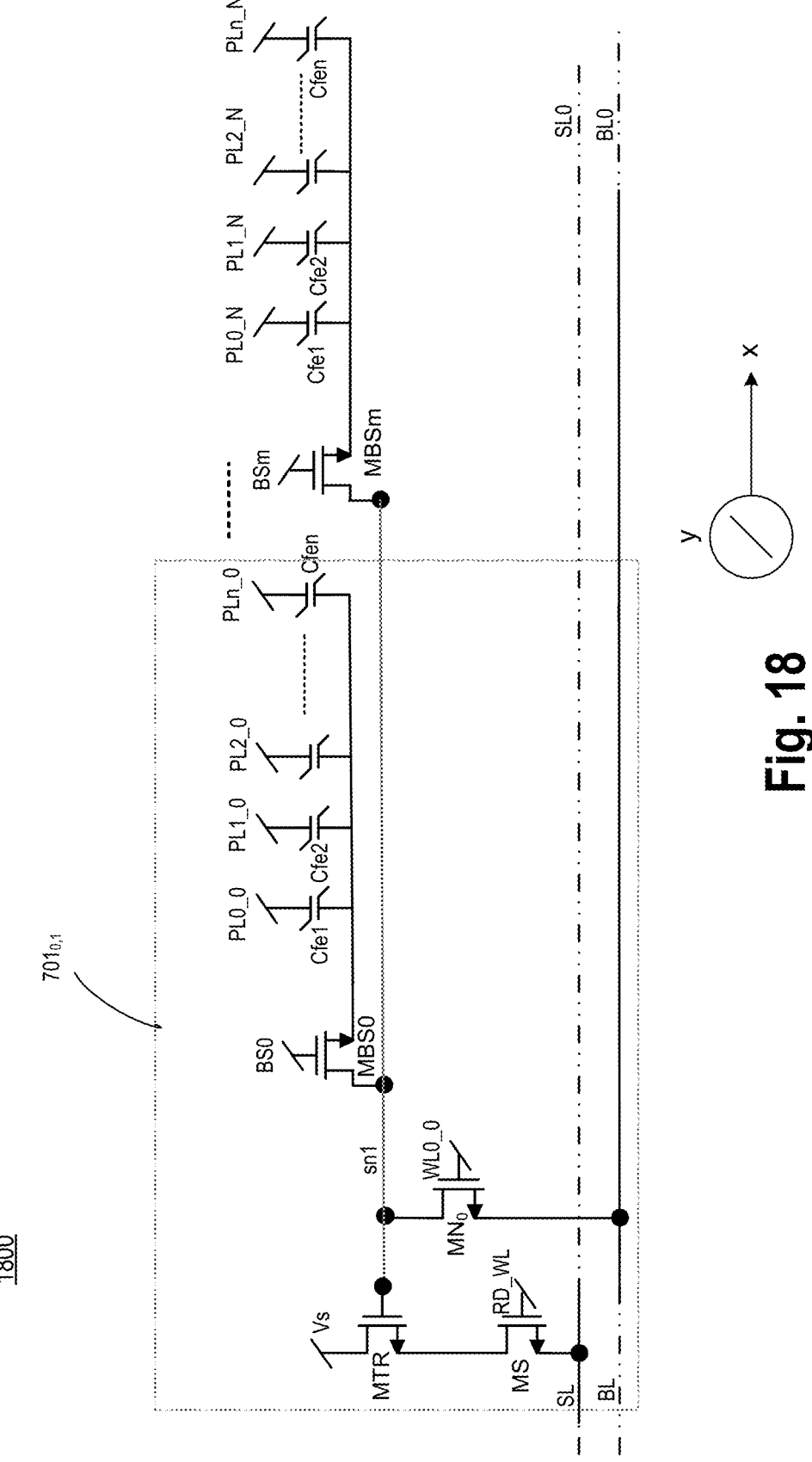
FIG. 18 illustrates an apparatus along a same bit-line which is an extension of apparatus of FIG. 12 with multiple sets of multiplexed capacitors (e.g., along x-axis) and a shared circuit controllable by a word-line, where a transistor is coupled to a sense-line and is coupled in series with a gain transistor, in accordance with at least one embodiment.

FIG. 18 illustrates apparatus 1800 along a same bit-line which is an extension of apparatus of FIG. 12 with multiple sets of multiplexed capacitors (e.g., along x-axis) and a shared circuit controllable by a word-line, where a transistor is coupled to a sense-line and is coupled in series with a gain transistor, in accordance with at least one embodiment. In at least one embodiment, apparatus 1800 is similar to apparatus 1700 but different configuration of shared circuitry. In at least one embodiment, shared circuitry includes gain transistor MTR and series transistor MS controllable by RD_WL. In at least one embodiment, series transistor is directly connected to a sense-line SL (e.g., SL0) while gain transistor is coupled to reference Vs and with gate termina coupled to storage node sn1.

In at least one embodiment, shared circuitry is shared n-way (e.g., along same path as bit-line) with m number of sets of capacitors. In at least one embodiment, each set of capacitors has its corresponding set of plate-lines that extend orthogonal to bit-line BL (e.g., BL0) and sense-line SL (e.g., SL0). In at least one embodiment, each set of capacitors is coupled to storage node sn1 via its corresponding select transistor (e.g., select transistor MBS0 which its controllable by BS0, and MNSm which is controllable by BSm). In at least one embodiment, same gain transistor MTR, series transistor MS, and access transistor MN is shared by multiple bit-cells, where each bit-cell along an x-axis comprises a set of capacitors and a select transistor (e.g., bit-cells $701_{0,1}$ through $701_{0,N}$ share same gain transistor MTR, series transistor MS, and access transistor MN).

Figure 19:
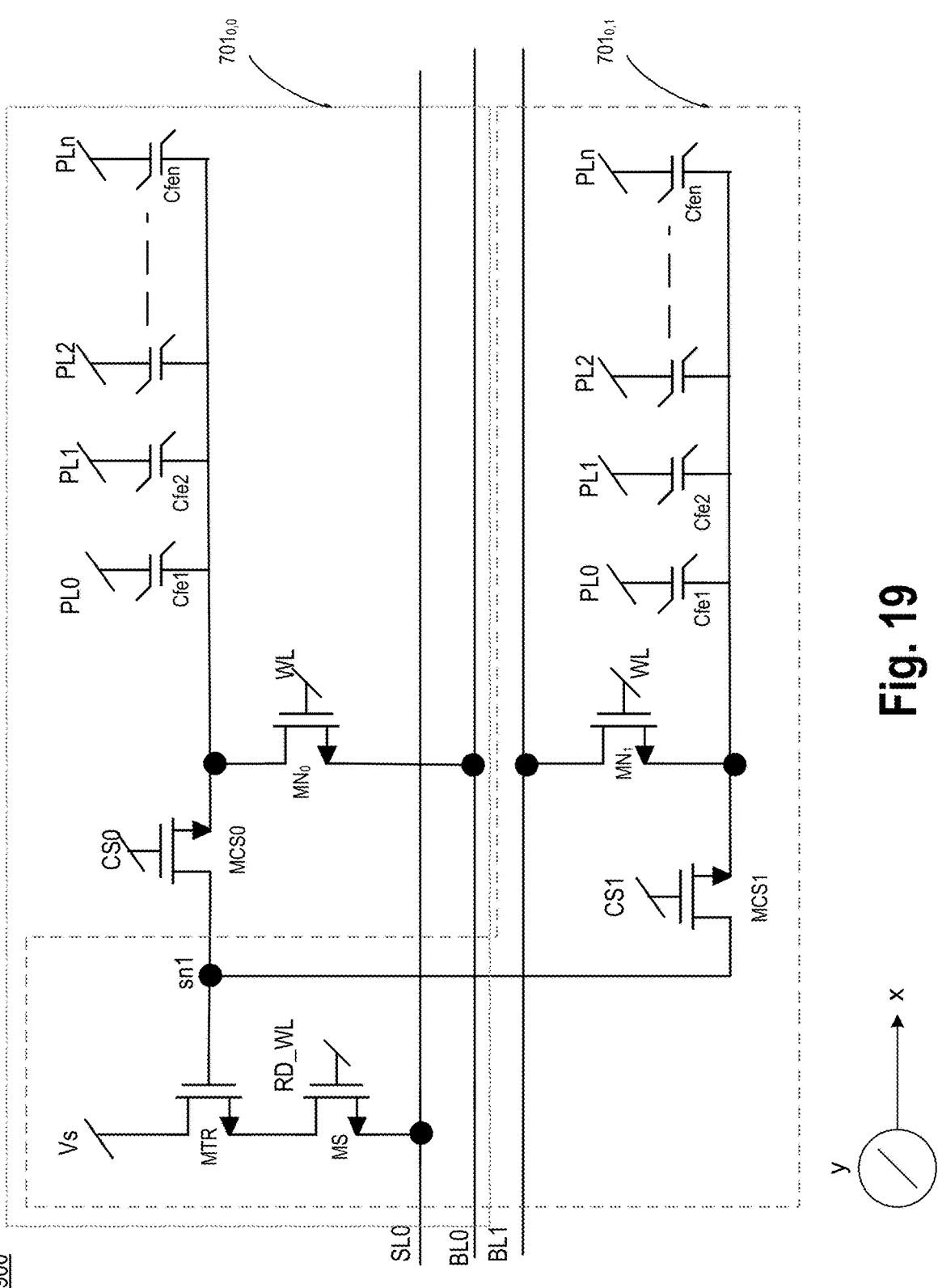
FIG. 19 illustrates an apparatus 2-way sharing (e.g., along y-axis) of gain transistor with two sets of multiplexed capacitors with shared word-line on two different bit-lines, where gain transistor is coupled in series with a transistor which is coupled to a sense-line, in accordance with at least one embodiment.

FIG. 19 illustrates apparatus 1900 with 2-way sharing (e.g., along y-axis) of gain transistor with two sets of multiplexed capacitors with shared word-line on two different bit-lines, where gain transistor is coupled in series with a transistor which is coupled to a sense-line, in accordance with at least one embodiment. In at least one embodiment, apparatus 1900 comprises shared gain transistor MTR and series transistor MS. In at least embodiment, series transistor MS is coupled to sense-line (e.g., SL0) and coupled in series with gain transistor MTR. In at least one embodiment, gate terminal of gain transistor MTR is connected to storage node sn1 while drain terminal of gain transistor MTR is connected to reference Vs. In at least one embodiment, apparatus 1900 includes column multiplexer transistors MCS0 and MCS1 controllable by column select signals CS0 and CS1, respectively. In at least embodiment, one terminal of column multiplexer transistors MCS0 and MCS1 are coupled to storage node sn1.

In at least one embodiment, for each set of capacitors, which are coupled to their associated column multiplexer transistor, there is an associated word-line controlled access transistor. In at least one embodiment, a first set of capacitors is coupled to a first access transistor $MN_0$ coupled to a first bit-line BL0 and controllable by word-line WL (e.g., WL0). In at least one embodiment, a second set of capacitors is coupled to a second access transistor $MN_1$ coupled to a second bit-line BL1 and controllable by same word-line WL (e.g., WL0). In at least one embodiment, apparatus 1900 comprises two bit-cells $701_{0,0}$ and $701_{0,1}$. In at least one embodiment, plate-lines are shared between first and second set of capacitors. In at least one embodiment, since SL is being shared between two sets of capacitors, signal routing long direction of bit-lines (e.g., BL0, BL1) is made less crowded because one less sense-line is routed in direction of bit-lines. In at least one embodiment, series transistor MS is removed, and gain transistor is directly connected to sense-line (SL0). In at least one embodiment, bit-lines are parallel to one another in a same plane (e.g., in an x-y plane).

Figure 20:
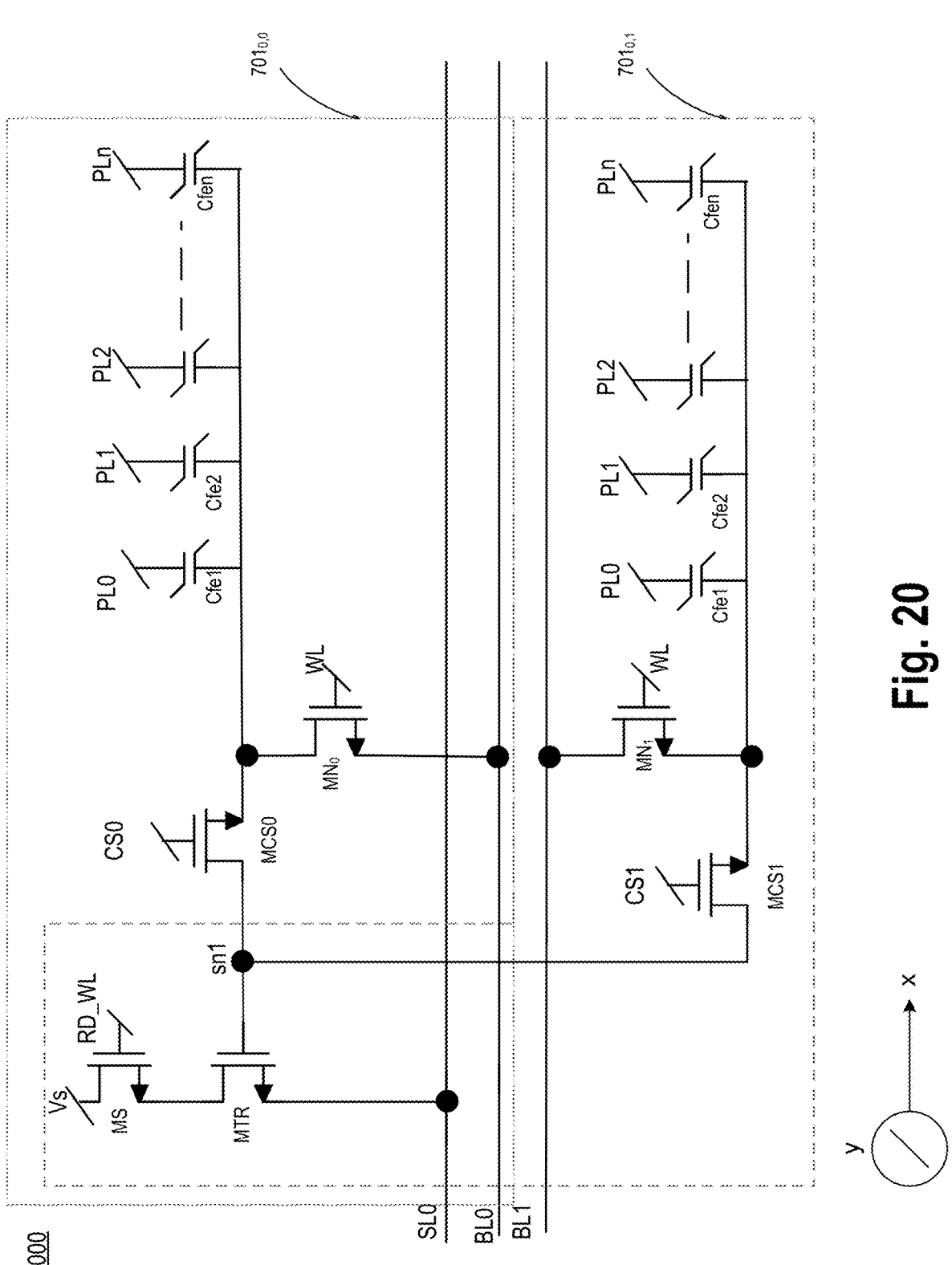
FIG. 20 illustrates an apparatus 2-way sharing (e.g., along y-axis) of a gain transistor with two sets of multiplexed capacitors with shared word-line on two different bit-lines, where gain transistor is coupled in series with a transistor, in accordance with at least one embodiment.

FIG. 20 illustrates apparatus 2000 2-way sharing (e.g., along y-axis) of gain transistor with two sets of multiplexed capacitors with shared word-line on two different bit-lines, where gain transistor is coupled to sense which and is coupled in series with a transistor, in accordance with at least one embodiment. In at least one embodiment, apparatus 2000 is similar to apparatus 1900 but for configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference bias or reference voltage Vs is directly connected to source or drain of gain transistor MTR.

Figure 21:
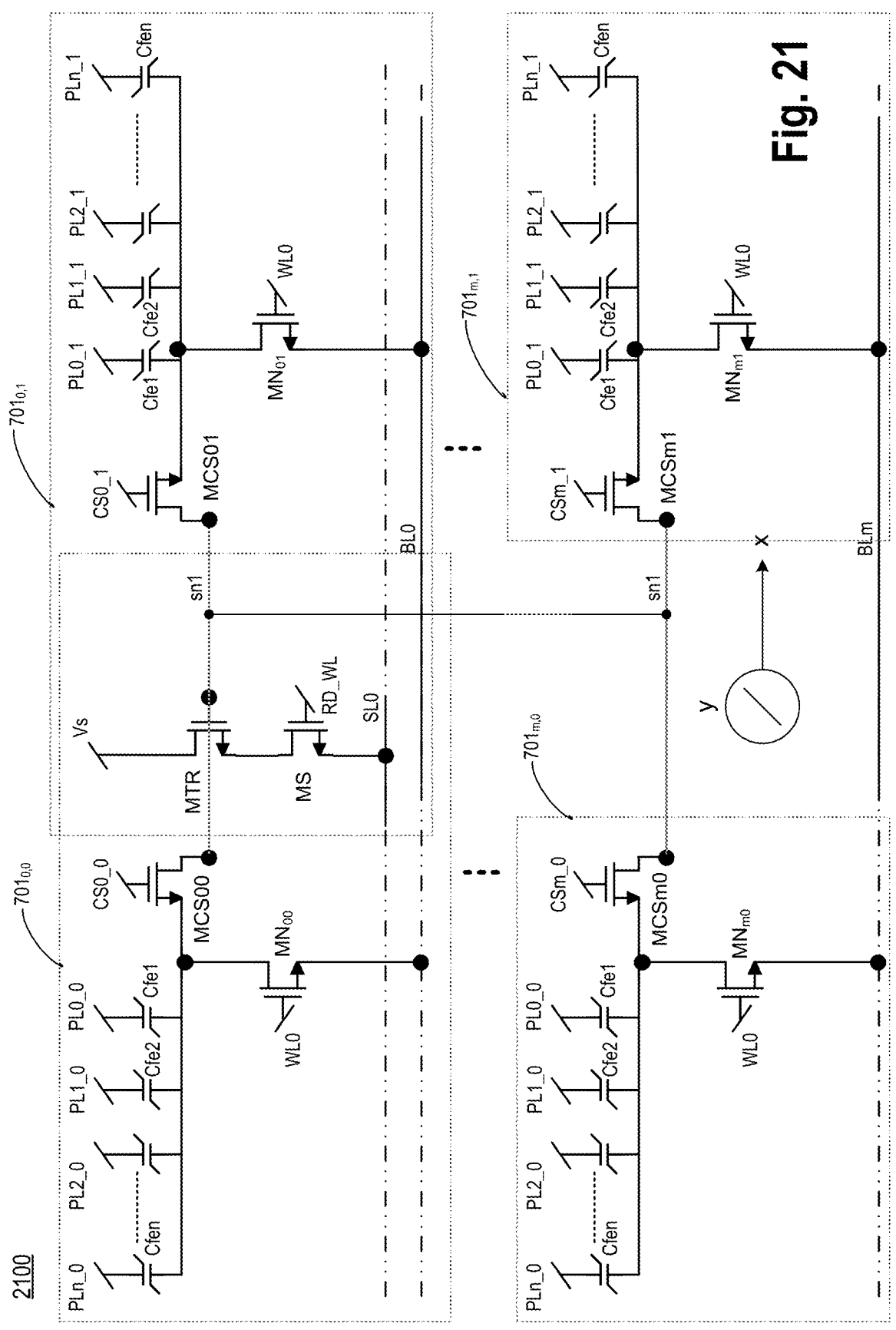
FIG. 21 illustrates an apparatus with m-way sharing (e.g., along y-axis) of multiple sets of capacitors with shared word-line using separate access transistors on m-number of different bit-lines, where gain transistor is coupled in series with a transistor which is coupled to a sense-line, in accordance with at least one embodiment.

FIG. 21 illustrates apparatus 2100 with m-way sharing (e.g., along y-axis) of multiple sets of capacitors with shared word-line using separate access transistors on m-number of different bit-lines, where gain transistor is coupled in series with a transistor which is coupled to a sense-line, in accordance with at least one embodiment. In at least one embodiment, apparatus 2100 illustrates m-way sharing gain transistor MTR with multiple sets of capacitors along y-axis, and 2-way sharing of two sets of capacitors along an x-axis. In at least one embodiment, set of capacitors along x-axis share gain transistor MTR, storage node sn1, series transistor MS, sense-line SL (e.g., SL0), and word-line (e.g., WL0). In at least one embodiment, series transistor MS is coupled to sense-line (E.g., SL0) and controllable by read word-line (RD_WL) and couples in series with gain transistor MTR. In at least one embodiment, gate terminal of gain transistor MTR is coupled storage node sn1 while drain terminal of gain transistor MTR is coupled to reference Vs.

In at least one embodiment, each set of capacitors is coupled to storage node via a corresponding column multiplexer transistor which has its own control (e.g., transistor MCS00 controlled by CS0_0, transistor MCS01 controlled by CS0_1, transistor MCSm0 controlled by CSm_0, transistor MCSm1 controlled by CSm_1). In at least one embodiment, each set of capacitors has an associated access transistor MN which is controllable by a same word-line, but may be coupled to different bit-lines in different rows (e.g., access transistor $MN_{0,0}$ is controllable by WL0 and coupled to bit-line BL0 and part of bit-cell $701_{0,0}$, access transistor $MN_{0,1}$ is controllable by WL0 and coupled to bit-line BL0 and part of bit-cell $701_{0,1}$, access transistor $MN_{m,0}$ is controllable by WL0 and coupled to bit-line BLm and part of bit-cell $701_{m,0}$, and access transistor $MN_{m,1}$ is controllable by WL0 and coupled to bit-line BLm and part of bit-cell $701_{m,1}$). In at least one embodiment, plate-lines for capacitors on a same y-axis is shared (e.g., plate-lines PL0_0, PL1_0, are shared between bit-cells $701_{0,0}$ and $701_{m,0}$). In at least one embodiment, series transistor MS is removed, and sense-line (e.g., SL0) is directly connected to source or drain of gain transistor MTR.

Figure 22:
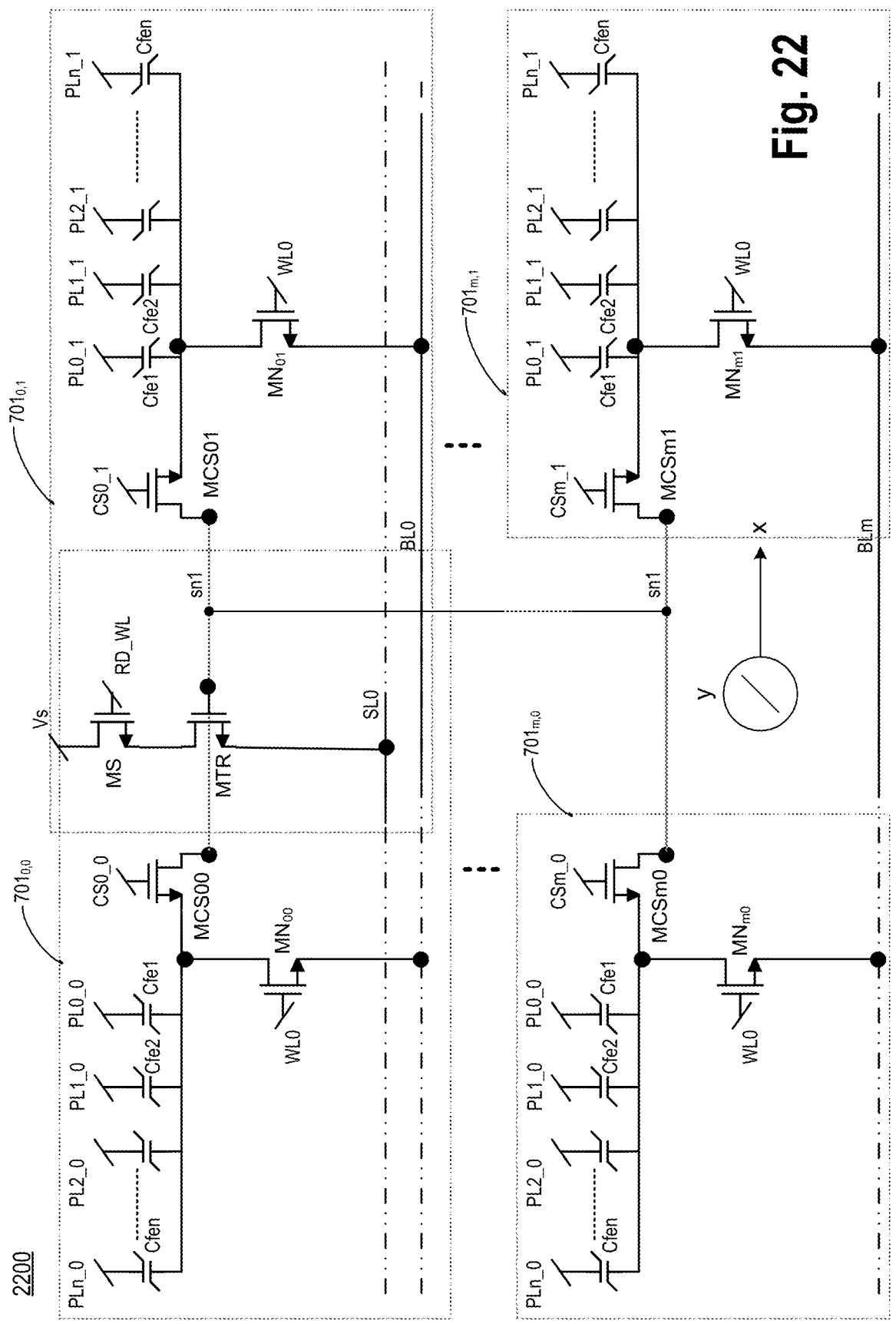
FIG. 22 illustrates an apparatus with m-way sharing (e.g., along y-axis) of multiple sets of capacitors with shared word-line using separate access transistors on m-number of different bit-lines, where gain transistor is in series with a transistor which is coupled to a sense-line, in accordance with at least one embodiment.

FIG. 22 illustrates apparatus 2200 with m-way sharing (e.g., along y-axis) of multiple sets of capacitors with shared word-line using separate access transistors on m-number of different bit-lines, where gain transistor is in series with a transistor which is coupled to a sense-line, in accordance with at least one embodiment. Apparatus 2200 is similar to apparatus 2100 but for configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference bias or reference voltage Vs is directly connected to source or drain of gain transistor MTR.

Figure 23:
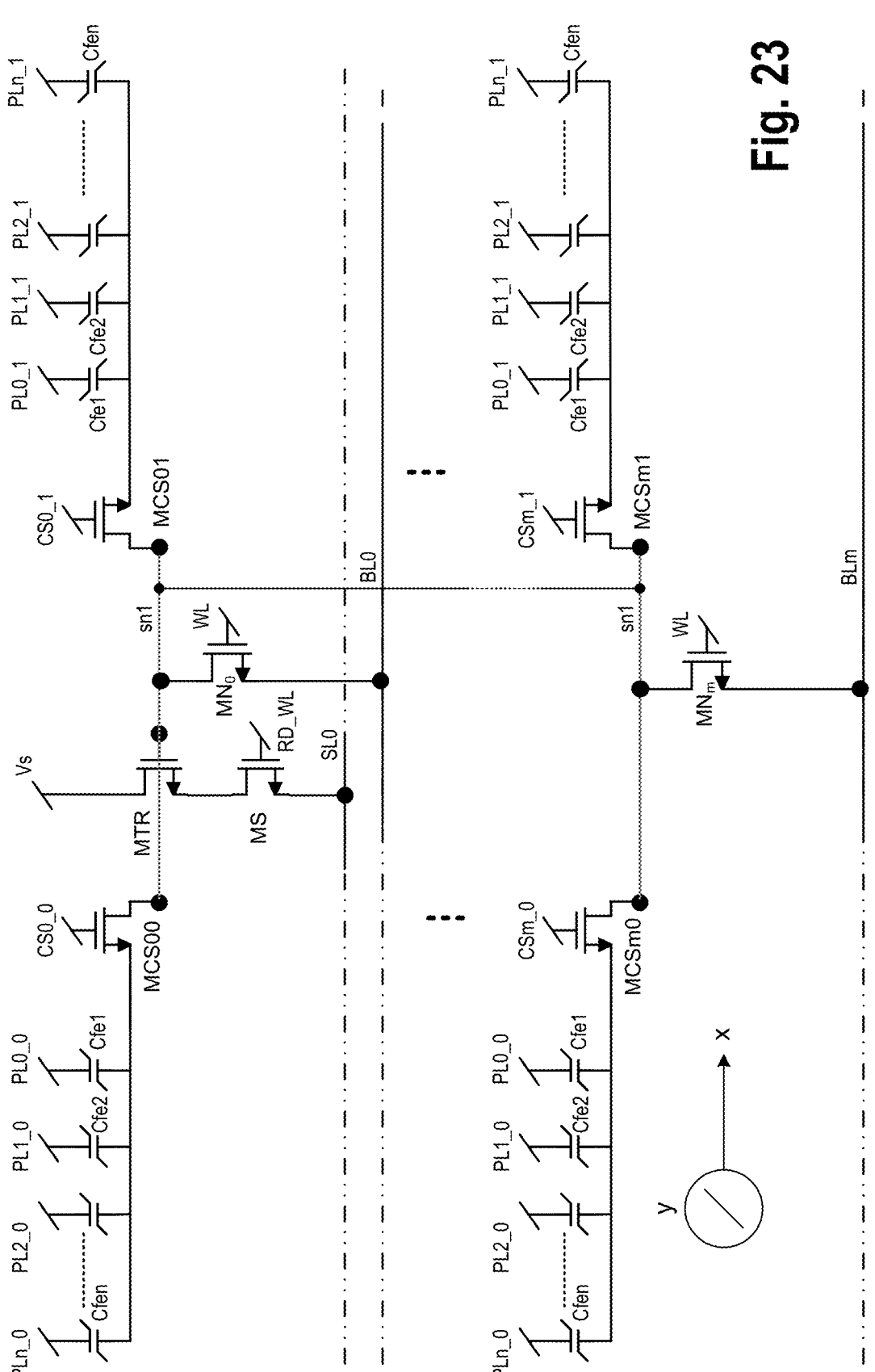
FIG. 23 illustrates an apparatus with m-way sharing (e.g., along y-axis) of multiple sets of capacitors with shared word-line with reduced number of access transistors on m-number of different bit-lines, where gain transistor is in series with a transistor which is coupled to a sense-line, in accordance with at least one embodiment.

FIG. 23 illustrates apparatus 2300 with m-way sharing (e.g., along y-axis) of multiple sets of capacitors with shared word-line with reduced number of access transistors on m-number of different bit-lines, where gain transistor is in series with a transistor which is coupled to a sense-line, in accordance with at least one embodiment. In at least one embodiment, apparatus 2300 is like apparatus 2100 but with additional sharing of access transistor per row (e.g., along x-axis). In at least one embodiment, access transistor (e.g., $MN_0$) is coupled to a first bit-line (e.g., BL0) and is shared with sets of capacitors along that first bit-line. Likewise, in at least one embodiment, m-th access transistor (e.g., $MN_m$) is coupled to a m-th bit-line (e.g., BLm) and is shared with sets of capacitors along that m-th bit-line. Compared to apparatus 2100, here fewer number of access transistors are used that share same word-line. In at least one embodiment, series transistor MS is removed, and sense-line (e.g., SL0) is directly connected to source or drain of gain transistor MTR.

Figure 24:
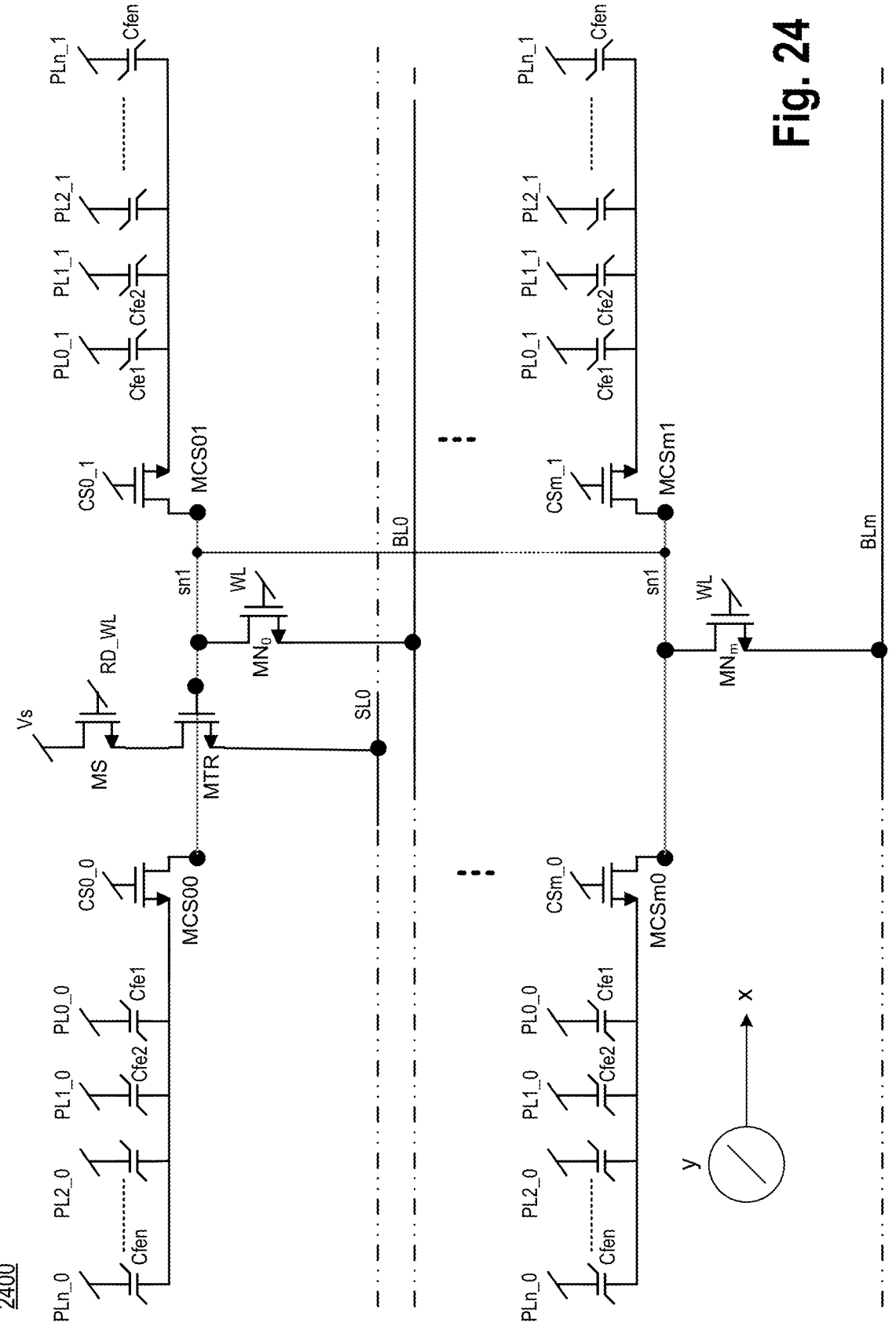
FIG. 24 illustrates an apparatus with m-way sharing (e.g., along y-axis) of multiple sets of capacitors with shared word-line with reduced number of access transistors on m-number of different bit-lines, where gain transistor is coupled to a sense-line which is in series with a transistor, in accordance with at least one embodiment.

FIG. 24 illustrates apparatus 2400 with m-way sharing (e.g., along y-axis) of multiple sets of capacitors with shared word-line with reduced number of access transistors on m-number of different bit-lines, where gain transistor is coupled to a sense-line which is in series with a transistor, in accordance with at least one embodiment. In at least one embodiment, apparatus 2400 is like apparatus 2300 but for different configuration of shared series coupled gain transistor MTR and series transistor MS. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference Vs is directly connected to gain transistor MTR.

Figure 25:
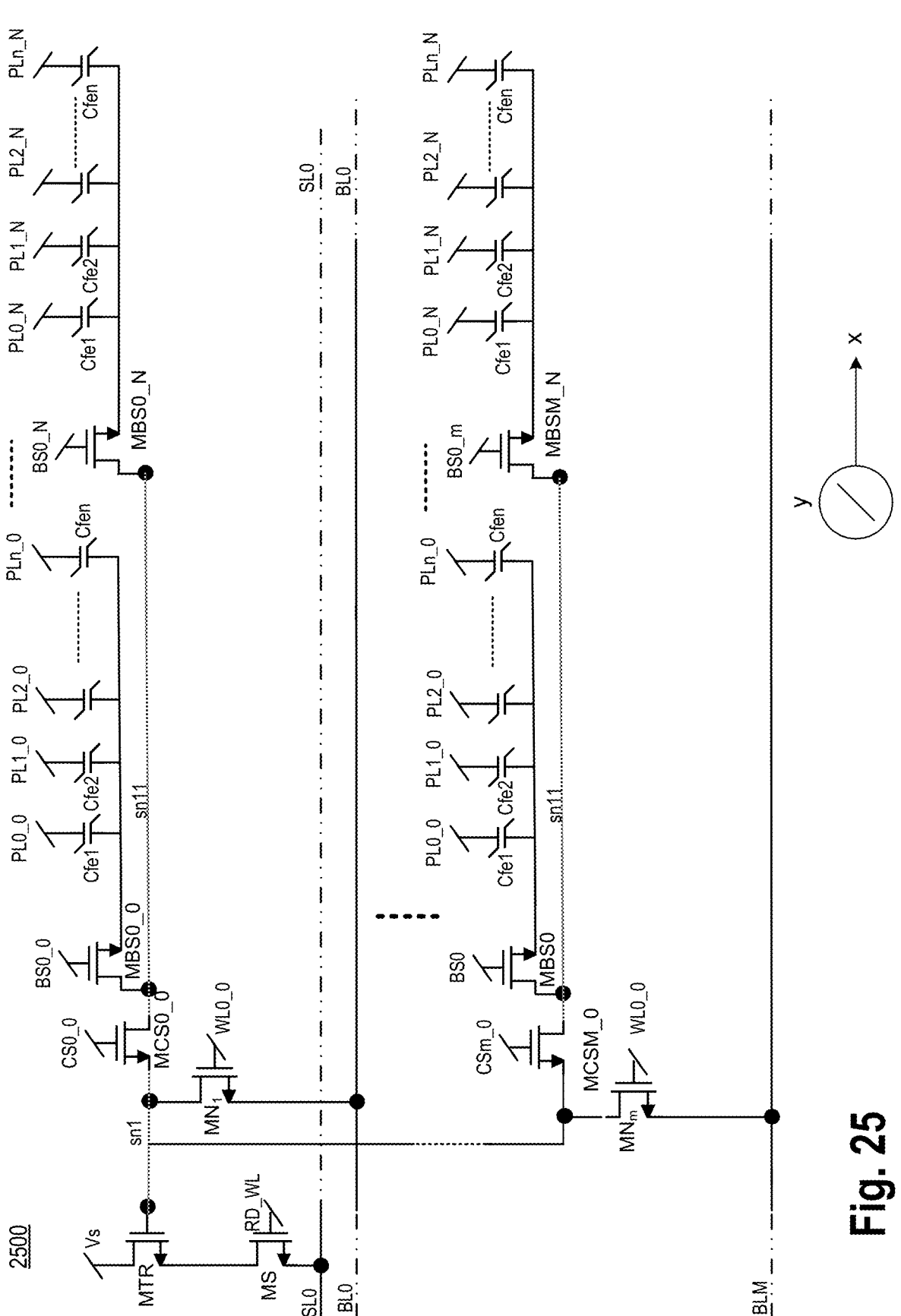
FIG. 25 illustrates an apparatus with m-way sharing (e.g., along y-axis) and n-way sharing (e.g., along x-axis) of multiple sets of capacitors with shared word-line one m-number of different bit-lines, where gain transistor is in series with a transistor which is coupled to a sense-line, in accordance with at least one embodiment.

FIG. 25 illustrates apparatus 2500 with m-way sharing (e.g., along y-axis) and n-way sharing (e.g., along x-axis) of multiple sets of capacitors with shared word-line one m-number of different bit-lines, where gain transistor is in series with a transistor which is coupled to a sense-line, in accordance with at least one embodiment. Apparatus 2500 comprises shared circuitry comprises gain transistor MTR and series coupled series transistor MS. In at least one embodiment, series transistor is connected to sense-line (e.g., SL0) and controllable by read word-line (RD_WL). In at least one embodiment, gain transistor MTR has a gate terminal coupled to storage node s1 and a drain terminal coupled to reference Vs. In at least one embodiment, shared circuitry is shared m-way (e.g., along y-axis) with multiple sets of capacitors, where each group of multiple sets of capacitors is coupled to storage node sn1 via select transistors and a column select transistor. In at least one embodiment, access transistor is coupled to storage node sn1 and a first bit-line (e.g., BL0), and also coupled to column select transistor (e.g., $MN_1$ is coupled to column select transistor MCS0_0, which is coupled to node sn11, which is coupled to a plurality of select transistors MBS0_0 through MBS0_N). In at least one embodiment, N sets of capacitors are coupled per bit-line along x-axis. In at least one embodiment, plate-lines are shared between sets of capacitors which are along a same y-axis (e.g., plate-line PL0_0 is shared between capacitors Cfe1 of different rows). In at least one embodiment, access transistor is coupled to storage node sn1 and a m-th bit-line (e.g., BLm), and also coupled to m-th column select transistor (e.g., $MN_m$ is coupled to column select transistor MCSM_0, which is coupled to node sn11, which is coupled to a plurality of select transistors MBSM_0 through MBSM_N). In at least one embodiment, series transistor MS is removed, sense-line (e.g., SL0) is directly connected to source or drain of gain transistor MTR.

Figure 26:
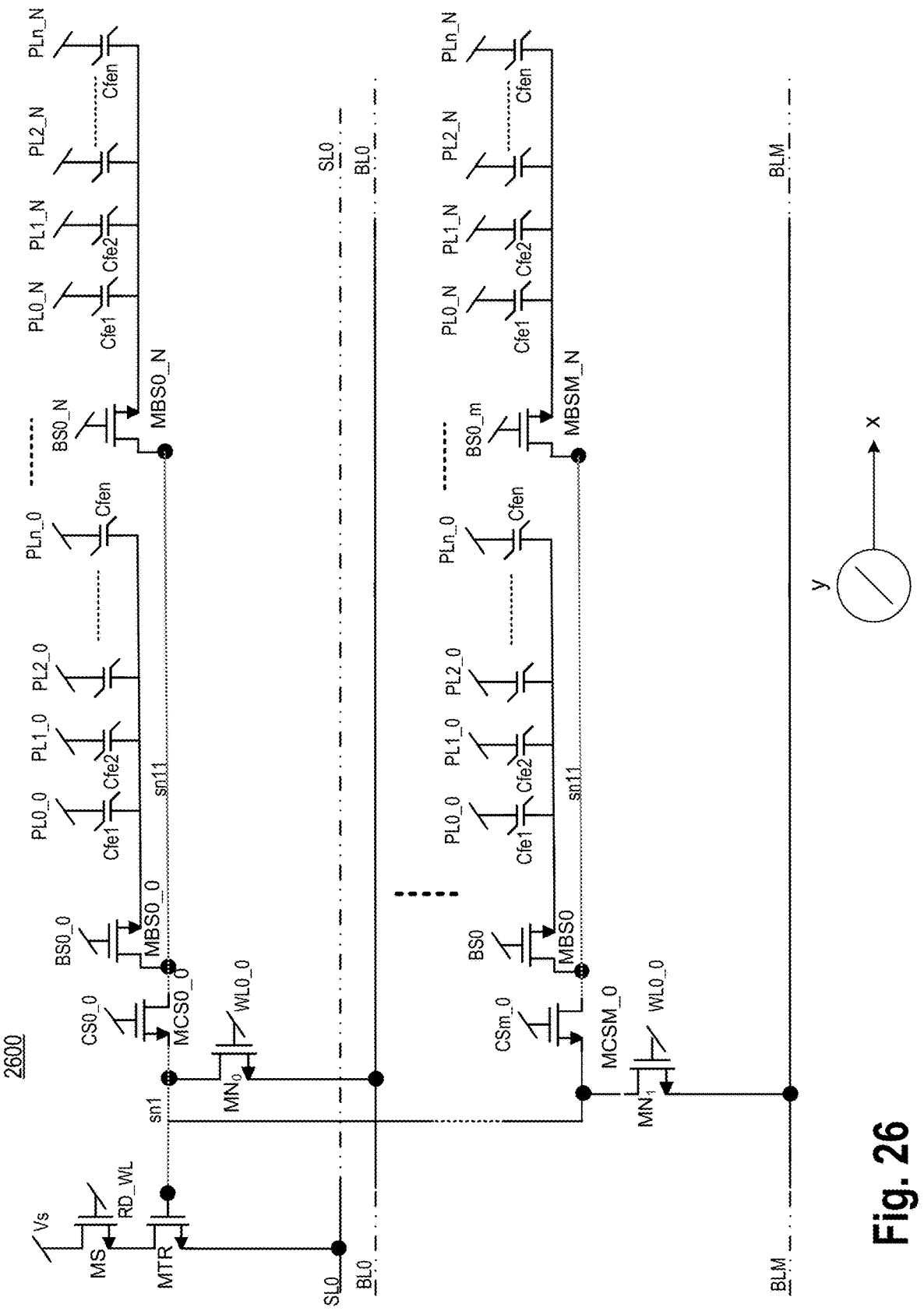
FIG. 26 illustrates an apparatus with m-way sharing (e.g., along y-axis) and n-way sharing (e.g., along x-axis) of multiple sets of capacitors with shared word-line one m-number of different bit-lines, where gain transistor is coupled to sense-line and is in series with a transistor, in accordance with at least one embodiment.

FIG. 26 illustrates apparatus 2600 with m-way sharing (e.g., along y-axis) and n-way sharing (e.g., along x-axis) of multiple sets of capacitors with shared word-line one m-number of different bit-lines, where gain transistor is coupled to sense-line and is in series with a transistor, in accordance with at least one embodiment. Apparatus 2600 is like apparatus 2500 but with different configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference Vs is directly connected to gain transistor MTR.

Figure 27:
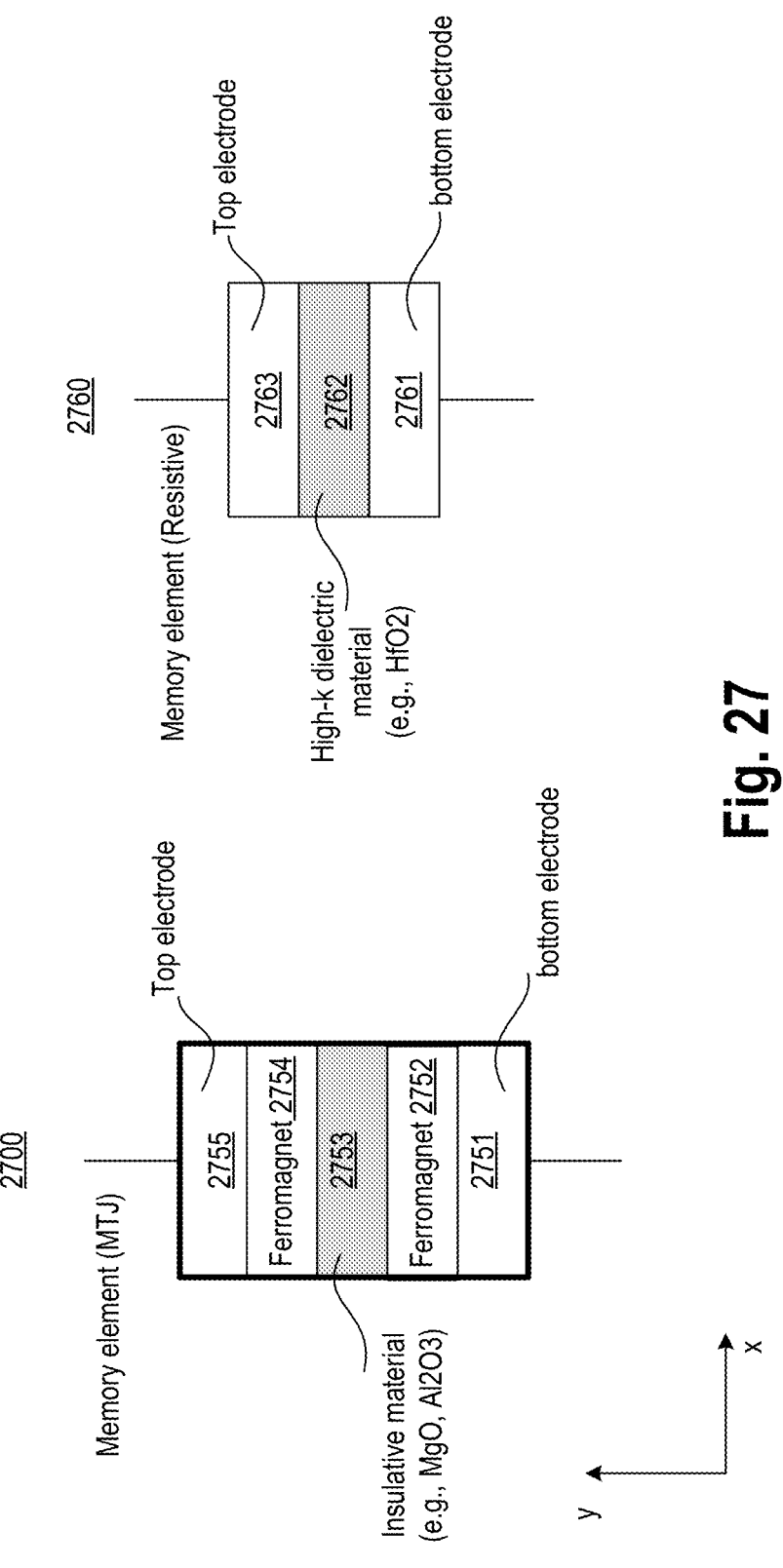
FIG. 27 illustrates memory elements (MEs) for use in memory bit-cells, in accordance with at least one embodiment.

FIG. 27 illustrates memory elements (MEs) 2700 and 2760 for use in memory bit-cells, in accordance with at least one embodiment. In at least one embodiment, planar memory element structures are resistive elements. In at least one embodiment, planar memory element structures are magnetic tunnel junctions (MTJs). In at least one embodiment, planar memory element structures are phase change memory (PCM) memories. In at least one embodiment, capacitors discussed herein can be replaced with an ME and thus various memory configurations discussed herein can be realized.

In at least one embodiment, MTJ 2700 comprises a bottom electrode 2751, free ferromagnetic layer 2752, insulative material 2753, fixed ferromagnetic layer 2754, and top electrode 2755. In at least one embodiment, free ferromagnetic layer 2752 comprises one or more of CrO2, Heusler alloys, Fe, or CoFeB. In at least one embodiment, insulative material 2753 (also referred to as tunnel barrier) includes one of: MgO, $Al_xO_x$ (where 'x' and y' is a number or fraction such as 2 and 3, respectively), or $SrTiO_3$. In at least one embodiment, fixed ferromagnetic layer 2754 includes one of $CrO_2$, Heusler alloys, FeCo(001), CoFeB. In at least one embodiment, an anti-ferromagnetic layer (not shown) is formed over fixed ferromagnetic layer 2754. In at least one embodiment, anti-ferromagnetic (AFM) layer comprises Ru or Ir. In at least one embodiment, AFM layer comprises a super lattice of Co and Pt coupled with Ru or Ir. In at least one embodiment, bottom electrode 2751 and top electrode 2755 includes one or more of: Al, Ti, Cu, Ag, Pt, TiN, TaN, Al doped ZnO, Ga-doped ZnO, or Indium tin oxide (ITO). In at least one embodiment, bottom electrode 2751 and top electrode 2755 are symmetric. In at least one embodiment, bottom electrode 2751 and top electrode 2755 are asymmetric. In at least one embodiment, bottom electrode 2751 and top electrode 2755 may have same materials as those discussed with reference to electrodes in FIG. 4B.

In at least one embodiment, resistive memory 2760 (ReRAM) comprises bottom electrode 2761, insulative material 2762, and top electrode 2763. In at least one embodiment, insulative material 2762 includes: $HfO_x$, $TiO_x$, $TaO_x$, NiO, $ZnO_x$, $Zn_2TiO_4$, $KnO_x$, MgO, $AlO_x$, $ZrO_x$, $Cu_xO_y$, $SnO_z$, $GeO_x$, $LaO_x$, $YO_x$, $MoO_x$, or $CoO_x$ (where 'x' and 'y' are a number or a fraction). In at least one embodiment, insulative material 2762 for ReRAM includes oxides of: Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In at least one embodiment, bottom electrode 2761 and top electrode 2763 includes one or more of: Al, Ti, Cu, Ag, Pt, TiN, TaN, Al doped ZnO, Ga-doped ZnO, or indium tin oxide (ITO). In at least one embodiment, bottom electrode 2761 and top electrode 2763 are symmetric. In at least one embodiment, bottom electrode 2761 and top electrode 2763 are asymmetric. In at least one embodiment, bottom electrode 2761 and top electrode 2763 may have same materials as those discussed with reference to electrodes in FIG. 4B.

In at least one embodiment, in ReRAM systems that use forming of filaments, an initial operation may begin by applying a voltage pulse with an increasing magnitude, between top electrode 2763 and bottom electrode 2761. In at least one embodiment, magnitude of voltage pulse may be substantially greater than a voltage level utilized to cycle ReRAM device during regular course of programming. In at least one embodiment, a high voltage pulse may be utilized to perform an intentional one-time breakdown process, known as forming. In at least one embodiment, forming process creates one or more conductive filaments that provide pathways for electron transport during device operation.

In at least one embodiment, resistive memory 2760 is a phase-change memory (PC-RAM). In at least one embodiment, resistive memory 2760 comprises bottom electrode 2761, insulative material 2762, and top electrode 2763. In at least one embodiment, insulative material 2762 is a phase-change material. In at least one embodiment, phase-change material comprises phase-change chalcogenides. In at least one embodiment, phase-change material includes one of: $(GeTe)m(Sb_2Te_3)n$, $Ge_2Sb_2Te_5$, $Ge_2Sb_2Te_4$, AgInSbTe, super lattices of GeTe, $Sb_2Te_3$, super lattices of $TiTe_2$ and $Sb_2Te_3$, $WSe_2$, $WS_2$, or $PtSe_2$ (where m and n are numbers or fractions). In at least one embodiment, phase-change material includes binary transition metal oxides such as NiO or $TiO_2$, perovskites such as $Sr(Zr)TiO_3$ or PCMO, solid-state electrolytes such as GeS, GeSe, $SiO_x$, or $Cu_2S$, organic materials such as AlDCN, or layered materials, such as hexagonal boron nitride.

In at least one embodiment, when ME structures are not capacitors (as those described with reference to at least one embodiment herein), current based pulsing scheme(s) are used to drive (e.g., write) and for sensing (e.g., read). In at least one embodiment, plate-lines flow current to configure or read ME structures. In at least one embodiment, ME structures may be a mix of various types of ME structures (e.g., ferroelectric based capacitors, paraelectric based capacitors, MTJ, ReRAM, or PC-RAM). In at least one embodiment, all ME structures for an array are of the same type.

Figure 28:
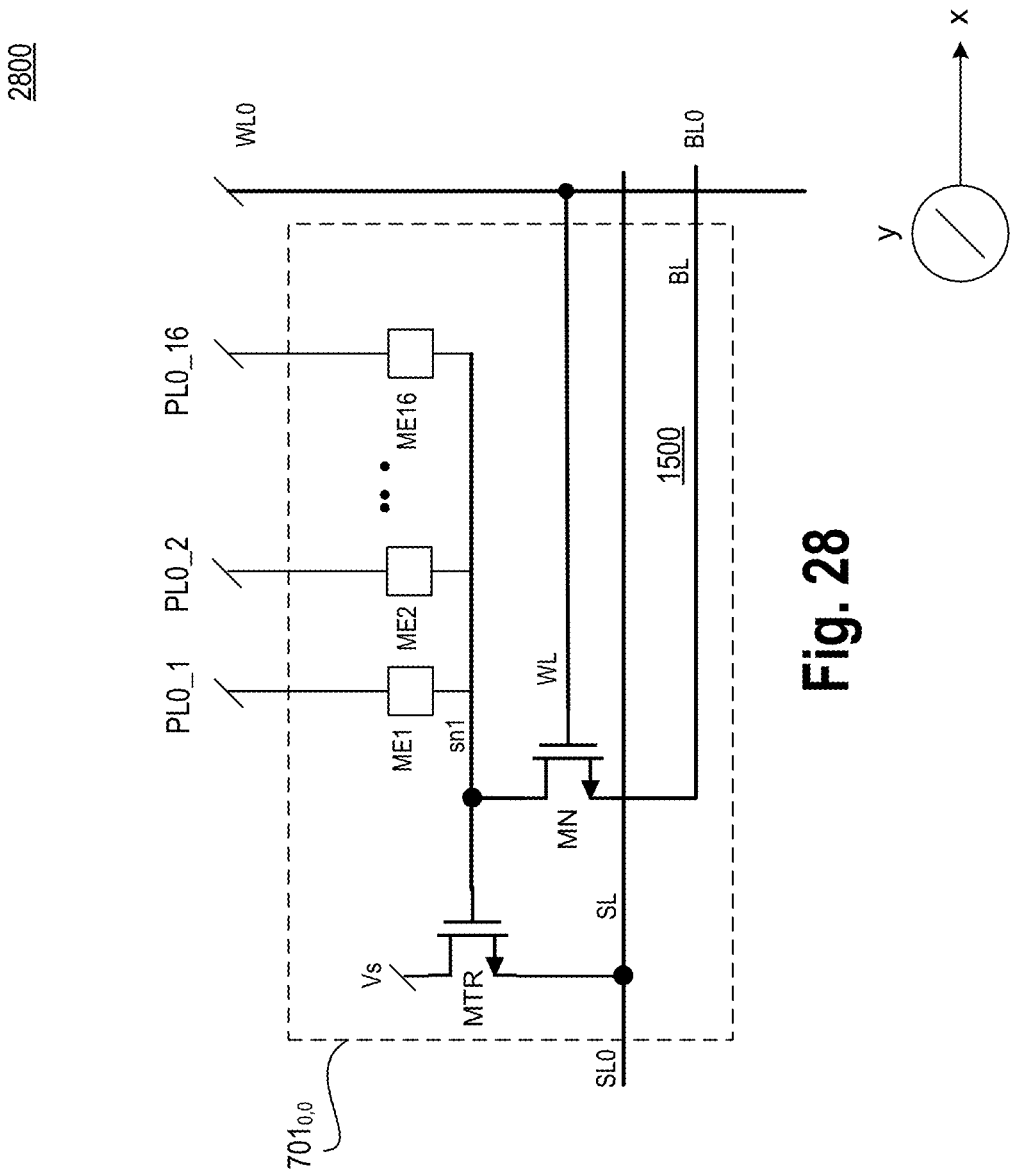
FIG. 28 illustrates a multi-element gain bit-cell with plate-lines parallel to the word-line, in accordance with at least one embodiment.

FIG. 28 illustrates multi-element gain bit-cell 2800 with plate-lines parallel to the word-line, in accordance with at least one embodiment. Multi-element gain bit-cell 2800 is same as multi-element FE gain bit-cell described herein, but with 16 memory elements and 16 associated plate-lines. In this case, plate-lines are parallel to bit-line.

Figure 29:
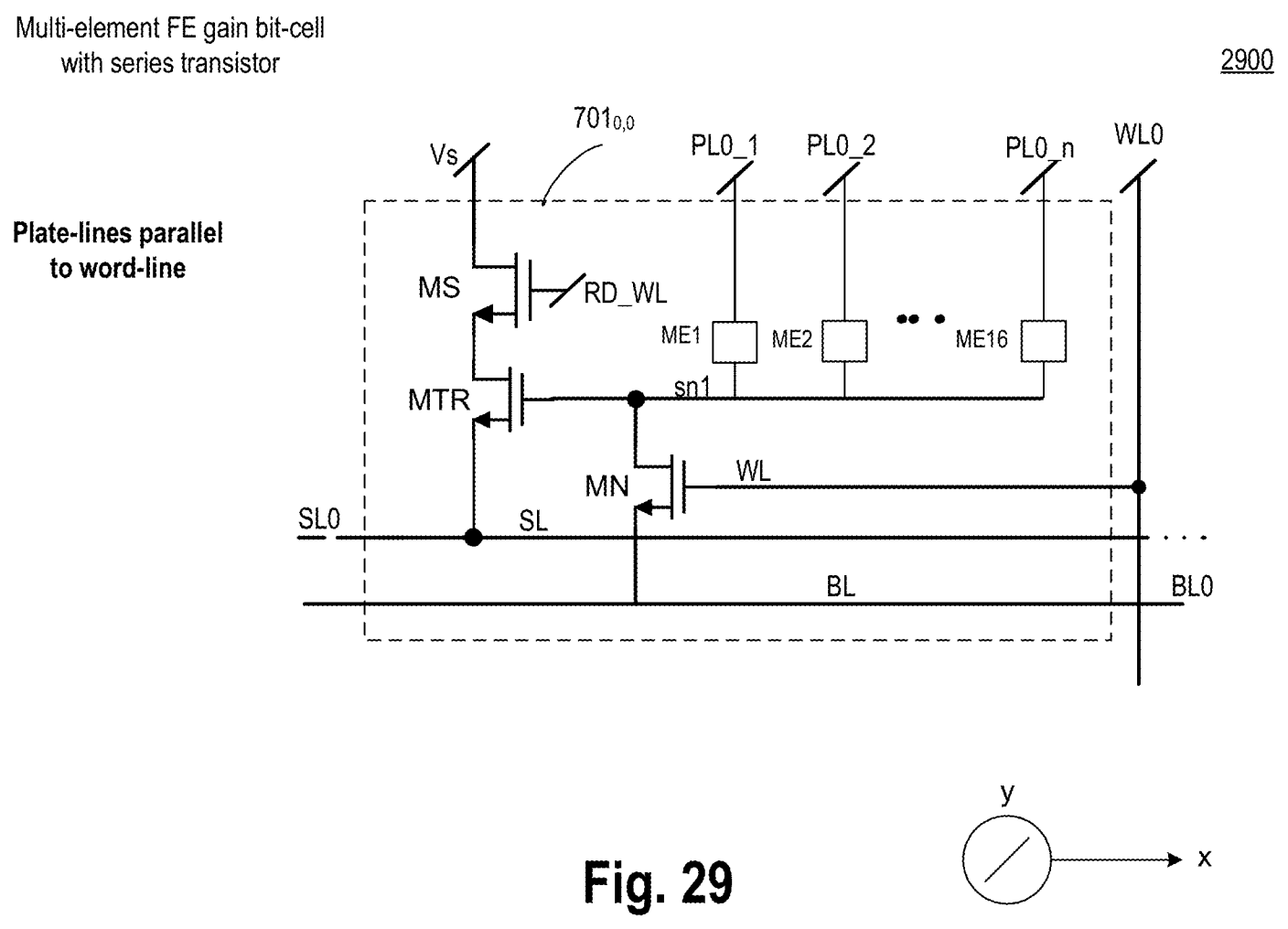

FIG. 29 illustrates multi-element gain bit-cell 2900 with plate-lines parallel to the word-line, where gain transistor is coupled to a sense-line which is in series with a transistor, in accordance with at least one embodiment. FIG. 29 is described with reference to FIG. 28. In at least one embodiment, leakage on SL is reduced per bit-cell by coupling a series transistor MS with gain transistor MTR. In at least one embodiment, series transistor MS is controlled by a word-line (WL). In at least one embodiment, series transistor MS is controlled by a read word-line (RD_WL). In at least one embodiment, gate terminal of series transistor MS is controlled by RD_WL. In at least one embodiment, RD_WL is parallel to plate-lines PL0_1 through PL0_n and BL. In at least one embodiment, source terminal of series transistor MS is connected to or coupled to sense-line (SL) (e.g., SL0). In at least one embodiment, drain terminal of series transistor MS is coupled to reference Vs. In at least one embodiment, n-type transistors can be replaced with p-type transistors and polarity of control signals (e.g., RW_WL and WL) can be modified for correction operation of memory bit0cell. In at least one embodiment, a mix of p-type and n-type transistors may be used for transistors of bit-cell 900. In at least one embodiment, size of series transistor is smaller than size of gain transistor MTR. In at least one embodiment, during read phase series transistor MS is turned on during a read phase to reduce leakage on SL.

Figure 30:
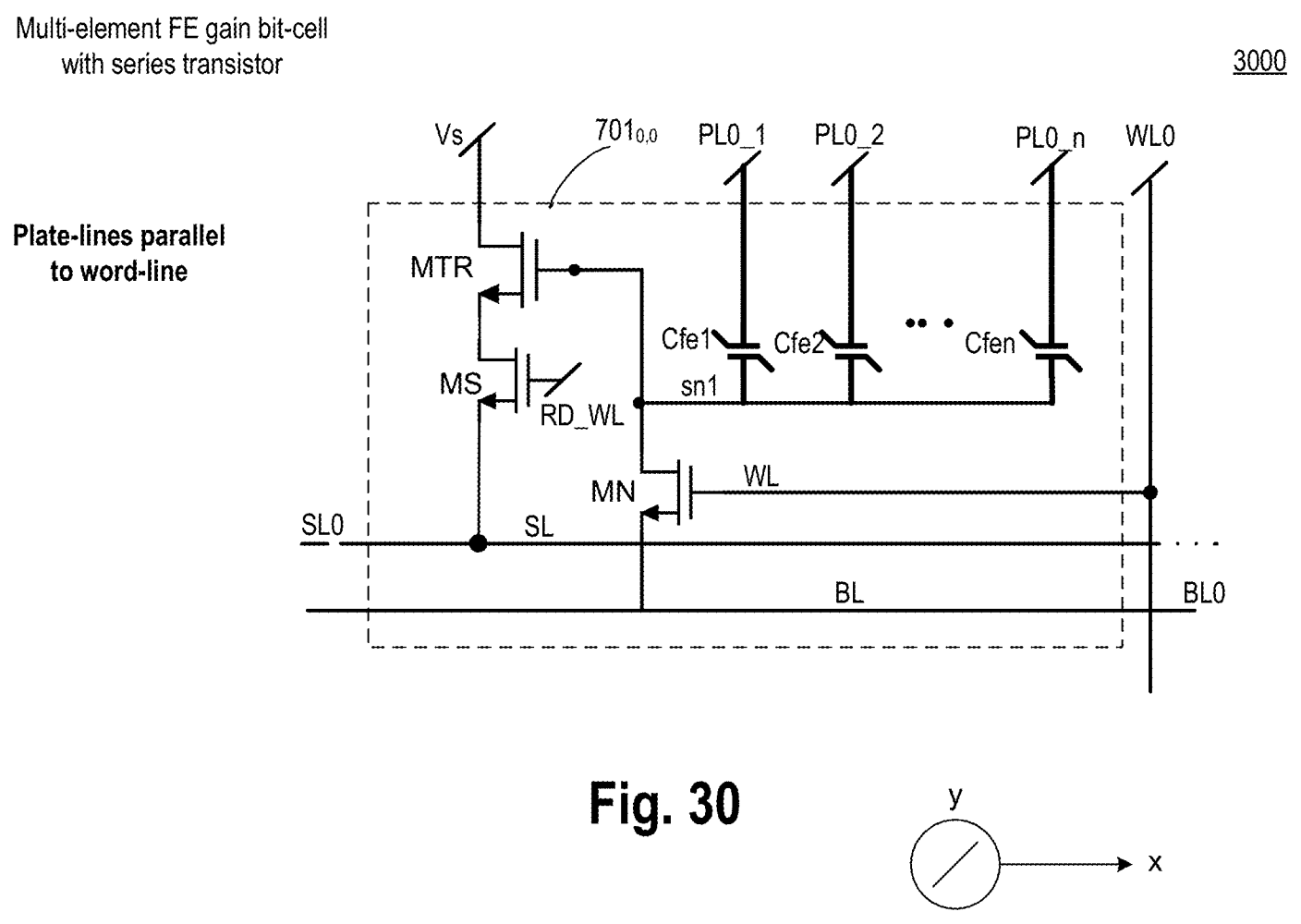

FIG. 30 illustrates multi-element gain bit-cell 3000 with plate-lines parallel to the word-line, where gain transistor is in series with a transistor which is coupled to a sense-line, in accordance with at least one embodiment. FIG. 30 is described with reference to FIG. 29. In at least one embodiment, source terminal of series transistor MS is connected to or coupled to SL instead of gain transistor MTR. In at least one embodiment, drain terminal of series transistor MS is connected to source terminal of gain transistor MTR. In at least one embodiment, gate terminal of gain transistor is connected to storage node sn1. In at least one embodiment, drain terminal of gain transistor is connected to reference Vs. In at least one embodiment, series transistor MS when connected to SL instead of reference Vs reduces turn-on resistance (R-on) induced variation related issues. In at least one embodiment, series transistor MS when connected to SL instead of reference Vs lowers parasitic capacitance and resistance on SL compared to configuration of FIG. 9 because larger gain transistor MTR is not seen by SL and because series transistor MS is much smaller in size the gain transistor MTR.

Figure 31:
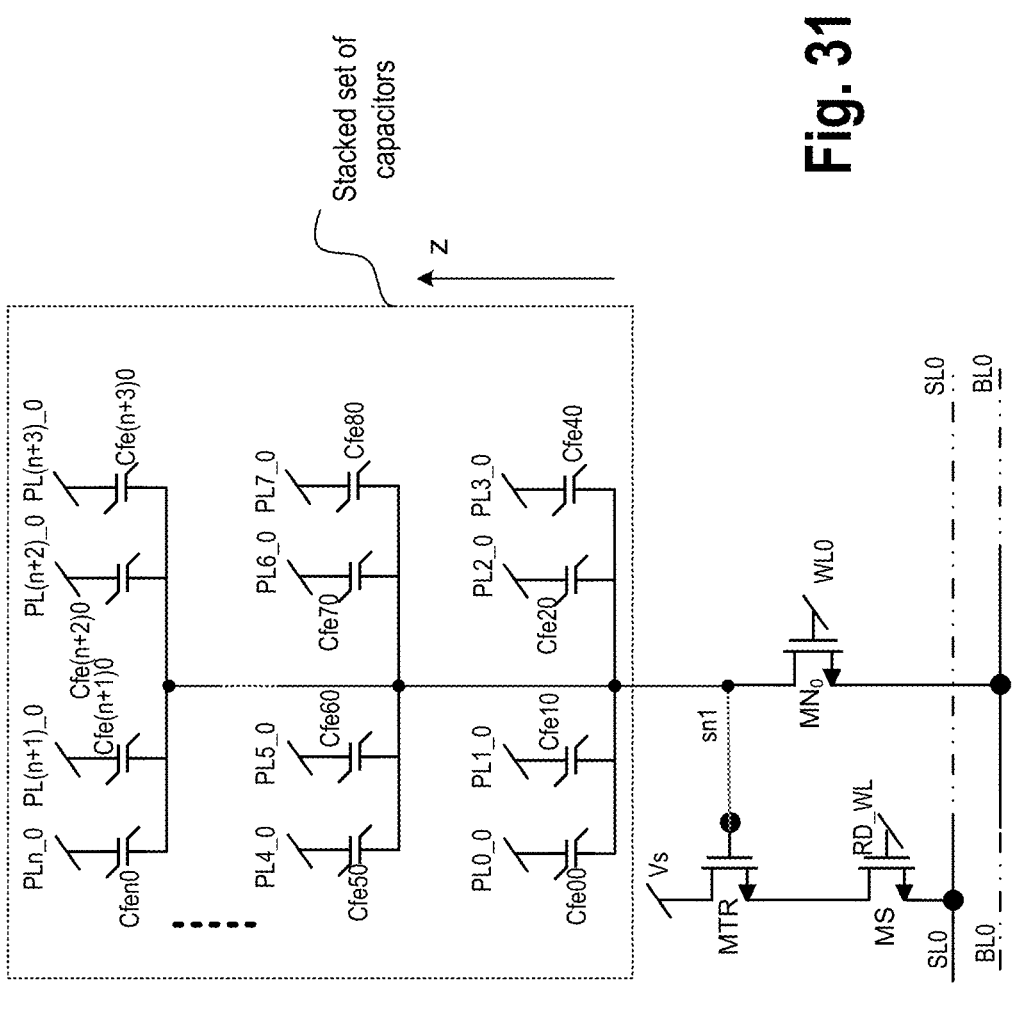
FIG. 31 illustrates a multi-element gain bit-cell with stacked sets of capacitors that share a gain transistor, where gain transistor is in series with a transistor which is coupled to a sense-line, in at least one embodiment.
Figure 31:
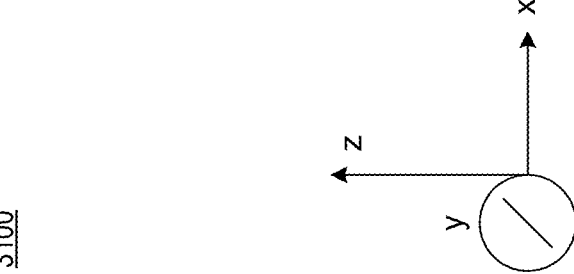

FIG. 31 illustrates multi-element gain bit-cell 3100 with stacked sets of capacitors that share a gain transistor, where gain transistor is in series with a transistor which is coupled to a sense-line, in at least one embodiment. In at least one embodiment, shared circuitry comprises gain transistor MTR, series transistor MS, and access transistor MN (e.g., MN$_0$), where storage node sn1 is shared by a plurality of sets of capacitors. In at least one embodiment, each set of capacitors is on a different z-level along a z-axis. In at least one embodiment, number of capacitors per layer in a z-plane is selected to cover x-y area of transistors of shared circuitry. In at least one embodiment, series transistor is removed, and gain transistor MTR is directly connected to select line SL (e.g., SL0). In at least one embodiment, capacitors in each stack are also folded as discussed herein. In at least one embodiment, capacitors are vertically stacked in a z-direction.

Figure 32:
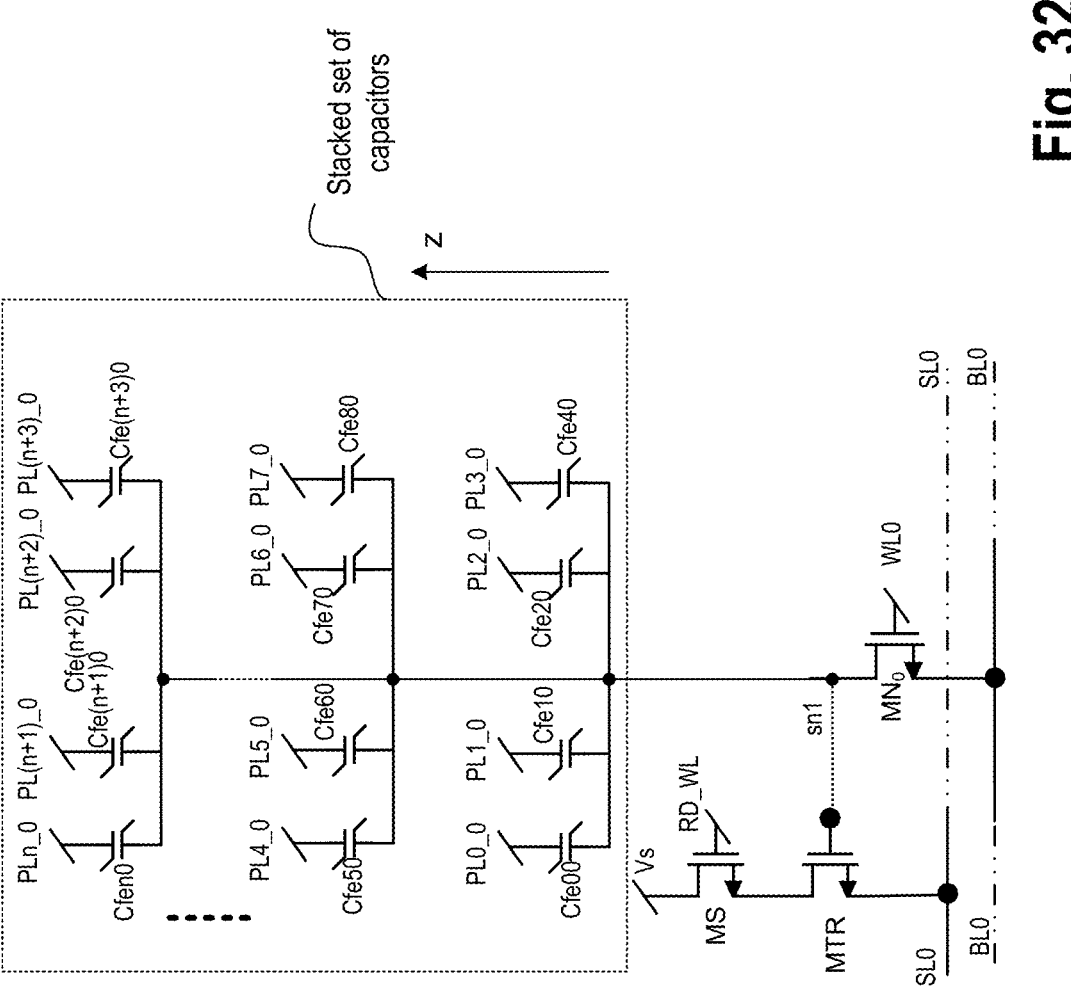
FIG. 32 illustrates a multi-element gain bit-cell with stacked sets of capacitors that share a gain transistor, where gain transistor is coupled to a sense-line and is in series with a transistor, in at least one embodiment.
Figure 32:
Figure 32:
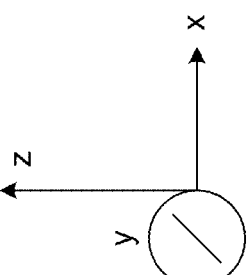

FIG. 32 illustrates multi-element gain bit-cell 3200 with stacked sets of capacitors that share a gain transistor, where gain transistor is coupled to a sense-line and is in series with a transistor, in at least one embodiment. Multi-element gain bit-cell 3200 is like multi-element gain bit-cell 3100 but with different configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference Vs is directly connected to gain transistor MTR.

Figure 33:
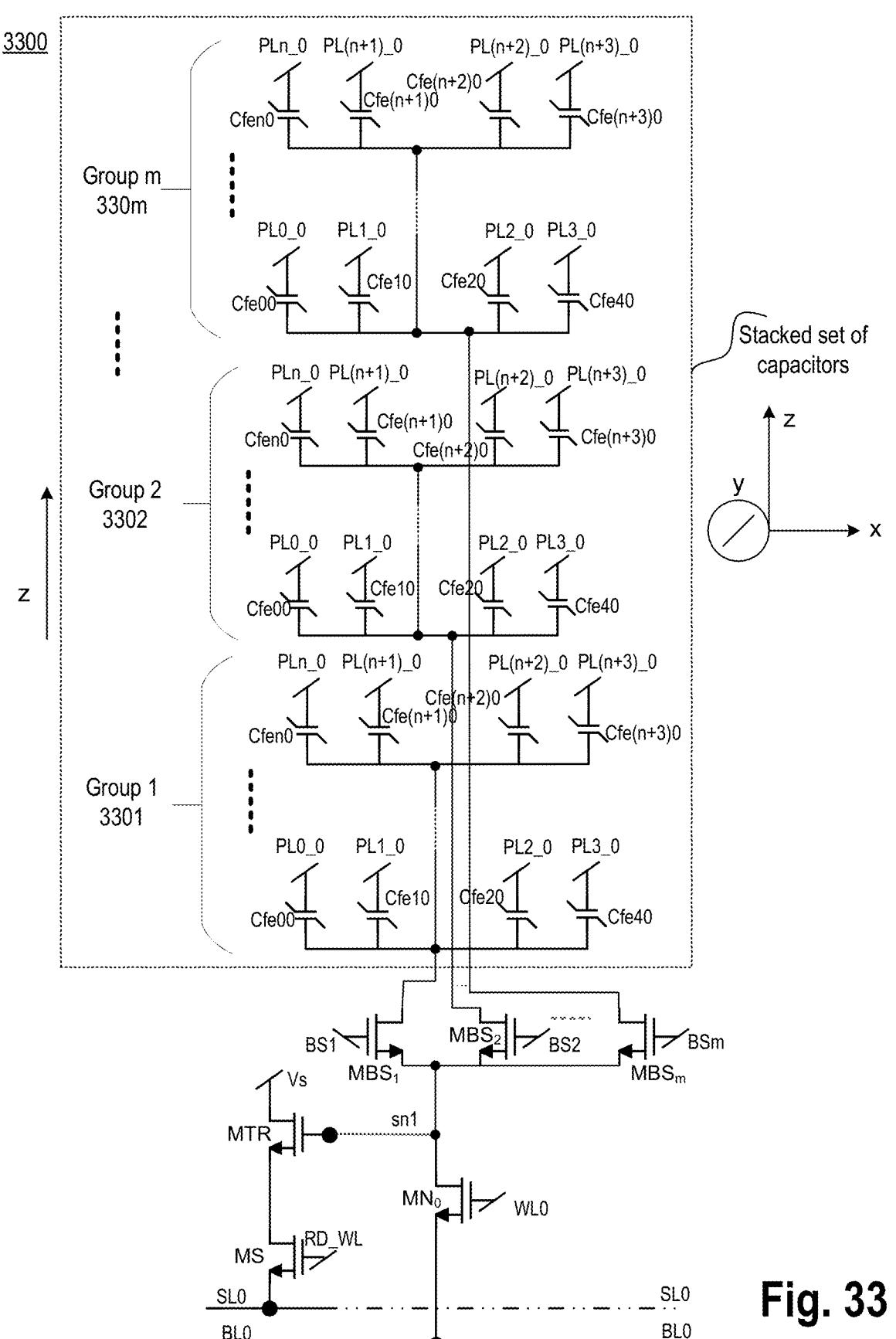
FIG. 33 illustrates a multi-element gain bit-cell with multiple stacked sets of capacitors that are multiplexed to a shared gain transistor, where gain transistor is in series with a transistor which is coupled to a sense-line, in at least one embodiment.

FIG. 33 illustrates multi-element gain bit-cell 3300 with multiple stacked sets of capacitors that are multiplexed to a shared gain transistor, where gain transistor is in series with a transistor which is coupled to a sense-line, in at least one embodiment. In at least one embodiment, multiple groups of sets of capacitors (e.g., group 1 3301 and group 2 3302) are coupled to storage node sn1 via corresponding select transistors MBS$_1$ and MBS$_2$, respectively. In at least one embodiment, select transistor MBS$_1$ is controlled by BS$_1$. In at least one embodiment, select transistor MBS$_2$ is controlled by BS$_2$. In at least embodiment, multi-element gain bit-cell 3300 lowers capacitive load on storage node sn1 by coupled capacitors via select transistors. In at least one embodiment, each group of sets of capacitors are sets of stacked capacitors like in FIG. 32. In at least one embodiment, series transistor MS is removed and gain transistor MTR is directly connected to select line (e.g., SL0). In at least one embodiment, plate-lines are shared between groups of sets of capacitors as shown. In at least one embodiment, multi-element gain bit-cell 3300 is a high-density memory bit-cell with high storage capacity because of number of capacitors that can be stacked and/or stacked and folded while lowering load on storage node sn1. In at least one embodiment, by lowering load on storage node sn1, read or sense margin is improved. In at least one embodiment, series transistor MS is removed, and sense-line (e.g., SL0) is directly connected to source or drain of gain transistor MTR.

Figure 34:
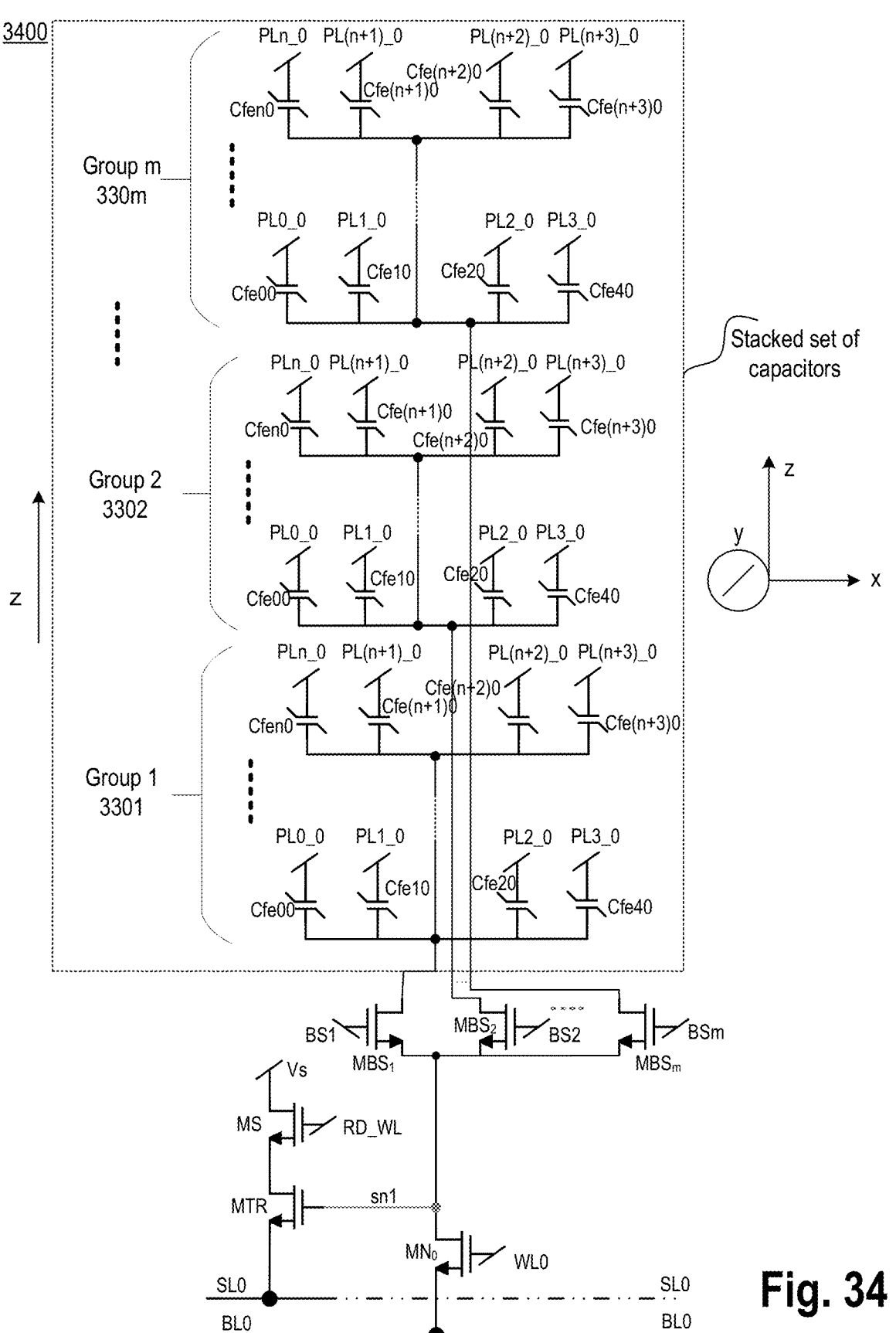
FIG. 34 illustrates a multi-element gain bit-cell with multiple stacked sets of capacitors that are multiplexed to a shared gain transistor, where gain transistor is coupled to sense-line and is in series with a transistor, in at least one embodiment.

FIG. 34 illustrates multi-element gain bit-cell 3400 with multiple stacked sets of capacitors that are multiplexed to a shared gain transistor, where gain transistor is coupled to sense-line and is in series with a transistor, in at least one embodiment. In at least one embodiment, multi-element gain bit-cell 3400 is similar to multi-element gain bit-cell 3300 but for different configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference Vs is directly connected to gain transistor MTR.

Figure 35A:
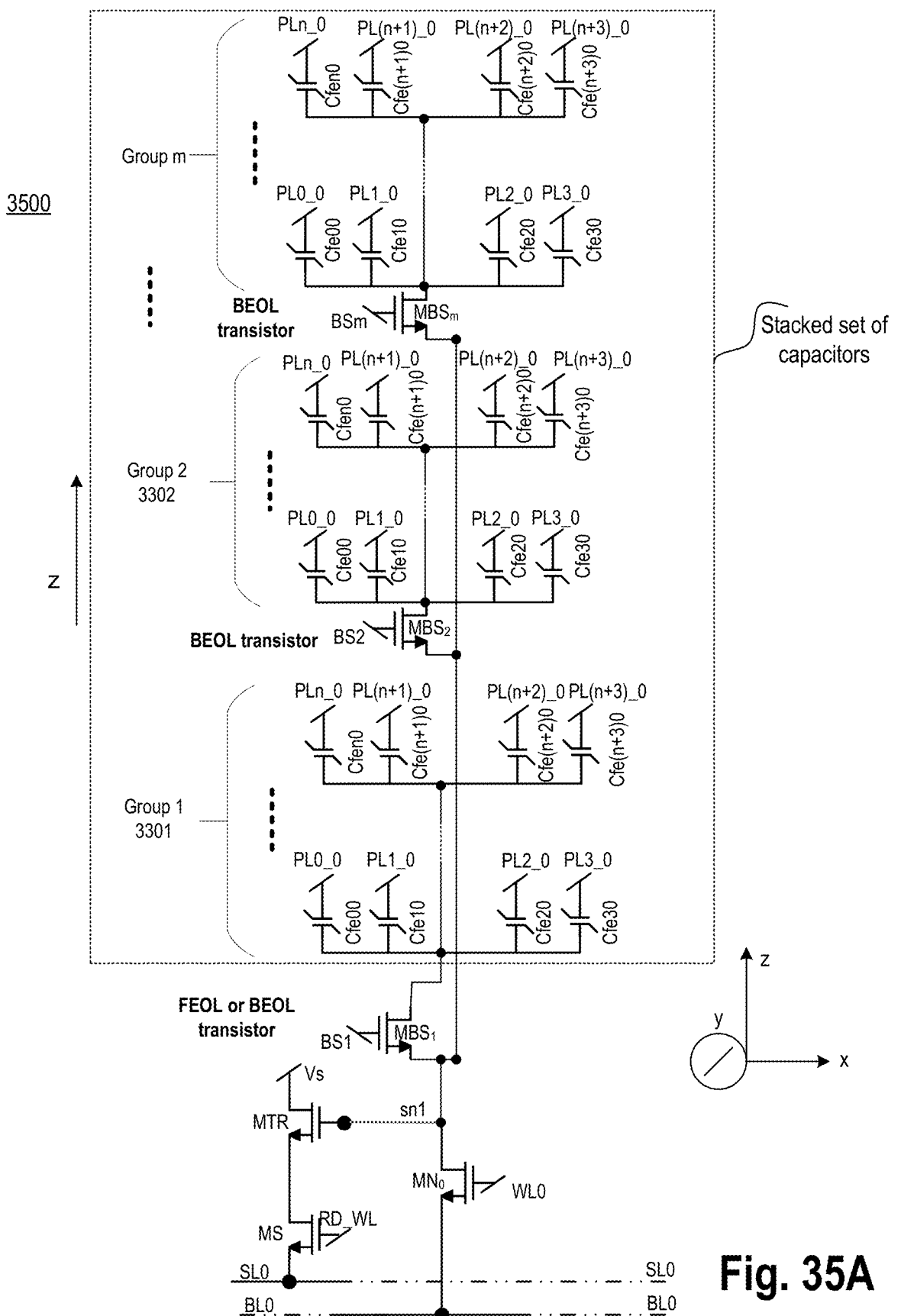
FIG. 35A illustrates a multi-element gain bit-cell with multiple stacked sets of capacitors that are multiplexed to a shared gain transistor using back-end-of-line (BEOL) transistors, where gain transistor is in series with a transistor which is coupled to sense-line, in at least one embodiment.

FIG. 35A illustrates multi-element gain bit-cell 3500 with multiple stacked sets of capacitors that are multiplexed to a shared gain transistor using back-end-of-line (BEOL) transistors, where gain transistor is in series with a transistor which is coupled to sense-line, in at least one embodiment. In at least one embodiment, select transistors MBS1 and MNS2 are back-end-of-line (BEOL) transistors or a combination of front-end-of-line (FEOL) and BEOL transistors. In at least one embodiment, using BEOL transistors reduces number of via stacks (e.g., reduced to 2 via stacks) for n group of capacitors. In at least one embodiment, any number of groups may be stacked up using two via stacks. In at least one embodiment, for each group of sets of capacitors, a select transistor is coupled to a via stack of node sn1 and also to its group of sets of capacitors. In at least one embodiment, select transistor MBS$_1$ controllable by BS$_1$ and selectively couples node sn1 to one or more sets of capacitors in Group 1 3301. In at least one embodiment, select transistor MBS$_1$ is a FEOL or BEOL transistor. In at least one embodiment, select transistor MBS$_2$ controllable by BS$_2$ and selectively couples node sn1 to one or more sets of capacitors in Group 2 3302. In at least one embodiment, select transistor MBS$_2$ is a BEOL transistor. In at least one embodiment, select transistor MBS$_m$ controllable by BS$_m$ and selectively couples node sn1 to one or more sets of capacitors in Group m. In at least one embodiment, select transistor MBS$_m$ is a BEOL transistor. In at least one embodiment, series transistor MS is removed, and sense-line (e.g., SL0) is directly connected to source or drain of gain transistor MTR.

Figure 35B:
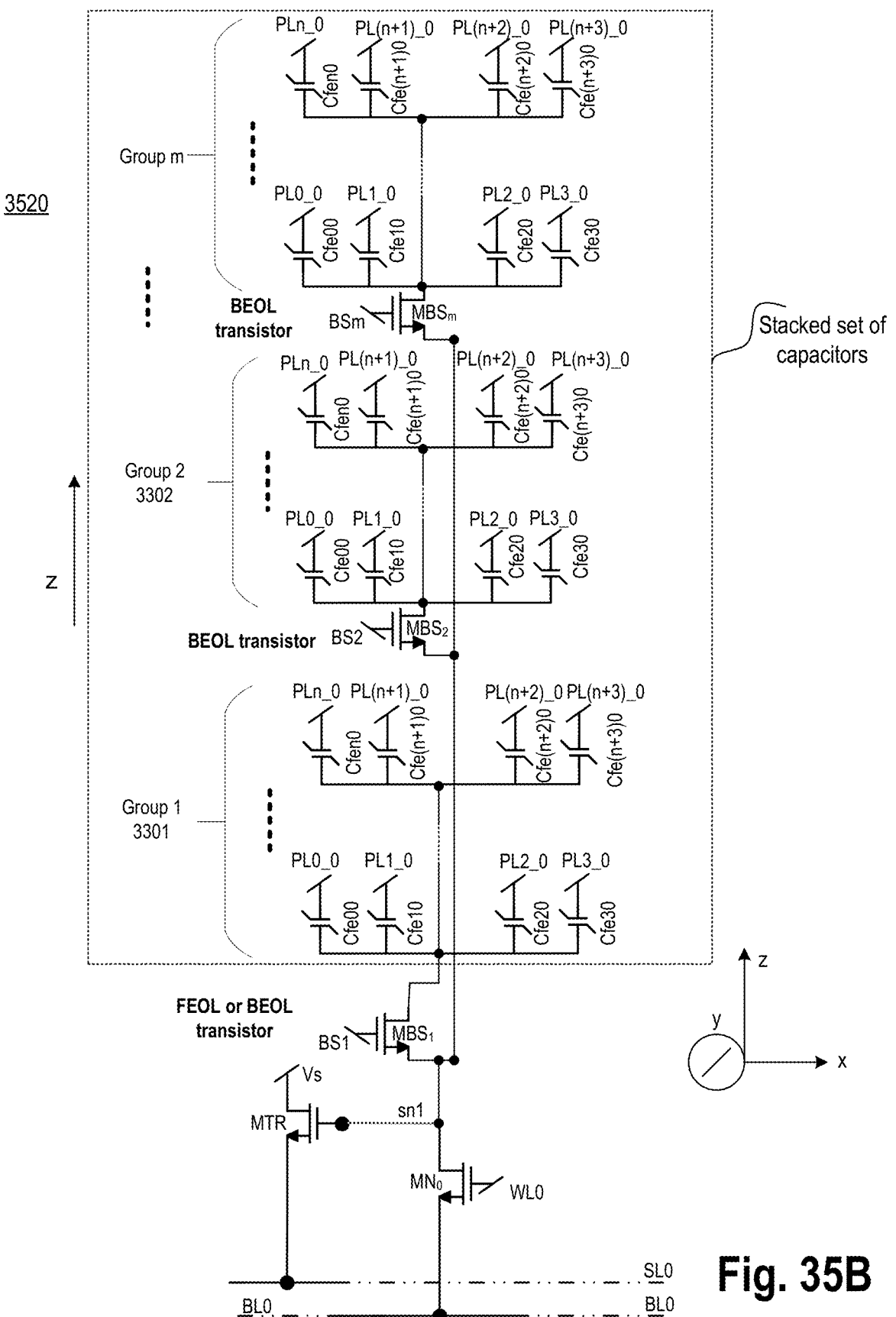
FIG. 35B illustrates multi-element gain bit-cell with multiple stacked sets of capacitors that are multiplexed to a shared gain transistor using back-end-of-line (BEOL) transistors, where gain transistor is directly coupled to sense-line, in at least one embodiment.

FIG. 35B illustrates multi-element gain bit-cell 3520 with multiple stacked sets of capacitors that are multiplexed to a shared gain transistor using back-end-of-line (BEOL) transistors, where gain transistor is directly coupled to sense-line, in at least one embodiment. Compared to FIG. 35A, here gain transistor MTR is directly connected to sense-line (e.g., SL0) since series transistor MS is removed.

Figure 36:
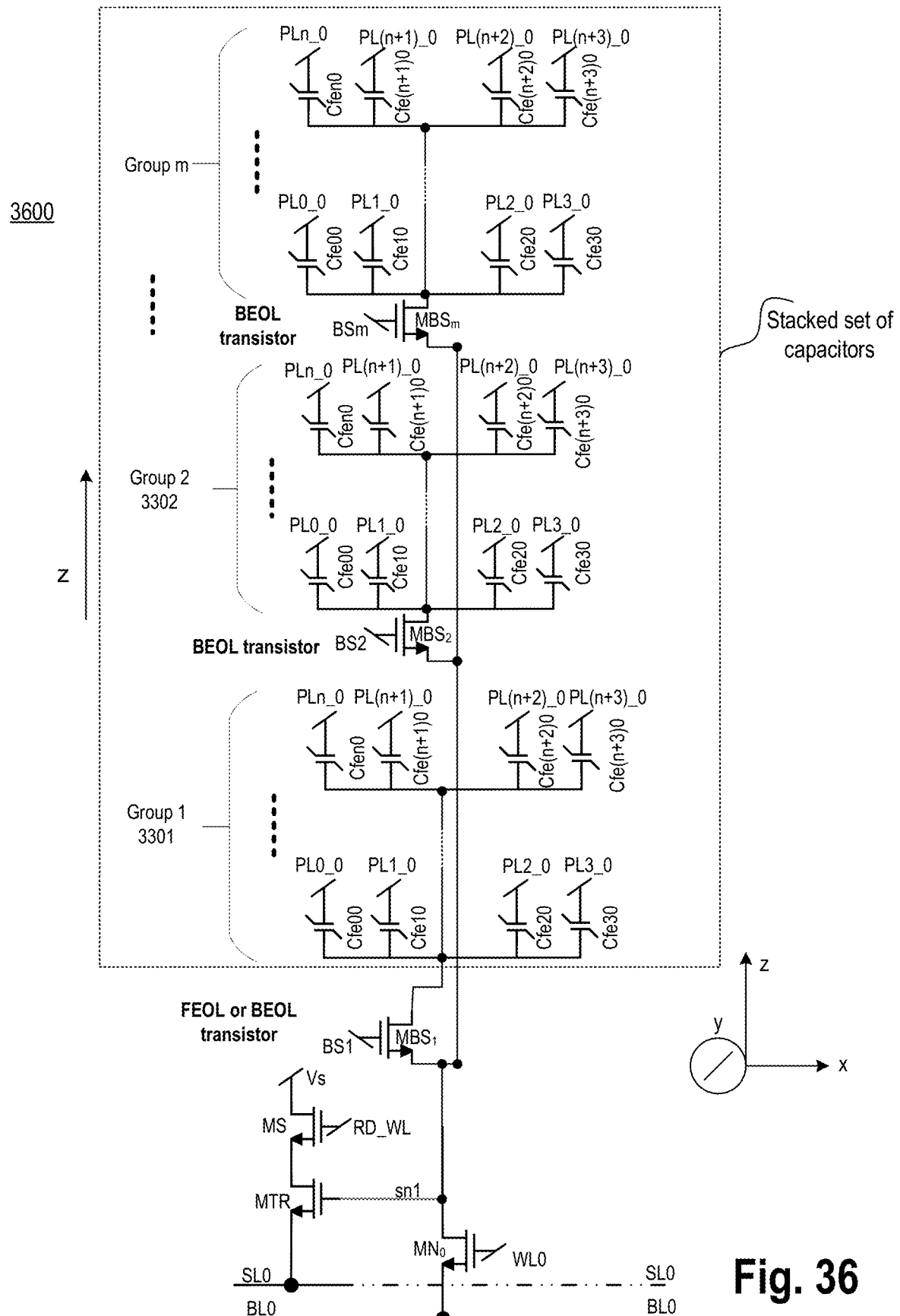
FIG. 36 illustrates a multi-element gain bit-cell with multiple stacked sets of capacitors that are multiplexed to a shared gain transistor using back-end-of-line (BEOL) transistors, where gain transistor is coupled to sense-line and is in series with a transistor, in at least one embodiment.

FIG. 36 illustrates multi-element gain bit-cell 3600 with multiple stacked sets of capacitors that are multiplexed to a shared gain transistor using back-end-of-line (BEOL) transistors, where gain transistor is coupled to sense-line and is in series with a transistor, in at least one embodiment. In at least one embodiment, multi-element gain bit-cell 3600 is similar to multi-element gain bit-cell 3500 but for different configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference Vs is directly connected to gain transistor MTR. In at least one embodiment, series transistor MS is removed, and reference bias or reference voltage Vs is directly connected to source or drain of gain transistor MTR.

Figure 37:
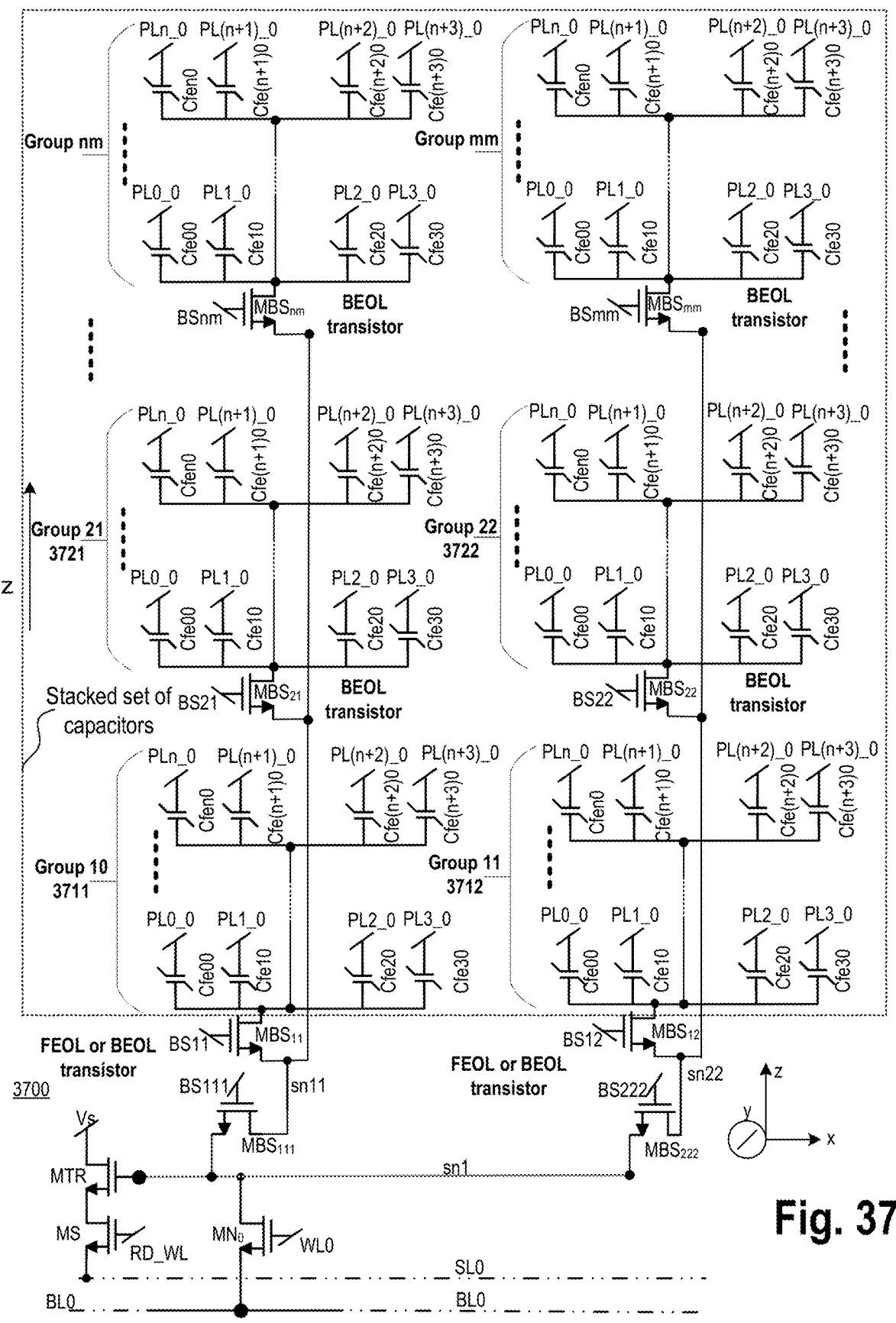
FIG. 37 illustrates an apparatus comprising multiple sets of stacked capacitors that are selected using BEOL transistors that are coupled to a shared gain transistor with shared bit-line and word-line, where gain transistor is in series with a transistor coupled to sense-line, in at least one embodiment.

FIG. 37 illustrates apparatus 3700 comprising multiple sets of stacked capacitors that are selected using BEOL transistors that are coupled to a shared gain transistor with shared bit-line and word-line, where gain transistor is in series with a transistor coupled to sense-line, in at least one embodiment. In at least one embodiment, any number of groups of sets of capacitors can be coupled to storage node sn1 via select transistors or multiplexers. In at least one embodiment, Group 10 3711, Group 21 3721, ... and Group nm are coupled to storage node sn1 via select transistor $MBS_{11}$ (controllable by BS11), select transistor $MBS_{21}$ (controllable by BS21), ... select transistor $MBS_{nm}$ (controllable by BSnm), respectively, where 'n' and 'm' are numbers. In at least one embodiment, select transistor $MBS_{11}$ is coupled to node sn11 which is coupled to node sn1 via select transistor $MBS_{111}$ which is controllable by BS111. In at least one embodiment, select transistor $MBS_{21}$ is coupled to node sn11 which is coupled to node sn1 via select transistor $MBS_{111}$ which is controllable by BS111. In at least one embodiment, select transistor $MBS_{nm}$ is coupled to node sn11 which is coupled to node sn1 via select transistor $MBS_{111}$ which is controllable by BS111. In at least one embodiment, select transistor $MBS_{11}$, select transistor $MBS_{21}$, ... select transistor $MBS_{nm}$ are BEOL transistors. In at least one embodiment, select transistor $MBS_{111}$ is a FEOL transistor. In at least one embodiment, select transistor $MBS_{111}$ is a BEOL transistor.

In at least one embodiment, Group 11 3712, Group 22 3722, ... and Group mm are coupled to storage node sn1 via select transistor $MBS_{12}$ (controllable by BS12), select transistor $MBS_{22}$ (controllable by BS22), and select transistor $MBS_{mm}$ (controllable by BSmm), respectively. In at least one embodiment, select transistor $MBS_{12}$ is coupled to node sn22 which is coupled to node sn1 via select transistor $MBS_{222}$ which is controllable by BS222. In at least one embodiment, select transistor $MBS_{22}$ is coupled to node sn22 which is coupled to node sn1 via select transistor $MBS_{222}$ which is controllable by BS222. In at least one embodiment, select transistor $MBS_{mm}$ is coupled to node sn22 which is coupled to node sn1 via select transistor $MBS_{222}$ which is controllable by BS222. In at least one embodiment, select transistor $MBS_{12}$, select transistor $MBS_{22}$, ... select transistor $MBS_{mm}$ are BEOL transistors. In at least one embodiment, select transistor $MBS_{222}$ is a FEOL transistor. In at least one embodiment, select transistor $MBS_{222}$ is a BEOL transistor. In at least one embodiment, select transistor $MBS_1$ (controllable by BS11) and select transistor $MBS_{21}$ (controllable by BS21), select transistor $MBS_{12}$ (controllable by BS12), ... select transistor $MBS_{nm}$, select transistor $MBS_{22}$ (controllable by BS22), select transistor $MBS_{mm}$, select transistor $MBS_{111}$ and select transistor $MBS_{222}$ are BEOL transistors, FEOL transistors, or a combination of BEOL transistors, FEOL transistors.

In at least one embodiment, apparatus 3700 includes shared circuitry which includes gain transistor MTR and series transistor MS coupled as shown. In at least one embodiment, series transistor is directly coupled to sense-line (e.g., SL0). In at least one embodiment, series transistor MS is removed, and gain transistor is directly connected to sense-line. In at least one embodiment, word-line (e.g., WL0) is shared for all groups of sets of capacitors. In at least one embodiment, series transistor MS is removed, and sense-line (e.g., SL0) is directly connected to source or drain of gain transistor MTR.

Figure 38:
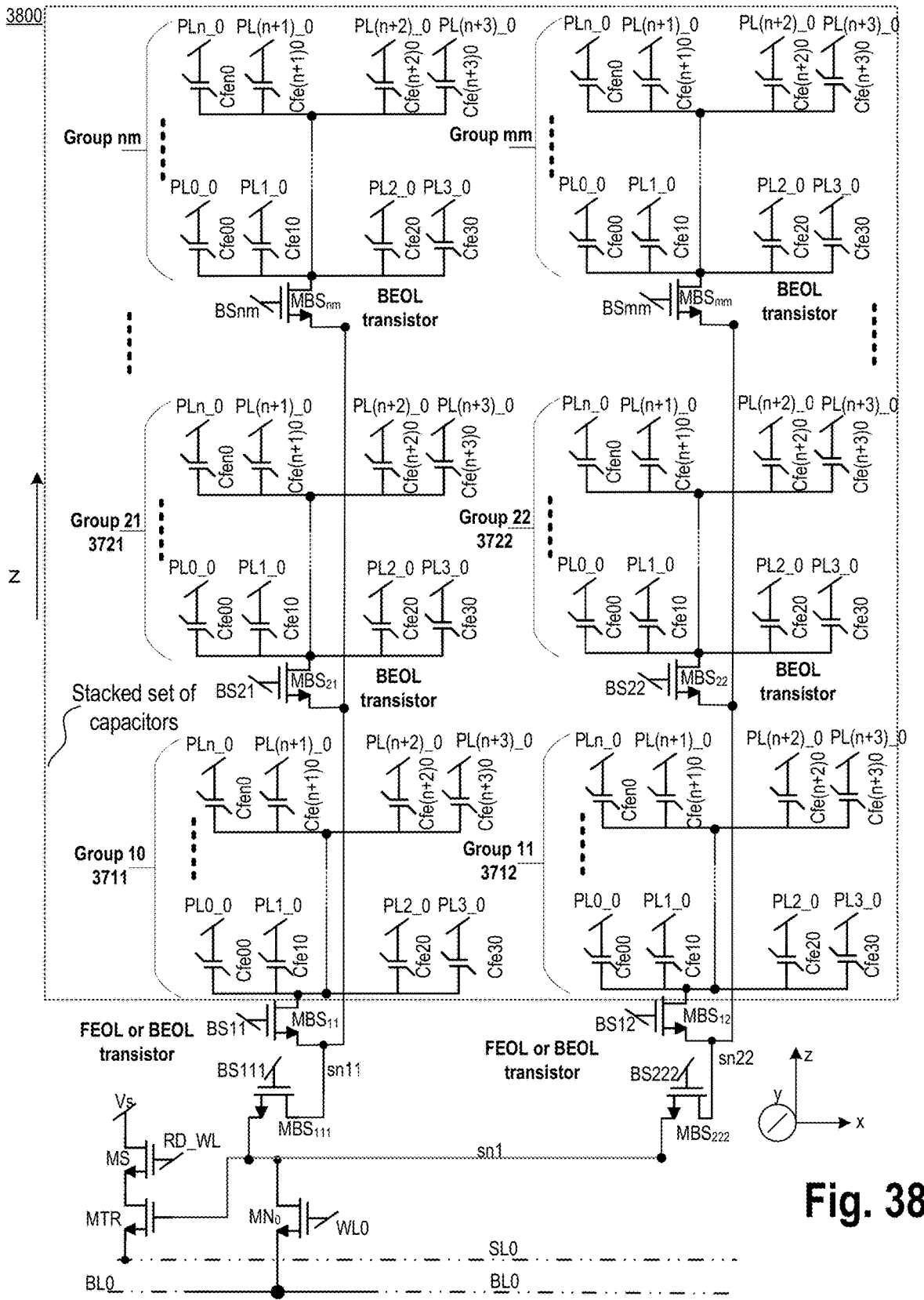
FIG. 38 illustrates an apparatus comprising multiple sets of stacked capacitors that are selected using BEOL transistors that are coupled to a shared gain transistor with shared bit-line and word-line, where gain transistor is coupled to sense-line and coupled in series with a transistor, in at least one embodiment.

FIG. 38 illustrates apparatus 3800 comprising multiple sets of stacked capacitors that are selected using BEOL transistors that are coupled to a shared gain transistor with shared bit-line and word-line, where gain transistor is coupled to sense-line and coupled in series with a transistor, in at least one embodiment. In at least one embodiment, apparatus 3800 is like apparatus 3700 but for different configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference Vs is directly connected to gain transistor MTR.

Figure 39:
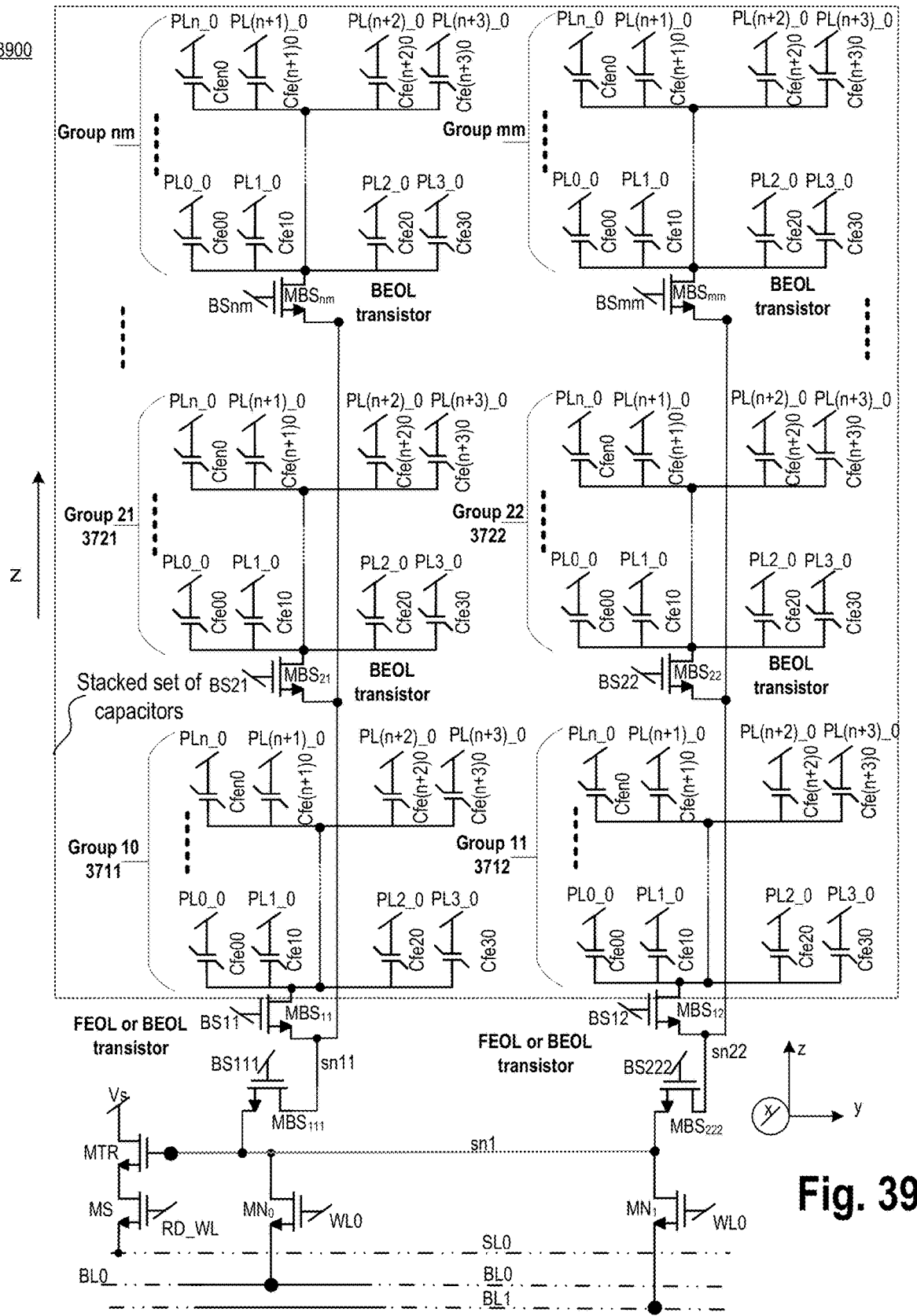
FIG. 39 illustrates an apparatus comprising multiple sets of stacked capacitors that are selected using BEOL transistors that are coupled to a shared gain transistor with different bit-lines and same word-line, where gain transistor is in series with a transistor coupled to sense-line, in at least one embodiment.

FIG. 39 illustrates apparatus 3900 comprising multiple sets of stacked capacitors that are selected using BEOL transistors that are coupled to a shared gain transistor with different bit-lines and same word-line, where gain transistor is in series with a transistor coupled to sense-line, in at least one embodiment. In at least one embodiment, apparatus 3900 is like apparatus 3700 but for having access transistor on different bit-lines. In at least one embodiment, access transistor $MN_0$ controlled by WL0 is coupled to first bit-line BL0, where access transistor $MN_0$ is coupled to storage node sn1. In at least one embodiment, access transistor $MN_1$ controlled by WL0 is coupled to second bit-line BL1, where access transistor $MN_1$ is coupled to storage node sn1. In at least one embodiment, plate-lines, Vs, word-lines, and control signals are along an x-direction (indicated by '/') while bit-lines BL0, BL1, and sense line SL0 are along a y-direction. In at least one embodiment, series transistor MS is removed, and sense-line (e.g., SL0) is directly connected to source or drain of gain transistor MTR.

Figure 40:
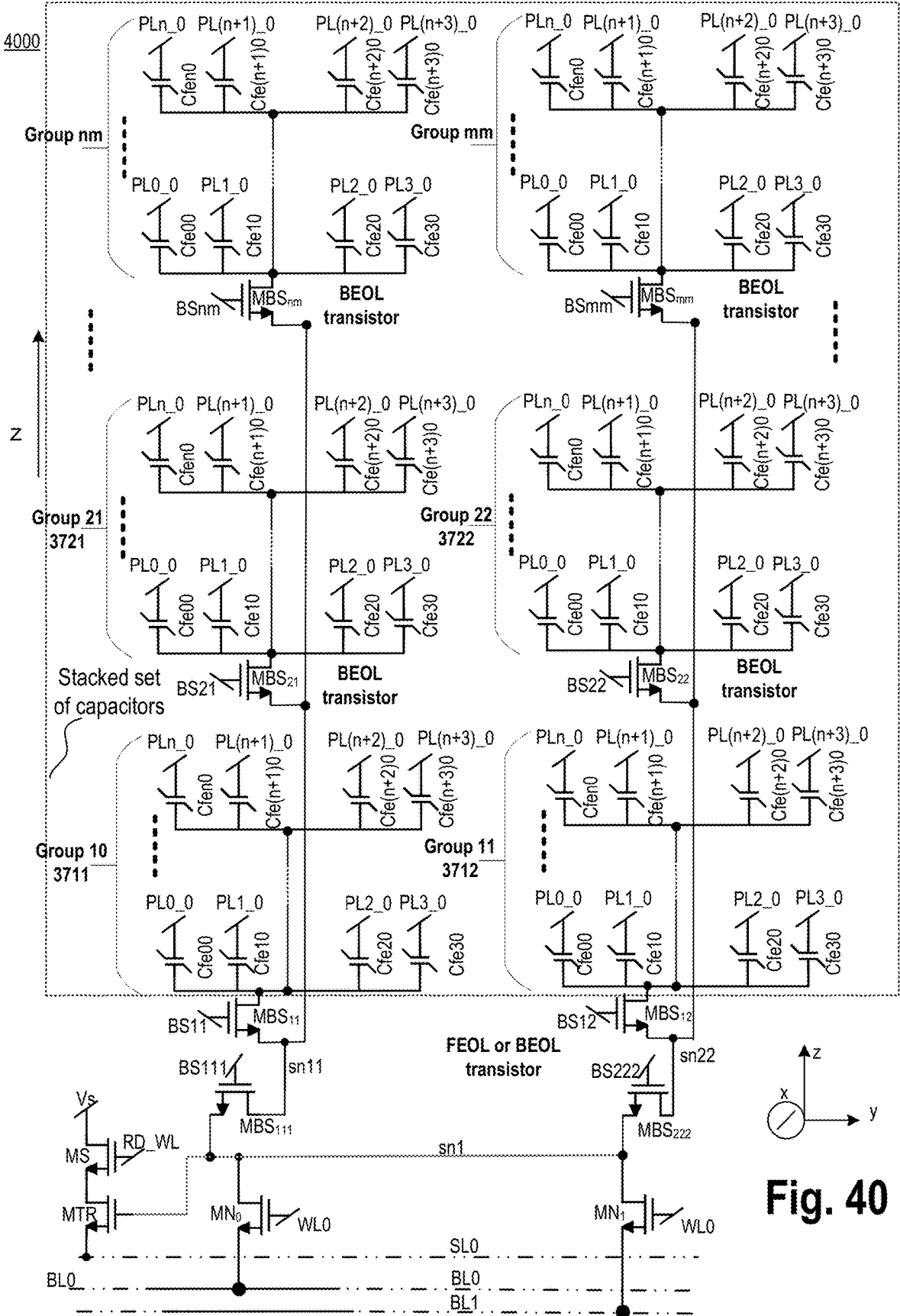
FIG. 40 illustrates an apparatus comprising multiple sets of stacked capacitors that are selected using BEOL transistors that are coupled to a shared gain transistor with different bit-lines and same word-line, where gain transistor is coupled to a sense-line and coupled in series with a transistor, in at least one embodiment.

FIG. 40 illustrates apparatus 4000 comprising multiple sets of stacked capacitors that are selected using BEOL transistors that are coupled to a shared gain transistor with different bit-lines and same word-line, where gain transistor is coupled to a sense-line and coupled in series with a transistor, in at least one embodiment. In at least one embodiment, apparatus 4000 is like apparatus 3900 but for different configuration of shared circuitry. In at least one embodiment, shared circuitry includes gain transistor MTR coupled to series transistor MS, which is controllable by read word-line RD_WL. In at least one embodiment, gain transistor MTR is directly connected to a sense-line SL (e.g., SL0) while series transistor is coupled to reference Vs. In at least one embodiment, gate terminal of gain transistor is coupled to storage node sn1. In at least one embodiment, series transistor MS is removed, and reference Vs is directly connected to gain transistor MTR.

Figure 41A:
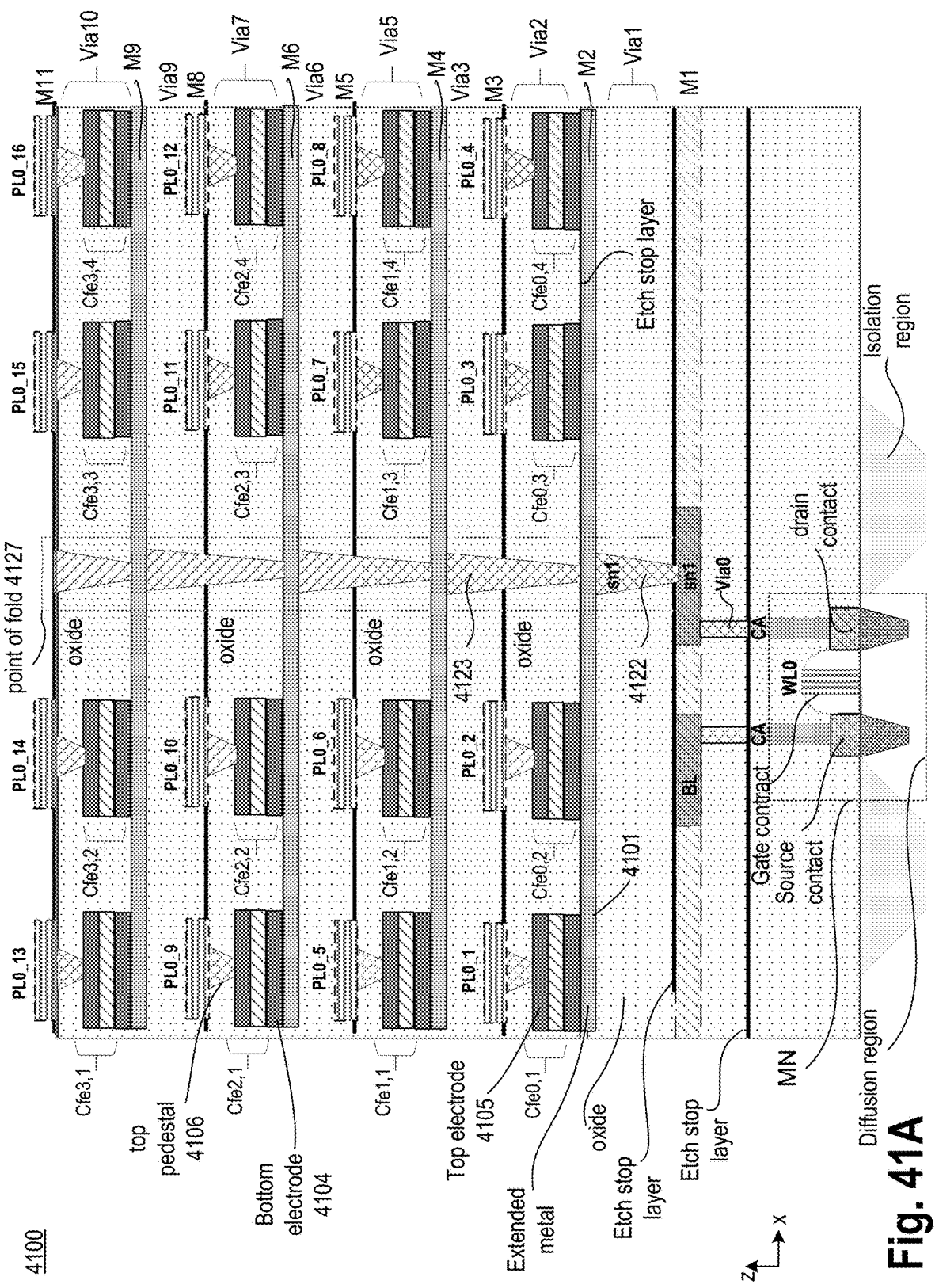
FIG. 41A illustrates a cross-section of a memory bit-cell with folded and stacked capacitors or memory elements with shared gain transistor, in accordance with at least one embodiment.

FIG. 41A illustrates a cross-section of memory bit-cell 4100 with folded and stacked capacitors or memory elements with shared gain transistor, in accordance with at least one embodiment. In at least one embodiment, memory bit-cell comprises transistors used for a multi-gate element bit-cell. In at least one embodiment, bit-cell may include series transistor coupled to a gain transistor as discussed herein or may include gain transistor directly coupled to sense-line without any series transistor coupled to gain transistor. In at least one embodiment, access transistor $MN_1$ is shown having a gate terminal controllable by WL0. In at least one embodiment, source and drain terminals or contacts of transistor are coupled to respective contacts (CA). In at least one embodiment, etch stop layer is used in fabrication of vias (via0) to connect one of source or drain contacts of transistor to storage node sn1 on metal-1 (M1) layer, and another one of source or drain contacts of transistor to BL on M1 layer. In at least one embodiment, another etch stop layer is formed over M1 layer to fabricate vias (via1) to couple to respective M1 layers.

In at least one embodiment, memory bit-cell 4100 has 16 capacitors. In at least one embodiment, any number of capacitors may be used for memory bit-cell 4100. In at least one embodiment, an individual capacitor has a bottom shared electrode 4101 which is coupled to storage node sn1 4122, and top electrode 4105 which is coupled to a respective plate-line. In at least one embodiment, instead of or in addition to shared bottom electrode 4101, an individual capacitor may include a bottom electrode 4104. In at least one embodiment, top electrode 4105 is coupled to plate-line via pedestal 4106. In at least one embodiment, in stack and fold configuration, N number of capacitors can be divided in L number of stack layers such that there are N/L capacitors in each cap layer. In at least one embodiment, 16 capacitors (Cfe0,1, Cfe0,2, Cfe0,3, Cfe0,4, Cfe1,1, Cfe1,2, Cfe1,3, Cfe1,4, Cfe2,1, Cfe2,2, Cfe2,3, Cfe2,4, Cfe3,1, Cfe3,2, Cfe3,3, and Cfe3,4) are divided in four numbers of stacked layers such that there are 16/4 capacitors in each stacked layer. In at least one embodiment, each capacitor has a first terminal coupled to a common node sn1 4122, and a second terminal coupled to a respective plate-line. In at least one embodiment, common node sn1 4122 thus becomes a point of fold 4127.

In at least one embodiment, planar capacitors are illustrated with three layers: top electrode, dielectric, and bottom electrode. In at least one embodiment, capacitor can include any of planar capacitor configurations discussed herein. In at least one embodiment, planar capacitors can be any one of capacitors of FIGS. 4A-B or memory elements described with reference to FIG. 27.

Referring to FIG. 41A, in at least one embodiment, capacitors are positioned symmetrically relative to point of fold 4127 and common node sn1. In at least one embodiment, equal number of capacitors are positioned on either sides of common node sn1 and in stack. In at least one embodiment, capacitors are not positioned symmetrically relative to point of fold. In at least one embodiment, there may be more capacitors on one side of storage node sn1 relative to another side. In at least one embodiment, each layer may also have a symmetric or non-symmetric arrangement of capacitors. In at least one embodiment, capacitors are spaced substantially at equilateral (horizontal x-plane) distance L1. In at least one embodiment, capacitors are separated by non-equilateral distance.

In at least one embodiment, in a stacked configuration, capacitors would be vertically stacked resulting in a tall memory cell. In at least one embodiment, depending on process technology node, number of capacitors may be limited by number of metal layers available by process technology node. In at least one embodiment, in stack and fold configuration, capacitors are vertically stacked as well as horizontally placed by sharing a common electrode, which in turn couples to a shared node (e.g., storage node sn1). In at least one embodiment, first terminals of capacitors are coupled to shared node sn1.

In at least one embodiment, in first row, second terminal of Cfe0,1 is coupled to plate-line PL0_1, second terminal of Cfe0,2 is coupled to plate-line PL0_2, second terminal of Cfe0,3 is coupled to plate-line PL0_3, and second terminal of Cfe0,4 is coupled to plate-line PL0_4. In at least one embodiment, in second row, second terminal of Cfe1,1 is coupled to plate-line PL0_5, second terminal of Cfe1,2 is coupled to plate-line PL0_6, second terminal of Cfe1,3 is coupled to plate-line PL0_7, and second terminal of Cfe1,4 is coupled to plate-line PL0_8. In at least one embodiment, in third row, second terminal of Cfe2,1 is coupled to plate-line PL0_9, second terminal of Cfe2,2 is coupled to plate-line PL0_10, second terminal of Cfe2,3 is coupled to plate-line PL0_11, and second terminal of Cfe2,4 is coupled to plate-line PL0_12. In at least one embodiment, in fourth row, second terminal of Cfe3,1 is coupled to plate-line PL0_13, second terminal of Cfe3,2 is coupled to plate-line PL0_14, second terminal of Cfe3,3 is coupled to plate-line PL0_15, and second terminal of Cfe3,4 is coupled to plate-line PL0_16.

In at least one embodiment, each capacitor structure includes a shared bottom electrode 4101 which couples to capacitors of that row and to common node sn1 4122. In at least one embodiment, multiple vias are used for common node sn1 to connect common node sn1 on M1 to shared bottom electrode 4101. In at least one embodiment, multiple vias are used for storage node sn1 to couple to shared bottom electrode 4101 to reduce reliability issues like electromigration. In at least one embodiment, a vertical tower of vias and metal layers are used to extend storage node sn1 to higher levels along vertical direction.

In at least one embodiment, shared bottom electrode 4101 (or extended bottom electrode) can be a metal electrode or a first conductive oxide, or a combination of a second conductive oxide and a barrier or insulative material, in accordance with at least one embodiment. In at least one embodiment, barrier material or insulative material can be any one of insulative materials discussed herein. In at least one embodiment, shared bottom electrode 4101 comprises a reflective intermetallic material. By using a shared bottom electrode, fabrication steps for fabricating each capacitor are reduced. Further, vertical height is also reduced for memory bit-cell. In at least one embodiment, shared bottom electrode 4101 is indirectly coupled to ferroelectric material or memory material.

In at least one embodiment, a metal layer is formed over top electrode of each capacitor to connect to a respective input. In at least one embodiment, a pedestal is formed between top electrode and metal layer connected to respective input. In at least one embodiment, metal layer over a pedestal which is adjacent to top electrode of capacitor Cfe0,1 is connected to plate-line PL0_1. In at least one embodiment, metal layer over a pedestal which is adjacent to top electrode of capacitor Cfe1,1 is connected to plate-line PL0_5 and so on. In at least one embodiment, pedestals have a barrier material on its sidewalls as discussed with reference to FIG. 4C.

Referring to FIG. 41A, in at least one embodiment, metal layers coupled to bottom electrodes of capacitors are coupled to storage node sn1 through respective vias. In at least one embodiment, multiple vias connect bottom extended electrode of each capacitor stack. In at least one embodiment, multiple vias are connected to storage node sn1. In at least one embodiment, multiple vias, connected to metal layer (e.g., M3) for sn1 as storage node, connect to extended bottom electrode of higher capacitors in stack. In at least one embodiment, vias 4123 are misaligned. In at least one embodiment, vias 4123 are aligned. Here, "misaligned" may generally refer to vias or pedestals that are not continuous in their vertical extension and have side branches as vias couple to metal layers and other vias to extend vertically up. Here, "aligned" generally refers to vias or pedestals that are continuous in their vertical extension. Here, "continuous" generally means that via or pedestal extends without interruption. In at least one embodiment, "continuous" may refer to extension of via or pedestal with nominal interruption (such as an intervening metal layer) but subsequent via or pedestal on metal layer is along a same vertical line of extension as via below metal line.

In at least one embodiment, metal-2 (M2) is deposited over vias (vial). M2 layer is then polished. In at least one embodiment, capacitors can be moved further up in stack, where capacitor level processing is done between different layers. In at least one embodiment, oxide is deposited over etch stop layer. Thereafter, in at least one embodiment, dry or wet etching is performed to form holes for pedestals. In at least one embodiment, holes are filled with metal, and land on respective M2 layers. In at least one embodiment, fabrication processes such as interlayer dielectric (ILD) oxide deposition followed by ILD etch (to form holes for pedestals), deposition of metal into holes, and subsequent polishing of surface are used to prepare for post pedestal fabrication.

In at least one embodiment, number of fabrication processes of deposition, lithography, and etching takes place to form stack of layers for planar capacitor. In at least one embodiment, capacitors are formed in a backend of die. In at least one embodiment, deposition of ILD is followed by surface polish.

In at least one embodiment, after polishing surface, ILD is deposited. Thereafter, in at least one embodiment, holes are etched through ILD to expose top electrodes of capacitors. In at least one embodiment, holes are then filled with metal. In at least one embodiment, followed by filling holes, top surface is polished. In at least one embodiment, capacitors are connected to plate-lines and storage node sn1 (through pedestals).

In at least one embodiment, ILD is deposited over a polished surface. In at least one embodiment, holes for via are then etched to contact M2 layer. In at least one embodiment, holes are filled with metal to form vias (via2). In at least one embodiment, top surface is then polished. In at least one embodiment, process of depositing metal over vias (via2), depositing ILD, etching holes to form pedestals for next capacitors of stack, forming capacitors, and then forming vias that contact M3 layer, are repeated. In at least one embodiment, this process is repeated to form various capacitors in stack.

In at least one embodiment, top electrode of each capacitor is allowed to directly contact metal above. In at least one embodiment, pedestals that connect to top electrodes are removed. In at least one embodiment, height of stacked capacitors is lowered, and fabrication process is simplified because extra steps for forming pedestals are removed.

Figure 41B:
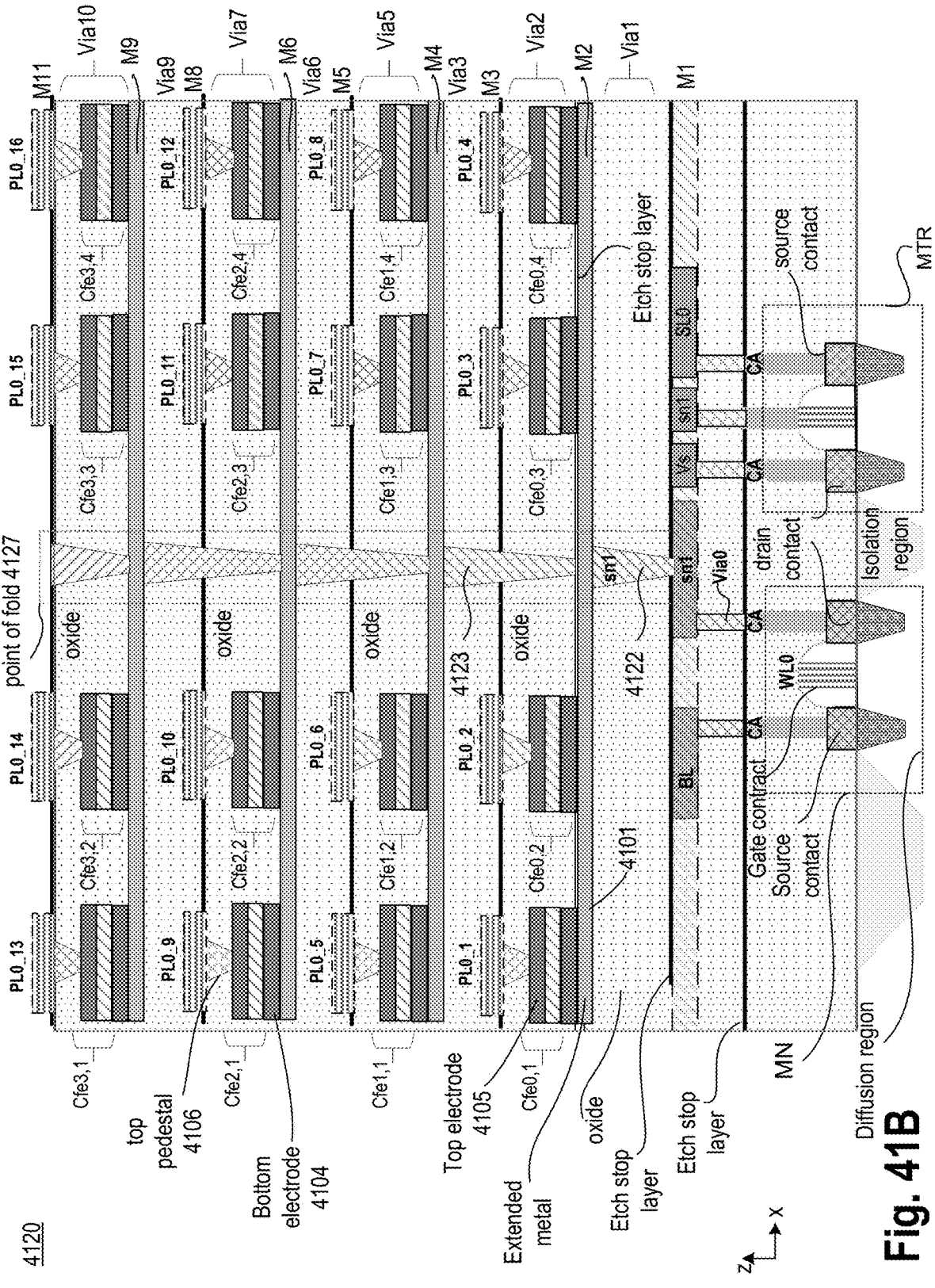
FIG. 41B illustrates a cross-section of a multi-element gain bit-cell with folded and stacked capacitors or memory elements with shared gain transistor, in accordance with at least one embodiment.

FIG. 41B illustrates a cross-section of a multi-element gain bit-cell 4120 with folded and stacked capacitors or memory elements with shared gain transistor, in accordance with at least one embodiment. In at least one embodiment, cross-section of multi-element gain bit-cell 4120 is like cross-section of memory bit-cell 4100 but for additional gain transistor MTR, which is coupled to storage node sn1, reference Vs, and sense line SL (e.g., SL0).

Figure 42A:
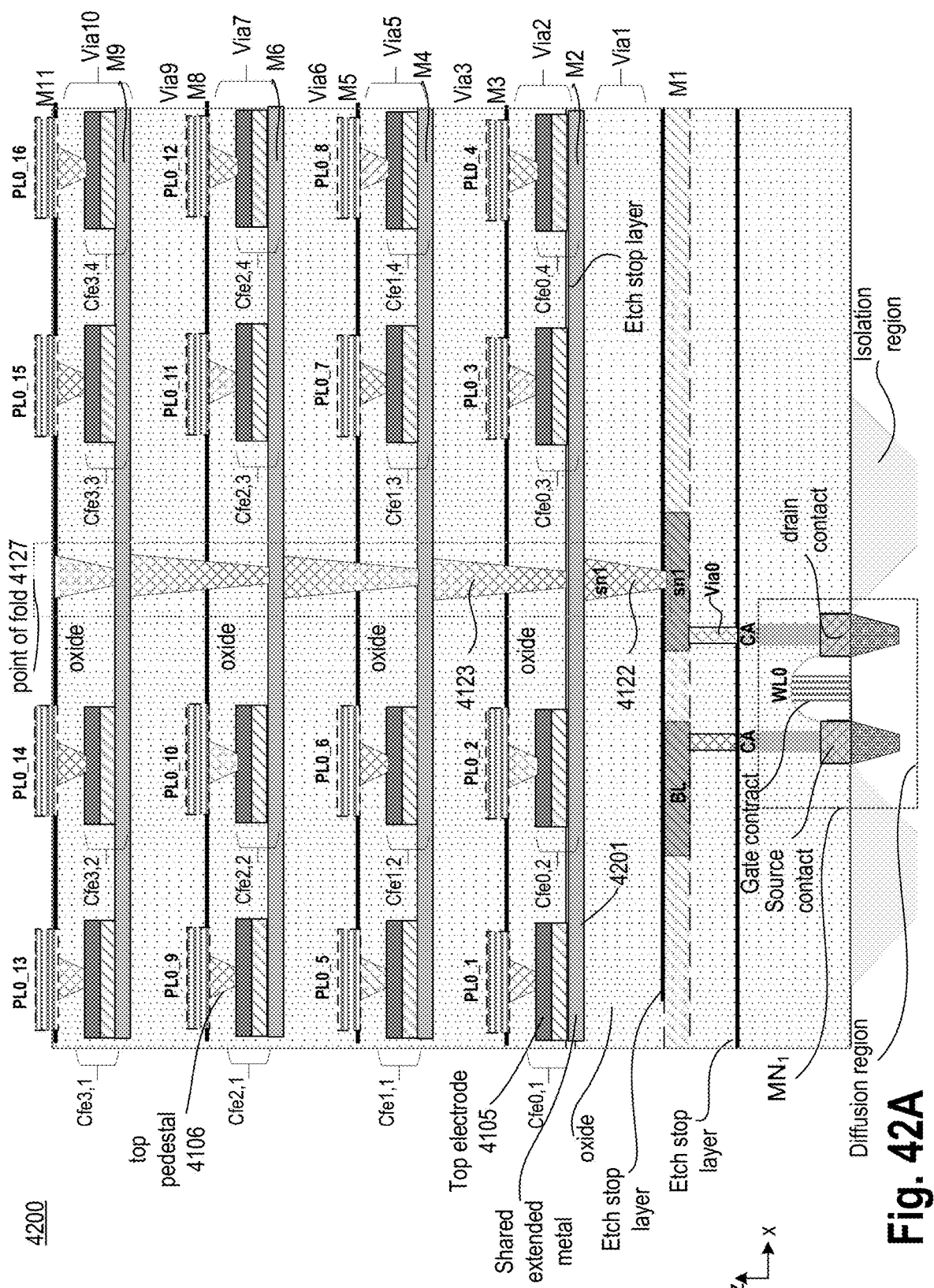
FIG. 42A illustrates a cross-section of a memory bit-cell with folded and stacked capacitors or memory elements with shared gain transistor, and with shared bottom electrode, in accordance with at least one embodiment.

FIG. 42A illustrates a cross-section of memory bit-cell 4200 with folded and stacked capacitors or memory elements with shared gain transistor, and with shared bottom electrode, in accordance with at least one embodiment. In at least one embodiment, cross-section of memory bit-cell 4200 is like memory bit-cell 4100 but with shared bottom electrode 4201 being in direct contact with ferroelectric material or memory material. In at least one embodiment, shared bottom electrode 4201 has same materials as those discussed with reference to shared bottom electrode 4101.

Figure 42B:
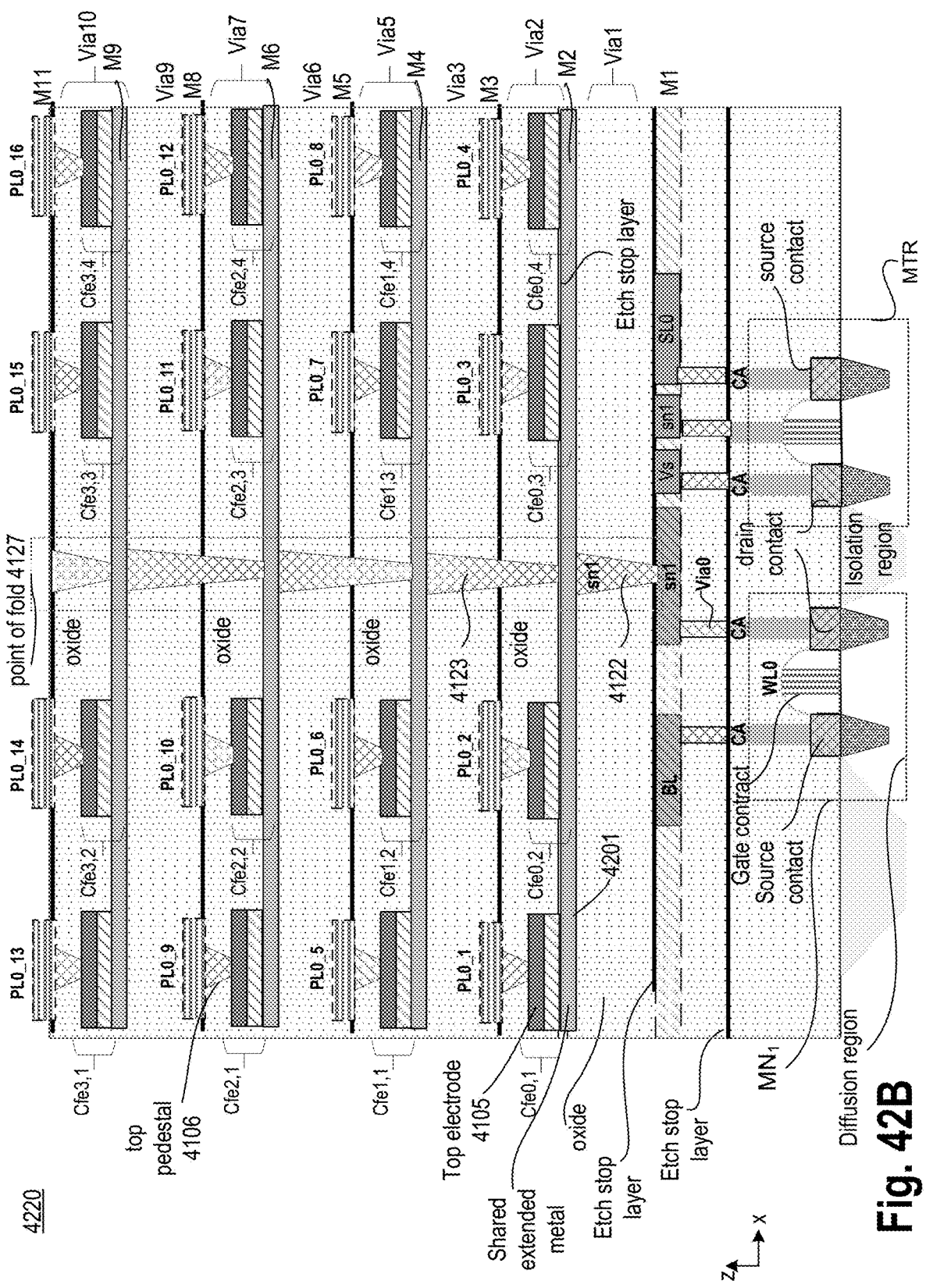
FIG. 42B illustrates a cross-section of a multi-element gain bit-cell with folded and stacked capacitors or memory elements with shared gain transistor, and with shared bottom electrode, in accordance with at least one embodiment.

FIG. 42B illustrates cross-section of a multi-element gain bit-cell 4220 with folded and stacked capacitors or memory elements with shared gain transistor, and with shared bottom electrode, in accordance with at least one embodiment. In at least one embodiment, cross-section of multi-element gain bit-cell 4220 is like cross-section of memory bit-cell 4200 but for additional gain transistor MTR, which is coupled to storage node sn1, reference Vs, and sense line SL (e.g., SL0). FIGS. 41A-B, FIGS. 42A-B, and FIGS. 43A-B are simplified cross-sections in that many transistors such as MS, MN0, $MBS_{11}$, $MBS_{nm}$ of various implementations are not shown, but can be added and are within scope of at least one embodiment.

Figure 43A:
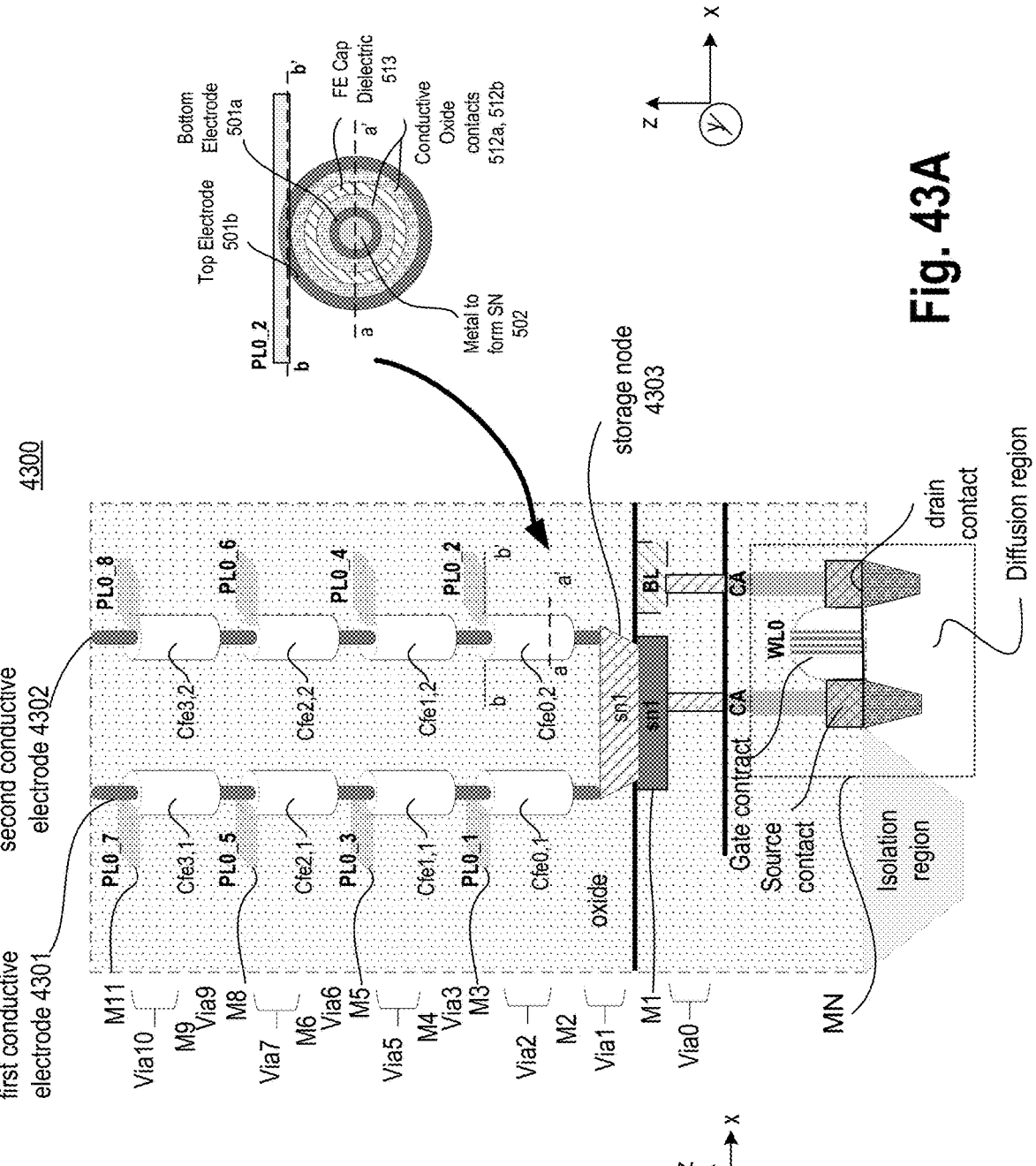
FIG. 43A illustrates a cross-section of a memory bit-cell with folded and stacked non-planar capacitors or non-planar memory elements with shared gain transistor, in accordance with at least one embodiment.

FIG. 43A illustrates a cross-section of a memory bit-cell 4300 with folded and stacked non-planar capacitors or non-planar memory elements with shared gain transistor, in accordance with at least one embodiment. In this example eight capacitors are stacked and folded. In at least one embodiment, at least two columns of shared metal (here identified as 4301 and 4302) are connected to storage node sn1 4303. In at least one embodiment, for further folding of capacitors, additional columns of shared metal can be connected to storage node sn1. In at least one embodiment, vial for storage node 4303 sn1 is made wider to accommodate connection with additional columns. In at least one embodiment, storage node sn1 4303 is coupled to a metal stub on M1 which in turn is coupled to a source contact of transistor MN. In at least one embodiment, drain contact of transistor MN is connected to BL. In at least one embodiment, gate terminal of the transistor is connected to WL0. In at least one embodiment, columns of vertical metal form bottom electrodes of capacitors or are directly adjacent to bottom electrodes of capacitors.

In at least one embodiment, plurality of capacitors has a first terminal coupled to storage node sn1 4303. In at least one embodiment, a second terminal of an individual capacitor of plurality of capacitors is coupled to an individual plate-line, wherein plurality of capacitors are non-planar capacitors that are arranged in a stacked and folded configuration. In at least one embodiment, 1TnC bit-cell 4300 comprises first conductive electrode 4301 directly connected to storage node sn1 4303, wherein first conductive electrode 4301 extends vertically away from storage node sn1 4303. In at least one embodiment, 1TnC bit-cell 4300 comprises second conductive electrode 4302 directly connected to storage node sn1 4303. In at least one embodiment, second conductive electrode 4302 extends vertically away from storage node sn1 4303. In at least one embodiment, first conductive electrode 4301 and second conductive electrode 4302 are substantially parallel. In some embodiments, plurality of capacitors includes a first set of capacitors (Cfe0,1, Cfe1,1, Cfe2,1, and Cfe3,1) adjacent to first conductive electrode 4301. In at least one embodiment, plurality of capacitors includes a second set of capacitors (Cfe0,2, Cfe1,2, Cfe2,2, and Cfe3,2) adjacent to second conductive electrode 4302.

In at least one embodiment, top electrode of each capacitor is partially adjacent to a respective plate-line. In at least one embodiment, top electrode of capacitor Cfe0,1 is partially coupled to plate-line PL0_1, the top electrode of capacitor Cfe0,2 is partially coupled to plate-line PL0_2, the top electrode of capacitor Cfe1,1 is partially coupled to plate-line PL0_3, top electrode of capacitor Cfe1,2 is partially coupled to plate-line PL0_4, top electrode of capacitor Cfe2,1 is partially coupled to plate-line PL0_5, top electrode of capacitor Cfe2,2 is partially coupled to plate-line PL0_6, top electrode of capacitor Cfe3,1 is partially coupled to plate-line PL0_7, and the top electrode of capacitor Cfe3,2 is partially coupled to plate-line PL0_8. In at least one embodiment, capacitors are formed between regions reserved for Vial through Vial1 (e.g., between M1 through M11 layers). In at least one embodiment, to reduce height of memory bit-cell, further folding can be performed by forming capacitors on additional metal columns or shafts that connect to storage node sn1 4303.

In at least one embodiment, for linear non-planar capacitors, example structures are described with reference to FIGS. 3A-B. In at least one embodiment, for non-linear non-planar capacitors, example structures are described with reference to FIGS. 5A-B.

Figure 43B:
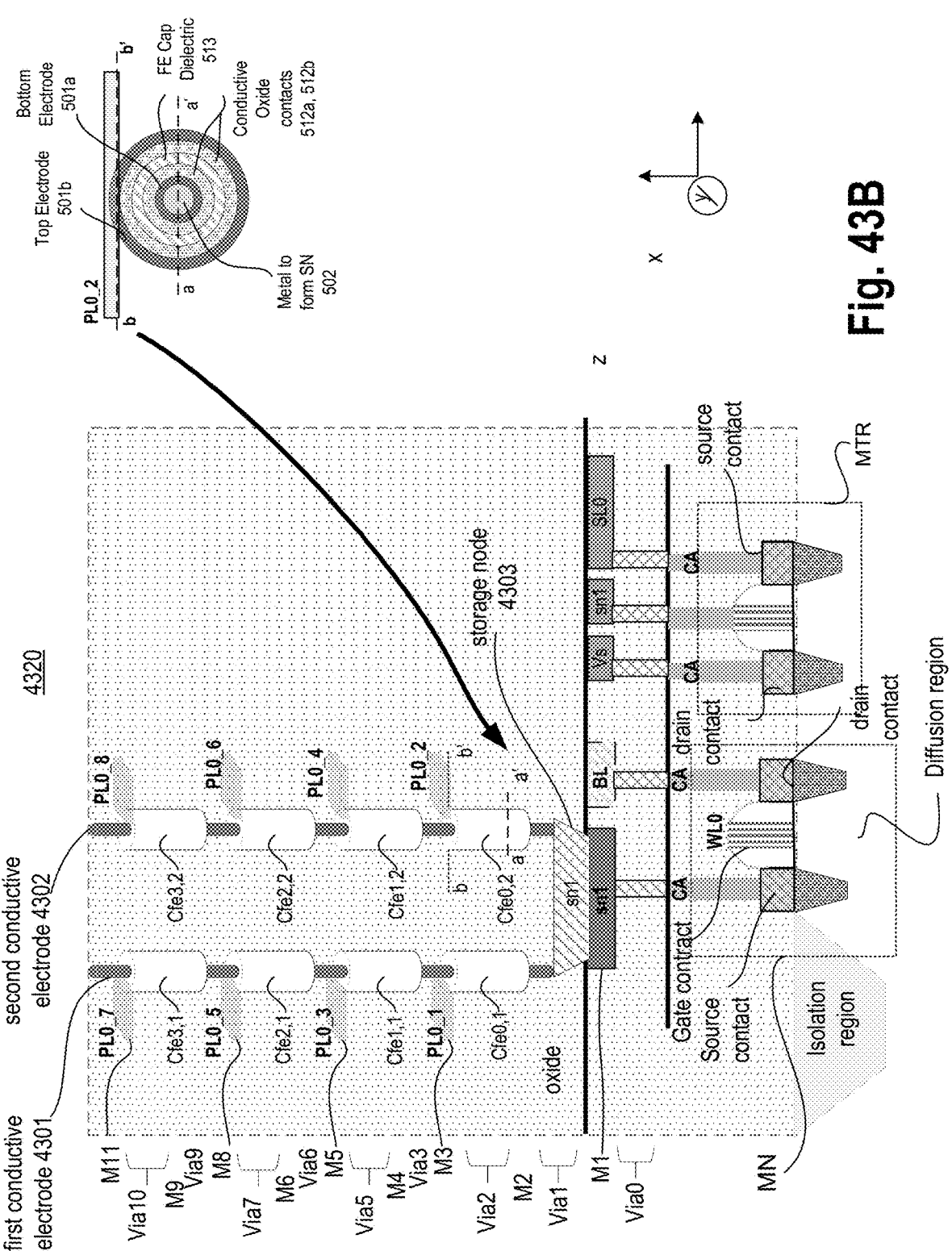
FIG. 43B illustrates a cross-section of a multi-element gain bit-cell with folded and stacked non-planar capacitors or non-planar memory elements with shared gain transistor, in accordance with at least one embodiment.

FIG. 43B illustrates a cross-section of a multi-element gain bit-cell 4320 with folded and stacked non-planar capacitors or non-planar memory elements with shared gain transistor, in accordance with at least one embodiment. In at least one embodiment, cross-section of multi-element gain bit-cell 4320 is like that of memory bit-cell 4300 but for additional gain transistor MTR, which is coupled to storage node sn1, reference Vs, and sense line SL (e.g., SL0).

Figure 43C:
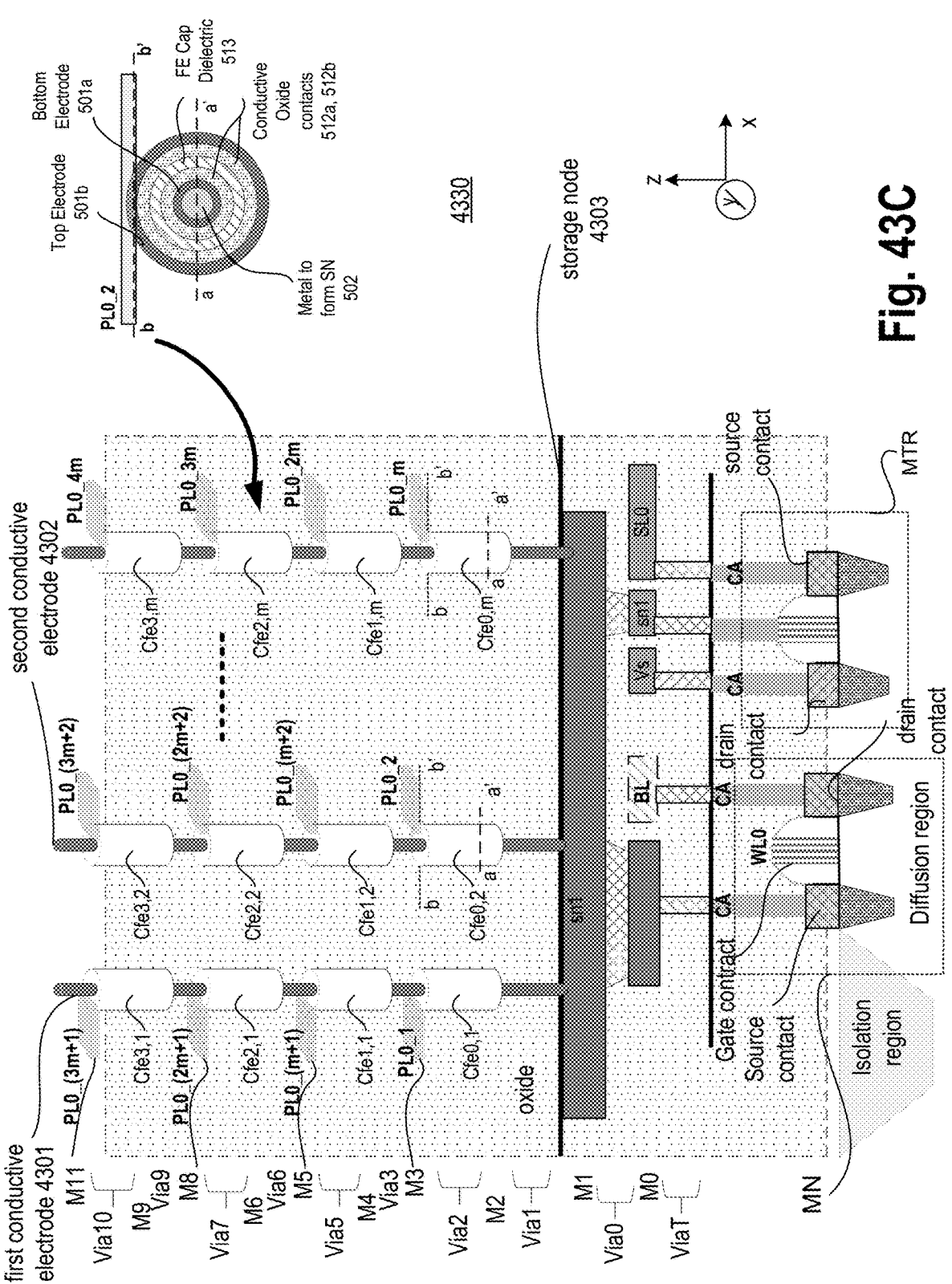
FIG. 43C illustrates a cross-section of a multi-element gain bit-cell with folded and stacked non-planar capacitors or non-planar memory elements with shared gain transistor, in accordance with at least one embodiment.

FIG. 43C illustrates a cross-section of a multi-element gain bit-cell 4330 with folded and stacked non-planar capacitors or non-planar memory elements with shared gain transistor, in accordance with at least one embodiment. Compared to FIG. 43B, here many vertical folded and stacked non-planar capacitors are coupled to storage node sn1, in at least one embodiment. In at least one embodiment, area of transistors is utilized by capacitors above them so planar footprint of transistors is not wasted. In at least one embodiment, storage node sn1 is formed in a metal layer (e.g., M1) and extended to connect with individual electrodes of an individual vertical stack (e.g., first conductive electrode 4301 of a first stack is connected to storage node sn1, second conductive electrode 4302 of a second stack is connected to storage node sn1, and so on). In at least one embodiment, additional metal layer (e.g., M0) may be used to route bit-line BL, reference Vs, sense-line (e.g., SL0) below higher metal layer (e.g., M1). In at least one embodiment, viaT is used to connect various signal routes to one or more transistors (e.g., MN and MTR). FIGS. 43A-C are simplified cross-sections in that many transistors such as MS, MN0, MBS₁₁, MBSₙₘ of various implementations are not shown, but can be added and are within scope of at least one embodiment.

Figure 44:
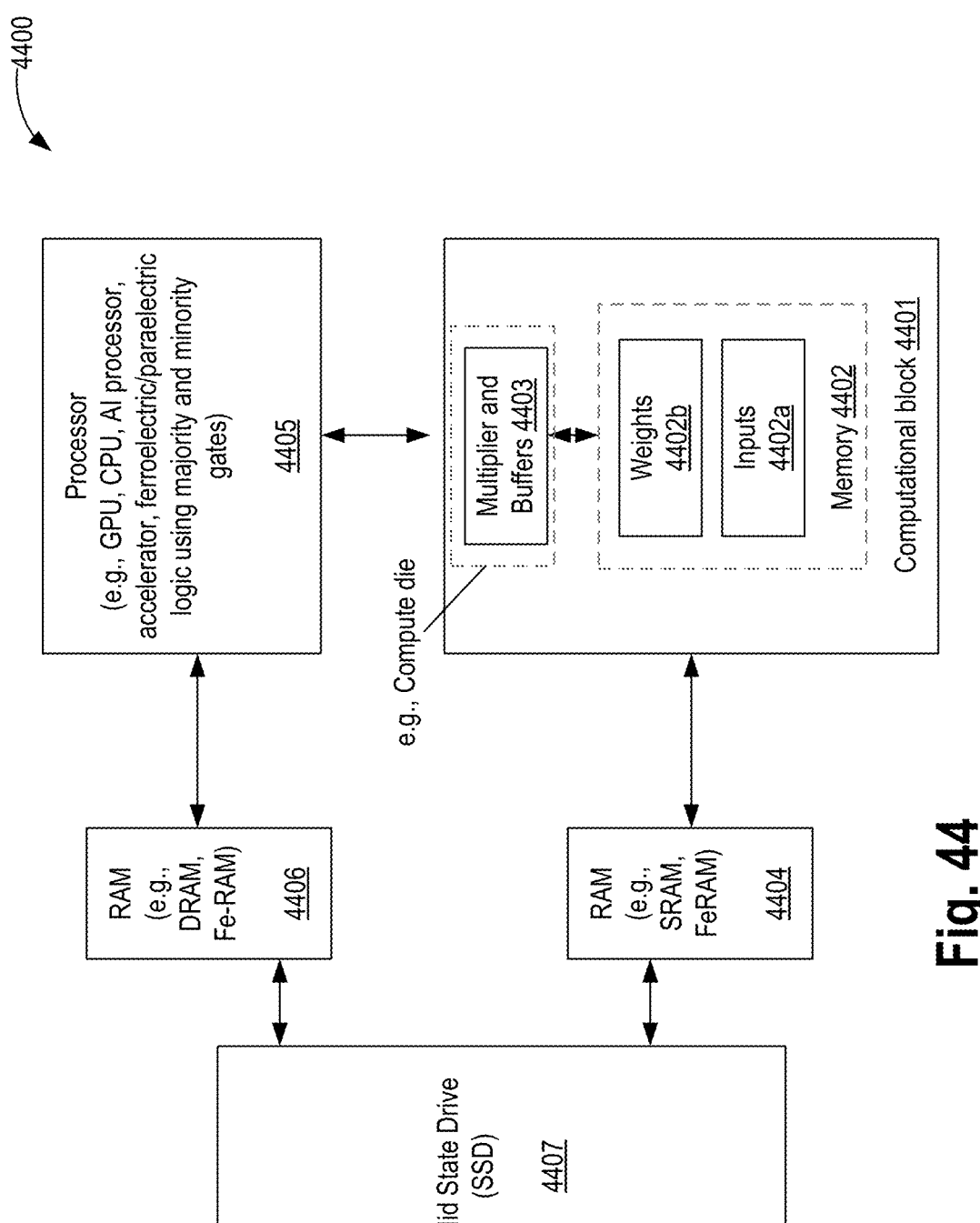
FIG. 44 illustrates a high-level architecture of an artificial intelligence (AI) machine comprising a compute die stacked over a memory die, where the memory die includes memory arrays having bit-cells, in accordance with at least one embodiment.

FIG. 44 illustrates a high-level architecture of an artificial intelligence (AI) machine comprising a compute die stacked over a memory die, where the memory die includes memory arrays having bit-cells, in accordance with at least one embodiment.

In at least one embodiment, AI machine 4400 comprises computational block 4401 or processor having random-access memory (RAM) 4402 and multiplier and buffers 4403; first random-access memory 4404 (e.g., static RAM (SRAM), ferroelectric or paraelectric RAM (FeRAM), ferroelectric or paraelectric static random-access memory (FeSRAM)), main processor 4405, second random-access memory 4406 (dynamic RAM (DRAM), FeRAM), and solid-state memory or drive (SSD) 4407. In at least one embodiment, some or all components of AI machine 4400 are packaged in a single package forming a system-on-chip (SoC). In at least one embodiment, SoC can be configured as a logic-on-logic configuration, which can be in a 3D configuration or a 2.5D configuration.

In at least one embodiment, computational block 4401 is packaged in a single package and then coupled to processor 4405 and memories 4404, 4406, and 4407 on a printed circuit board (PCB). In at least one embodiment, computational block 4401 is configured as a logic-on-logic configuration, which can be in a 3D configuration or a 2.5D configuration. In at least one embodiment, computational block 4401 comprises a special purpose compute die 4403 or microprocessor. In at least one embodiment, compute die 4403 is a compute chiplet that performs a function of an accelerator or inference. In at least one embodiment, memory 4402 is DRAM which forms a special memory/cache for special purpose compute die 4403. In at least one embodiment, DRAM can be embedded DRAM (eDRAM) such as 1T1C (one transistor and one capacitor) based memories. In at least one embodiment, RAM 4402 is ferroelectric or paraelectric RAM (Fe-RAM).

In at least one embodiment, compute die 4403 is specialized for applications such as Artificial Intelligence, graph processing, and algorithms for data processing. In at least one embodiment, compute die 4403 further has logic computational blocks, for multipliers and buffers, a special data memory block (e.g., buffers) comprising DRAM, FeRAM, or a combination of them. In at least one embodiment, RAM 4402 has weights and inputs stored to improve computational efficiency. In at least one embodiment, interconnects between processor 4405 (also referred to as special purpose processor), first RAM 4404, and compute die 4403 are optimized for high bandwidth and low latency. In at least one embodiment, architecture of FIG. 44 allows efficient packaging to lower energy, power, or cost, and provides for ultra-high bandwidth between RAM 4404 and compute chiplet 4403 of computational block 4401.

In at least one embodiment, RAM 4402 is partitioned to store input data (or data to be processed) 4402a and weight factors 4402b. In at least one embodiment, input data 4402a is stored in a separate memory (e.g., separate memory die) and weight factors 4402b are stored in a separate memory (e.g., separate memory die).

In at least one embodiment, computational logic or compute chiplet 4403 comprises matrix multiplier, adder, concatenation logic, buffers, and combinational logic. In at least one embodiment, compute chiplet 4403 performs multiplication operation on inputs 4402a and weights 4402b. In at least one embodiment, weights 4402b are fixed weights. In at least one embodiment, processor 4405 (e.g., a graphics processor unit (GPU), field programmable grid array (FPGA) processor, application specific integrated circuit (ASIC) processor, digital signal processor (DSP), AI processor, central processing unit (CPU), or any other high-performance processor) computes weights for a training model. Once weights are computed, they are stored in memory 4402. In at least one embodiment, input data that is to be analyzed using a trained model is processed by computational block 4401 with computed weights 4402b to generate an output (e.g., a classification result).

In at least one embodiment, first RAM 4404 is ferroelectric or paraelectric based SRAM. For example, a six transistor (6T) SRAM bit-cell having ferroelectric or paraelectric transistors are used to implement a non-volatile FeSRAM. In at least one embodiment, SSD 4407 comprises NAND flash cells. In at least one embodiment, SSD 4407 comprises NOR flash cells. In at least one embodiment, SSD 4407 comprises multi-threshold NAND flash cells.

In at least one embodiment, non-volatility of FeRAM is used to introduce new features such as security, functional safety, and faster reboot time of AI machine 4400. In at least one embodiment, non-volatile FeRAM is a low power RAM that provides fast access to data and weights. FeRAM 4404 can also serve as fast storage for computational block 4401

(which can be an inference die or an accelerator), which typically has low capacity and fast access requirements.

In at least one embodiment, FeRAM (FeDRAM or FeSRAM) includes ferroelectric or paraelectric material. In at least one embodiment, ferroelectric or paraelectric material may be in a transistor gate stack or in a capacitor of memory. In at least one embodiment, ferroelectric material can be any suitable low voltage FE material discussed herein. While at least one embodiment here is described with reference to ferroelectric material, at least one embodiment is applicable to any of nonlinear polar materials described herein.

Figure 45:
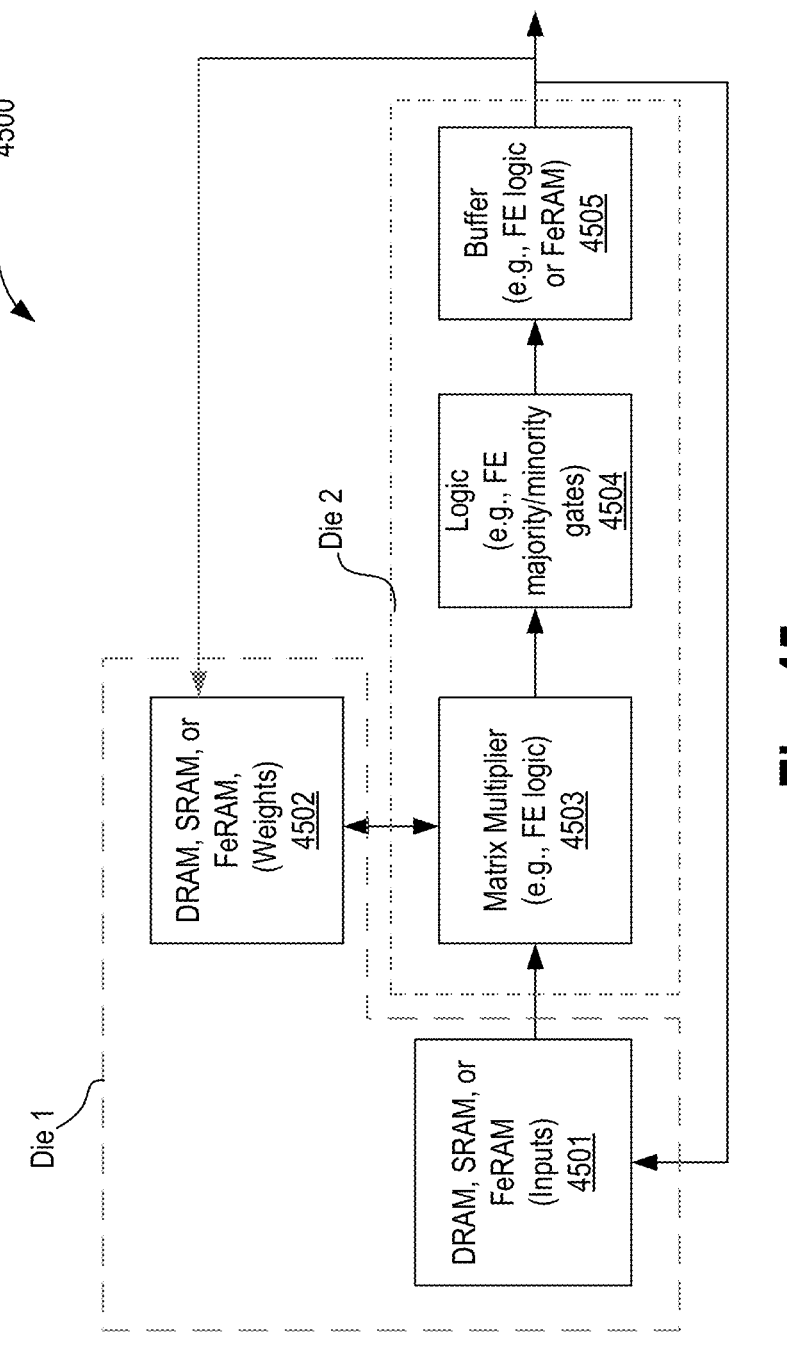
FIG. 45 illustrates an architecture of a computational block comprising a compute die stacked with a memory die, wherein the memory die includes memory arrays having bit-cells, in accordance with at least one embodiment.

FIG. 45 illustrates architecture 4500 of a computational block comprising a compute die stacked with a memory die, wherein the memory die includes memory arrays having bit-cells, in accordance with at least one embodiment. In at least one embodiment, architecture of FIG. 45 illustrates architecture 4500 for a special purpose compute die where RAM memory buffers for inputs and weights are split on die-1 and logic and optional memory buffers are split on die-2.

In at least one embodiment, memory die (e.g., Die 1) is positioned below a compute die (e.g., Die 2) such that a heat sink or thermal solution is adjacent to compute die. In at least one embodiment, memory die is embedded in an interposer. In at least one embodiment, memory die behaves as an interposer in addition to its basic memory function. In at least one embodiment, memory die is a high bandwidth memory (HBM) which comprises multiple dies of memories in a stack and a controller to control read and write functions to stack of memory dies. In at least one embodiment, memory die comprises a first die 4501 to store input data and a second die 4502 to store weight factors. In at least one embodiment, memory die is a single die that is partitioned such that first partition 4501 of memory die is used to store input data and second partition 4502 of memory die is used to store weights. In at least one embodiment, memory die comprises DRAM. In at least one embodiment, memory die comprises FE-SRAM or FE-DRAM. In at least one embodiment, memory die comprises MRAM. In at least one embodiment, memory die comprises SRAM. In at least one embodiment, memory partitions 4501 and 4502, or memory dies 4501 and 4502 include one or more of: DRAM, FE-SRAM, FE-DRAM, SRAM, and/or MRAM. In at least one embodiment, input data stored in memory partition or die 4501 is data to be analyzed by a trained model with fixed weights stored in memory partition or die 4502.

In at least one embodiment, compute die comprises ferroelectric or paraelectric logic (e.g., majority, minority, and/or threshold gates) to implement matrix multiplier 4503, logic 4504, and temporary buffer 4505. In at least one embodiment, matrix multiplier 4503 performs multiplication operation on input data 'X' and weights 'W' to generate an output 'Y'. In at least one embodiment, this output may be further processed by logic 4504. In at least one embodiment, logic 4504 performs a threshold operation, pooling and drop out operations, and/or concatenation operations to complete AI logic primitive functions.

In at least one embodiment, output of logic 4504 (e.g., processed output 'Y') is temporarily stored in buffer 4505. In at least one embodiment, buffer 4505 is memory such as one or more of: DRAM, Fe-SRAM, Fe-DRAM, MRAM, resistive RAM (Re-RAM) and/or SRAM. In at least one embodiment, buffer 4505 is part of memory die (e.g., Die 1). In at least one embodiment, buffer 4505 performs function of a re-timer. In at least one embodiment, output of buffer 4505 (e.g., processed output 'Y') is used to modify weights in memory partition or die 4502. In at least one embodiment, computational block of architecture 4500 not only operates as an inference circuitry, but also as a training circuitry to train a model. In at least one embodiment, matrix multiplier 4503 includes an array of multiplier cells, wherein DRAMs 4501 and 4502 include arrays of memory bit-cells, respectively, wherein each multiplier cell is coupled to a corresponding memory bit-cell of DRAM 4501 and/or DRAM 4502. In at least one embodiment, computational block 4500 comprises an interconnect fabric coupled to array of multiplier cells such that each multiplier cell is coupled to interconnect fabric.

In at least one embodiment, architecture 4500 provides reduced memory access for compute die (e.g., die 2) by providing data locality for weights, inputs, and outputs. In at least one embodiment, data from and to AI computational blocks (e.g., matrix multiplier 4503) is locally processed within a same packaging unit. In at least one embodiment, architecture 4500 also segregates memory and logic operations onto a memory die (e.g., Die 1) and a logic die (e.g., Die 2), respectively, allowing for optimized AI processing. In at least one embodiment, desegregated dies allow for improved yield of dies. In at least one embodiment, a high-capacity memory process for Die 1 allows reduction of power of external interconnects to memory, reduces cost of integration, and results in a smaller footprint.

Figure 46:
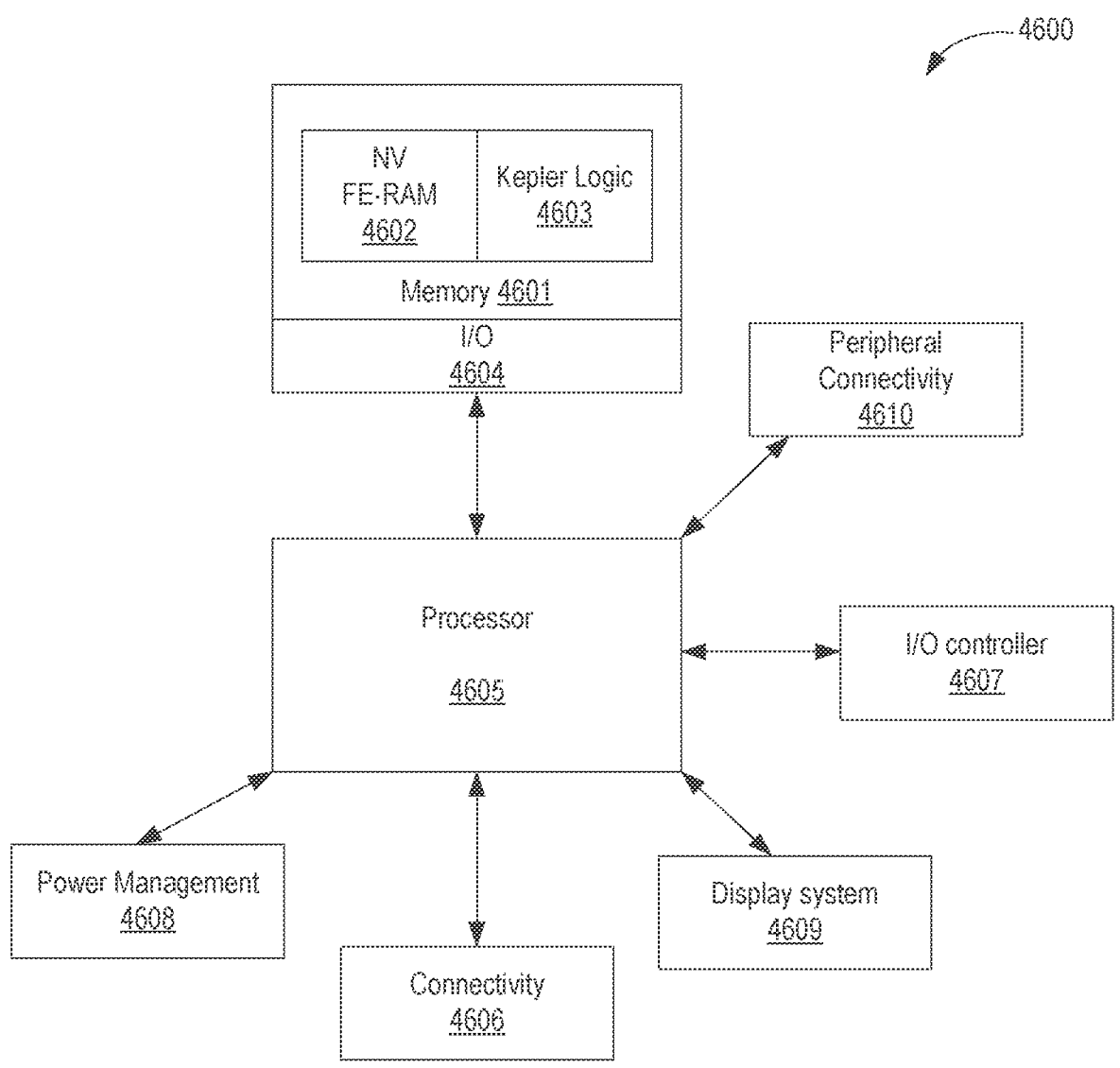
FIG. 46 illustrates a system-on-chip (SoC) that uses memory arrays including memory arrays having bit-cells, in accordance with at least one embodiment.

FIG. 46 illustrates a system-on-chip (SoC) that uses memory arrays including memory arrays having bit-cells, in accordance with at least one embodiment. In at least one embodiment, SoC 4600 comprises memory 4601 having static random-access memory (SRAM) or FE based random-access memory FE-RAM, or any other suitable memory. In at least one embodiment, memory can be non-volatile (NV) or volatile memory. In at least one embodiment, memory 4601 may also comprise logic 4603 to control memory 4602. In at least one embodiment, write and read drivers are part of logic 4603. In at least one embodiment, these drivers and other logic are implemented using majority or threshold gates discussed herein. In at least one embodiment, logic 4603 can comprise majority or threshold gates and traditional logic (e.g., CMOS based NAND, NOR etc.).

In at least one embodiment, SoC further comprises a memory I/O (input-output) interface 4604. In at least one embodiment, interface may be a double-data rate (DDR) compliant interface or any other suitable interface to communicate with a processor. In at least one embodiment, processor 4605 of SoC 4600 can be a single core or multiple core processor. In at least one embodiment, processor 4605 can be a general-purpose processor (CPU), a digital signal processor (DSP), or an Application Specific Integrated Circuit (ASIC) processor. In at least one embodiment, processor 4605 is an artificial intelligence (AI) processor (e.g., a dedicated AI processor, a graphics processor configured as an AI processor). In at least one embodiment, processor 4605 executes instructions that are stored in memory 4601.

In at least one embodiment, AI is a broad area of hardware and software computations where data is analyzed, classified, and then a decision is made regarding data. In at least one embodiment, a model describing classification of data for a certain property or properties is trained over time with large amounts of data. In at least one embodiment, process of training a model requires large amounts of data and processing power to analyze data. In at least one embodiment, when a model is trained, weights or weight factors are modified based on outputs of model. In at least one embodiment, once weights for a model are computed to a high confidence level (e.g., 95% or more) by repeatedly analyzing data and modifying weights to get expected results, model is deemed "trained." In at least one embodiment, trained model with fixed weights is then used to make decisions about new data. In at least one embodiment, training a model and then applying trained model for new data is hardware intensive activity. In at least one embodiment, AI processor has reduced latency of computing training model and using training model, which reduces power consumption of such AI processor systems.

In at least one embodiment, processor 4605 may be coupled to number of other chiplets that can be on same die as SoC 4600 or on separate dies. In at least one embodiment, these chiplets include peripheral connectivity circuitry 4606, I/O controller 4607, power management 4608, display system 4609, and peripheral connectivity circuitry 4606.

In at least one embodiment, peripheral connectivity circuitry 4606 represents hardware devices and software components for communicating with other devices. In at least one embodiment, connectivity 4606 may support various connectivity circuitries and standards. In at least one embodiment, peripheral connectivity circuitry 4606 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In at least one embodiment, peripheral connectivity circuitry 4606 may support non-cellular standards such as WiFi.

In at least one embodiment, I/O controller 4607 represents hardware devices and software components related to interaction with a user. In at least one embodiment, I/O controller 4607 is operable to manage hardware that is part of an audio subsystem and/or display subsystem. In at least one embodiment, input through a microphone or other audio device can provide input or commands for one or more applications or functions of SoC 4600. In at least one embodiment, I/O controller 4607 illustrates a connection point for additional devices that connect to SoC 4600 through which a user might interact with system. In at least one embodiment, devices that can be attached to SoC 4600 might include microphone devices, speaker or stereo systems, video systems, or other display devices, keyboard or keypad devices, or other I/O devices for use with specific applications such as card readers or other devices.

In at least one embodiment, power management 4608 represents hardware or software that performs power management operations, e.g., based at least in part on receiving measurements from power measurement circuitries, temperature measurement circuitries, charge level of battery, and/or any other appropriate information that may be used for power management. In at least one embodiment, by using majority and threshold gates discussed herein, non-volatility is achieved at output of these logic. In at least one embodiment, power management 4608 may accordingly put such logic into low power state without worry of losing data. In at least one embodiment, power management may select a power state according to Advanced Configuration and Power Interface (ACPI) specification for one or all components of SoC 4600.

In at least one embodiment, display system 4609 represents hardware (e.g., display devices) and software (e.g., drivers) components that provide a visual and/or tactile display for a user to interact with processor 4605. In at least one embodiment, display system 4609 includes a touch screen (or touch pad) device that provides both output and input to a user. In at least one embodiment, display system 4609 may include a display interface, which includes particular screen or hardware device used to provide a display to a user. In at least one embodiment, display interface includes logic separate from processor 4605 to perform at least some processing related to display.

In at least one embodiment, peripheral connectivity 4610 may represent hardware devices and/or software devices for connecting to peripheral devices such as printers, chargers, cameras, etc. In at least one embodiment, peripheral connectivity 4610 may support communication protocols, e.g., PCIe (Peripheral Component Interconnect Express), USB (Universal Serial Bus), Thunderbolt, High-Definition Multimedia Interface (HDMI), Firewire, etc.

In at least one embodiment, SoC 4600 includes a coherent cache or memory-side buffer chiplet (not shown) which include ferroelectric or paraelectric memory. In at least one embodiment, coherent cache or memory-side buffer chiplet can be coupled to processor 4605 and/or memory 4601 as described herein (e.g., via silicon bridge or vertical stacking).

Here, "device" may generally refer to an apparatus according to context of usage of that term. In at least one embodiment, a device may refer to a stack of layers or structures, a single structure or layer, a connection of various structures having active and/or passive elements, etc. Generally, a device is a three-dimensional structure with a plane along x-y direction and a height along z direction of an x-y-z Cartesian coordinate system. In at least one embodiment, plane of device may also be plane of an apparatus, which comprises device.

Throughout specification, and in claims, "connected" may generally refer to a direct connection, such as electrical, mechanical, or magnetic connection between things that are connected, without any intermediary devices.

Here, "coupled" may generally refer to a direct or indirect connection, such as a direct electrical, mechanical, or magnetic connection between things that are connected or an indirect connection, through one or more passive or active intermediary devices.

Here, "adjacent" may generally refer to a position of a thing being next to (e.g., immediately next to or close to with one or more things between them) or adjoining another thing (e.g., abutting it).

Here, "circuit" or "module" may generally refer to one or more passive and/or active components that are arranged to cooperate with one another to provide a desired function.

Here, "signal" may generally refer to at least one current signal, voltage signal, magnetic signal, or data/clock signal. Here, meaning of "a," "an," and "the" include plural references. Here, meaning of "in" includes "in" and "on."

Here, "analog signal" generally refers to any continuous signal for which time varying feature (variable) of signal is a representation of some other time varying quantity, e.g., analogous to another time varying signal.

Here, "digital signal" may generally refer to a physical signal that is a representation of a sequence of discrete values (a quantified discrete-time signal), for example of an arbitrary bit stream, or of a digitized (sampled and analog-to-digital converted) analog signal.

Here, "scaling" may generally refer to converting a design (schematic and layout) from one process technology to another process technology and subsequently being reduced in layout area. Here, "scaling" may generally refer to down-sizing layout and devices within same technology node. Here, "scaling" may also generally refer to adjusting (e.g., slowing down or speeding up—e.g., scaling down, or scaling up respectively) of a signal frequency relative to another parameter, for example, power supply level.

Here, terms "substantially," "close," "approximately," "near," and "about," generally refer to being within +/−10% of a target value. For example, unless otherwise specified in explicit context of their use, terms "substantially equal," "about equal" and "approximately equal" mean that there is no more than incidental variation between among things so described. In at least one embodiment, such variation is typically no more than +/−10% of a predetermined target value.

Here, "stack and fold" generally refers to a configuration of devices that are stacked vertically (substantially directly above or with a horizontal offset) such that one terminal of devices is shared to a common node, and further capacitors are placed along both sides of common node. In at least one embodiment, common node thus becomes a point of fold. In at least one embodiment, devices here are capacitors. In at least one embodiment is not limited to capacitors and are applicable to any devices with a common node. In at least one embodiment, N number of capacitors can be divided in L number of stack layers such that there are N/L capacitors in each stacked layer. In at least one embodiment, N/L capacitor's one terminal can be shorted together with an electrode (e.g., bottom electrode). In at least one embodiment, electrode can be metal, a conducting oxide, or a combination of a conducting oxide and a barrier (or insulative material).

In at least one embodiment, capacitors are stacked and folded, and also vertically offset relative to lower capacitors in stack. In at least one embodiment, offset allows for routing metal electrodes coupled to top electrodes of capacitors through space created by offset while reducing parasitic to capacitor(s) underneath. In at least one embodiment, various metal electrodes are parallel to one another with limited jogs, for example.

In at least one embodiment, capacitors are staggered while sharing a same bottom electrode or shared metal layer. In at least one embodiment, capacitors are staggered by having offsets in x-direction and a y-direction relative to one another. In at least one embodiment, offsets allow for routing metal electrodes coupled to top electrodes of capacitors through space created by offset. In at least one embodiment, various metal electrodes are parallel to one another with limited jogs. In at least one embodiment, can be combined with at least another embodiment. Hence, all possible permutations of combinations are not shown, but are within scope of this disclosure.

Here, "staggered configuration" or "staggered" may generally refer to placement of devices (e.g., capacitors) relative to one another such that devices are offset from one another in a horizontal plane and/or a vertical plane. In at least one embodiment, when devices are offset in a horizontal plane, devices may be diagonally away from one another (e.g., having an x-offset and a y-offset in a x-y horizontal plane). In at least one embodiment, when devices are offset in a vertical plane, devices may be diagonally away from one another (e.g., having an x-offset and a z-offset in a x-z vertical plane). In at least one embodiment, devices can be staggered both horizontally and vertically. In at least one embodiment, devices are staggered horizontally. In at least one embodiment, devices are staggered vertically.

Unless otherwise specified use of ordinal adjectives "first," "second," and "third," etc., to describe a common object, merely indicate that different instances of like objects are being referred to and are not intended to imply that objects so described must be in a given sequence, either temporally, spatially, in ranking or in any other manner.

For purposes of present disclosure, phrases "A and/or B" and "A or B" mean (A), (B), or (A and B). In at least one embodiment, phrase "A, B, and/or C" means (A), (B), (C), (A and B), (A and C), (B and C), or (A, B and C).

Here, "left," "right," "front," "back," "top," "bottom," "over," "under," and like in description and in claims, if any, are used for descriptive purposes and not necessarily for describing permanent relative positions. In at least one embodiment, "over," "under," "front side," "back side," "top," "bottom," "over," "under," and "on" as used herein refer to a relative position of one component, structure, or material with respect to other referenced components, structures or materials within a device, where such physical relationships are noteworthy. In at least one embodiment, these terms are employed herein for descriptive purposes only and predominantly within context of a device z-axis and therefore may be relative to an orientation of a device. In at least one embodiment, a first material "over" a second material in context of a figure provided herein may also be "under" second material if device is oriented upside-down relative to context of figure provided. In context of materials, one material disposed over or under another may be directly in contact or may have one or more intervening materials. Moreover, one material disposed between two materials may be directly in contact with two layers or may have one or more intervening layers. In at least one embodiment, a first material "on" a second material is in direct contact with that second material. Similar distinctions are to be made in context of component assemblies.

Here, "between" may be employed in context of z-axis, x-axis, or y-axis of a device. In at least one embodiment, a material that is between two other materials may be in contact with one or both of those materials, or it may be separated from both of other two materials by one or more intervening materials. In at least one embodiment, a material "between" two other materials may therefore be in contact with either of other two materials, or it may be coupled to other two materials through an intervening material. In at least one embodiment, a device that is between two other devices may be directly connected to one or both of those devices, or it may be separated from both of other two devices by one or more intervening devices.

Here, multiple non-silicon semiconductor material layers may be stacked within a single fin structure. In at least one embodiment, multiple non-silicon semiconductor material layers may include one or more "P-type" layers that are suitable (e.g., offer higher hole mobility than silicon) for P-type transistors. In at least one embodiment, multiple non-silicon semiconductor material layers may further include one or more "N-type" layers that are suitable (e.g., offer higher electron mobility than silicon) for N-type transistors. In at least one embodiment, multiple non-silicon semiconductor material layers may further include one or more intervening layers separating N-type from P-type layers. In at least one embodiment, intervening layers may be at least partially sacrificial, for example to allow one or more of a gate, source, or drain to wrap completely around a channel region of one or more of N-type and P-type transistors. In at least one embodiment, multiple non-silicon semiconductor material layers may be fabricated, at least in part, with self-aligned techniques such that a stacked CMOS device may include both a high-mobility N-type and P-type transistor with a footprint of a single FET (field effect transistor).

Here, "backend" or back-end-of-line (BOEL) may generally refer to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of backend of die. Here, "frontend" may generally refer to a section of die that includes active region (e.g., where transistors are fabricated) and low-level metal layers and corresponding vias that are closer to active region (e.g., metal layer 5 and below in ten-metal stack die, for example).

Reference in specification to "an embodiment," "one embodiment," "in at least one embodiment," "some embodiments," or "other embodiments" means that a particular feature, structure, or characteristic described in connection with embodiments is included in at least some embodiments, but not necessarily all embodiments. Various appearances of "an embodiment," "one embodiment," "in at least one embodiment," or "some embodiments" are not necessarily all referring to same embodiments. If specification states a component, feature, structure, or characteristic "may," "might," or "could" be included, that particular component, feature, structure, or characteristic is not required to be included. If specification or claim refers to "a" or "an" element, that does not mean there is only one of elements. If specification or claims refer to "an additional" element, that does not preclude there being more than one of additional elements.

Furthermore, particular features, structures, functions, or characteristics may be combined in any suitable manner in one or more embodiments. For example, a first embodiment may be combined with a second embodiment anywhere particular features, structures, functions, or characteristics associated with two embodiments are not mutually exclusive.

While at least one embodiment has been described in conjunction with specific embodiments thereof, many alternatives, modifications and variations of such embodiments will be apparent to those of ordinary skill in the art considering description herein. At least one embodiment is intended to embrace all such alternatives, modifications, and variations as to fall within broad scope of appended claims.

In addition, well-known power/ground connections to integrated circuit (IC) chips and other components may or may not be shown within presented figures, for simplicity of illustration and discussion, and so as not to obscure any embodiment. Further, arrangements may be shown in block diagram form to avoid obscuring any embodiment, and in view of the fact that specifics with respect to implementation of such block diagram arrangements are highly dependent upon the platform within which an embodiment is to be implemented (e.g., such specifics should be well within purview of one skilled in art). Where specific details (e.g., circuits) are set forth to describe example embodiments of disclosure, it should be apparent to one skilled in art that disclosure can be practiced without, or with variation of, these specific details. Description of an embodiment is thus to be regarded as illustrative instead of limiting.

In at least one embodiment, structures described herein can also be described as method(s) of forming those structures or apparatuses, and method(s) of operation of these structures or apparatuses. Following examples are provided that illustrate at least one embodiment. An example can be combined with any other example. As such, at least one embodiment can be combined with at least another embodiment without changing scope of an embodiment.

Example 1: An apparatus comprising: a plurality of capacitors, wherein an individual capacitor is coupled to a node and an individual plate-line; a first transistor coupled to the node; a second transistor coupled in series with the first transistor, wherein the second transistor is coupled to a sense-line; and a third transistor coupled to the node and a bit-line, wherein the third transistor is controllable by a word-line, wherein the word-line is parallel to the individual plate-line.

Example 2: The apparatus of example 1, wherein the second transistor is controllable to reduce leakage through the node to the sense-line.

Example 3: The apparatus of example 1, wherein the second transistor is controllable by the word-line.

Example 4: The apparatus of example 1, wherein the first transistor is smaller in size than the second transistor.

Example 5: The apparatus of example 1, wherein the second transistor is controllable by a read word-line separate from the word-line.

Example 6: The apparatus of example 1, wherein the individual capacitor comprises a non-linear polar material.

Example 7: The apparatus of example 6, wherein the non-linear polar material is directly on the node.

Example 8: The apparatus of example 6, wherein the non-linear polar material is one of a ferroelectric material, a paraelectric material, or a non-linear dielectric material.

Example 9: The apparatus of example 6, wherein the non-linear polar material is doped with one or more elements of a 3d, 4d, 5d, 6d, 4f, and 5f series of a periodic table.

Example 10: The apparatus of example 6, wherein the non-linear polar material includes one of: a perovskite material which includes one of: $BaTiO_3$, $PbTiO_3$, $KNbO_3$, or $NaTaO_3$; bismuth ferrite (BFO); barium titanate (BTO); BFO doped with one of: Sc, Ti, V, Cr, Mn, Fe, Co, Ni, Cu, or Zn; BTO doped with one of: Sc, Ti, V, Cr, Mn, Fe, Co, Ni, Cu, or Zn; LBFO doped with Mn; lead zirconium titanate (PZT), or PZT with a doping material, wherein the doping material is one of La, Nb, Mn, or 5d series elements; bismuth ferrite (BFO) with a doping material, wherein the doping material is one of: lanthanum, elements from lanthanide series of a periodic table, or elements of a 3d, 4d, 5d, 6d, 4f, and 5f series of the periodic table; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x)ExOy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, where x and y are fractions, y doped $HfO_2$, where y includes one of: Al, Ca, Ce, Dy, Er, Gd, Ge, La, Sc, Si, Sr, Sn, or Y—;

or niobate type compounds $LiNbO_3$, $LiTaO_3$, lithium iron tantalum oxyfluoride, barium strontium niobate, sodium barium niobate, or potassium strontium niobate; an improper ferroelectric material which includes one of: [PTO/STO]n or [LAO/STO]n, wherein 'n' is between 1 and 100, or a paraelectric material that comprises $SrTiO_3$, $Ba(x)Sr(y)TiO3$, $HfZrO_2$, Hf—Si—O, La-substituted $PbTiO_3$, or a PMN-PT based relaxor ferroelectrics; or a paraelectric material that comprises SrTiO3, Ba(x)Sr(y)TiO3, HfZrO2, Hf—Si—O, or a PMN-PT based relaxor ferroelectric.

Example 11: The apparatus of example 1, wherein the plurality of capacitors are planar capacitors that are arranged in a stacked and/or folded configuration.

Example 12: The apparatus of example 1, wherein the bit-line is orthogonal to the word-line and the individual plate-line.

Example 13: An apparatus comprising: a plurality of capacitors, wherein an individual capacitor is coupled to a node and an individual plate-line; a first transistor having a first gate terminal coupled to the node, and a first drain terminal coupled to a reference; a second transistor coupled in series with the first transistor such that a first source terminal of the first transistor is coupled to a second drain terminal of the second transistor, wherein a second source terminal of the second transistor is coupled to a sense-line; and a third transistor having a third source terminal coupled to a bit-line, a third drain terminal coupled the node, and a third gate terminal coupled to a word-line.

Example 14: The apparatus of example 13, wherein the word-line is parallel to the individual plate-line, wherein the word-line is orthogonal to the bit-line.

Example 15: The apparatus of example 13, wherein the second transistor has a second gate terminal which is controllable by the word-line, or wherein the second gate terminal is controllable by a read word-line.

Example 16: The apparatus of example 13, wherein the second transistor is controllable to reduce leakage through the node to the sense-line.

Example 17: The apparatus of example 13, wherein the second transistor is smaller in size than the first transistor.

Example 18: The apparatus of example 13, wherein the individual capacitor comprises a non-linear polar material.

Example 19: The apparatus of example 18, wherein the non-linear polar material is directly on the node.

Example 20: A system comprising: a memory to store instructions; a processor circuitry to execute the instructions; and a communication interface to allow the processor circuitry to communicate with another device, wherein the memory includes: a plurality of capacitors, wherein an individual capacitor is coupled to a node and an individual plate-line; a first transistor having a first drain terminal coupled to a reference; a second transistor coupled in series with the first transistor such that a first source terminal of the first transistor is coupled to a second drain terminal of the second transistor, wherein a second source terminal of the second transistor is coupled to a sense-line, wherein the second transistor has a gate terminal coupled to the node; and a third transistor having a third source terminal coupled to a bit-line, a third drain terminal coupled the node, and a third gate terminal coupled to a word-line.

Example 1a: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node; a fourth transistor coupled in series with the third transistor, wherein the fourth transistor is coupled to a sense-line; and a fifth transistor coupled to the third node and a bit-line.

Example 2a: The apparatus of example 1a, wherein the third transistor has a third drain terminal coupled to a reference.

Example 3a: The apparatus of example 1a, wherein the fourth transistor is controllable to reduce leakage through the third node.

Example 4a: The apparatus of example 1a, wherein the fifth transistor is controllable by a word-line, and wherein the fourth transistor is smaller in size than the third transistor.

Example 5a: The apparatus of example 1a, wherein the fourth transistor is controllable by a word-line.

Example 6a: The apparatus of example 1a, wherein the fourth transistor is controllable by a read word-line.

Example 7a: The apparatus of example 1a, wherein the first individual capacitor comprises a non-linear polar material.

Example 8a: The apparatus of example 7a, wherein the non-linear polar material is directly on the first node.

Example 9a: The apparatus of example 7a, wherein the non-linear polar material is one of a ferroelectric material, a paraelectric material, or a non-linear dielectric material.

Example 10a: The apparatus of example 7a, wherein the non-linear polar material is doped with one or more elements of a 3d, 4d, 5d, 6d, 4f, and 5f series of a periodic table.

Example 11a: The apparatus of example 7a, wherein the non-linear polar material is according to non-linear polar material described herein.

Example 12a: The apparatus of example 1a, wherein the first plurality of capacitors and the second plurality of capacitors are planar capacitors that are arranged in a stacked and/or folded configuration.

Example 13a: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node and to a sense-line; a fourth transistor coupled in series with the third transistor, wherein the fourth transistor is coupled to a reference; and a fifth transistor coupled to the third node and a bit-line.

Example 14a: The apparatus of example 13a, wherein the fifth transistor is controllable by a word-line, wherein the first individual plate-line is parallel to the word-line.

Example 15a: The apparatus of example 14a, wherein the fourth transistor has a fourth gate terminal controllable by the word-line.

Example 16a: The apparatus of example 14a, wherein the fourth transistor has a fourth gate terminal controllable by a read word-line.

Example 17a: The apparatus of example 13a, wherein the fourth transistor is controllable to reduce leakage through the third node to the sense-line.

Example 18a: The apparatus of example 13a, wherein the fourth transistor is smaller in size than the third transistor.

Example 19a: The apparatus of example 12a, wherein the first individual capacitor comprises a non-linear polar material.

Example 20a: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node; a fourth transistor coupled in series with the third transistor, wherein the fourth transistor is coupled to a sense-line; and a fifth transistor coupled to the third node and a bit-line.

Example 1b: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node; a fourth transistor coupled in series with the third transistor, wherein the fourth transistor is coupled to a sense-line; a fifth transistor coupled to the first node and a bit-line; and a sixth transistor coupled to the second node and the bit-line.

Example 2b: The apparatus of example 1b, wherein the third transistor has a third drain terminal coupled to a reference.

Example 3b: The apparatus of example 1b, wherein the fourth transistor is controllable to reduce leakage through the third node.

Example 4b: The apparatus of example 1b, wherein the fifth transistor is controllable by a first word-line, wherein the sixth transistor is controllable by a second word-line, wherein the fourth transistor is smaller in size than the third transistor.

Example 5b: The apparatus of example 4b, wherein the fourth transistor is controllable by the first word-line or the second word-line.

Example 6b: The apparatus of example 1b, wherein the fourth transistor is controllable by a read word-line.

Example 7b: The apparatus of example 1b, wherein the first individual capacitor comprises a non-linear polar material.

Example 8b: The apparatus of example 7b, wherein the non-linear polar material is directly on the first node.

Example 9b: The apparatus of example 7b, wherein the non-linear polar material is one of a ferroelectric material, a paraelectric material, or a non-linear dielectric material.

Example 10b: The apparatus of example 7b, wherein the non-linear polar material is doped with one or more elements of a 3d, 4d, 5d, 6d, 4f, and 5f series of a periodic table.

Example 11b: The apparatus of example 7b, wherein the non-linear polar material is according to any of the non-linear polar material discussed herein.

Example 12b: The apparatus of example 1b, wherein the first plurality of capacitors and the second plurality of capacitors are planar capacitors that are arranged in a stacked and/or folded configuration.

Example 13b: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node and to a sense-line; a fourth transistor coupled in series with the third transistor, wherein the fourth transistor is coupled to a reference; a fifth transistor coupled to the first node and a bit-line; and a sixth transistor coupled to the second node and the bit-line.

Example 14b: The apparatus of example 13b, wherein the fifth transistor is controllable by a first word-line, wherein the sixth transistor is controllable by a second word-line, wherein the first individual plate-line is parallel to the first word-line.

Example 15b: The apparatus of example 14b, wherein the fourth transistor has a fourth gate terminal controllable by a read word-line.

Example 16b: The apparatus of example 14b, wherein the fourth transistor has a fourth gate terminal controllable by the first word-line or the second word-line.

Example 17b: The apparatus of example 13b, wherein the fourth transistor is controllable to reduce leakage through the third node to the sense-line.

Example 18b: The apparatus of example 13b, wherein the fourth transistor is smaller in size than the third transistor.

Example 19b: The apparatus of example 12b, wherein the first individual capacitor comprises a non-linear polar material.

Example 20b: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node; a fourth transistor coupled in series with the third transistor, wherein the fourth transistor is coupled to a sense-line; a fifth transistor coupled to the first node and a bit-line; and a sixth transistor coupled to the second node and the bit-line.

Example 1c: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a source terminal coupled to a sense-line, and a drain terminal coupled to a reference; and a fourth transistor coupled to the third node and a bit-line.

Example 2c: The apparatus of example 1c, wherein the fourth transistor is controllable by a word-line, wherein the word-line is parallel to the first individual plate-line and the second individual plate-line.

Example 3c: The apparatus of example 2c, wherein the word-line is orthogonal to the sense-line and the bit-line.

Example 4c: The apparatus of example 1c, wherein the first individual capacitor comprises a non-linear polar material.

Example 5c: The apparatus of example 4c, wherein the non-linear polar material is directly on the first node.

Example 6c: The apparatus of example 4c, wherein the non-linear polar material is one of a ferroelectric material, a paraelectric material, or a non-linear dielectric material.

Example 7c: The apparatus of example 4c, wherein the non-linear polar material is doped with one or more elements of a 3d, 4d, 5d, 6d, 4f, and 5f series of a periodic table.

Example 8c: The apparatus of example 4c, wherein the non-linear polar material includes any of the non-linear polar material discussed herein.

Example 9c: The apparatus of example 1c, wherein the first plurality of capacitors and the second plurality of capacitors are planar capacitors that are arranged in a stacked and/or folded configuration.

Example 10c: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, wherein the third transistor has a third drain terminal coupled to a reference, wherein the third transistor has a third source terminal coupled to a sense-line; a fourth transistor coupled to the first node and a bit-line; and a fifth transistor coupled to the second node and the bit-line.

Example 11c: The apparatus of example 10c, wherein the fourth transistor is controllable by a first word-line, wherein the fifth transistor is controllable by a second word-line.

Example 12c: The apparatus of example 11c, wherein the first individual plate-line is parallel to the first word-line.

Example 13c: The apparatus of example 12c, wherein the first individual capacitor comprises a non-linear polar material.

Example 14c: The apparatus of example 12c, wherein the first plurality of capacitors and the second plurality of capacitors are planar capacitors that are arranged in a stacked and/or folded configuration.

Example 15c: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a source terminal coupled to a sense-line, and a drain terminal coupled to a reference; and a fourth transistor coupled to the third node and a bit-line.

Example 16c: The system of example 15c, wherein the fourth transistor is controllable by a word-line, wherein the word-line is parallel to the first individual plate-line and the second individual plate-line.

Example 17c: The system of example 16c, wherein the word-line is orthogonal to the sense-line and the bit-line.

Example 18c: The system of example 15c, wherein the first individual capacitor comprises a non-linear polar material.

Example 19c: The system of example 18c, wherein the non-linear polar material is directly on the first node.

Example 20c: The system of example 18c, wherein the non-linear polar material is doped with one or more elements of a 3d, 4d, 5d, 6d, 4f, and 5f series of a periodic table.

Example 1d: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third drain terminal coupled to a reference; a fourth transistor coupled in series with the third transistor, wherein a third source terminal of the third transistor is coupled to a fourth drain terminal of the fourth transistor, wherein a fourth source terminal of the fourth transistor is coupled to a sense-line; a fifth transistor coupled to the first node and a first bit-line; and a sixth transistor coupled to the second node a second bit-line.

Example 2d: The apparatus of example 1d, wherein the fifth transistor and the sixth transistor are controllable by a word-line.

Example 3d: The apparatus of example 2d, wherein the word-line is parallel to the first individual plate-line and the second individual plate-line.

Example 4d: The apparatus of example 2d, wherein the word-line is orthogonal to the sense-line and the first bit-line.

Example 5d: The apparatus of example 1d, wherein the first individual plate-line and the second individual plate-line are electrically shorted together.

Example 6d: The apparatus of example 1d, wherein the first individual capacitor comprises a non-linear polar material.

Example 7d: The apparatus of example 6d, wherein the non-linear polar material is directly on the first node.

Example 8d: The apparatus of example 6d, wherein the non-linear polar material is one of a ferroelectric material, a paraelectric material, or a non-linear dielectric material.

Example 9d: The apparatus of example 6d, wherein the non-linear polar material is doped with one or more elements of a 3d, 4d, 5d, 6d, 4f, and 5f series of a periodic table.

Example 10d: The apparatus of example 6d, wherein the non-linear polar material includes a non-linear pilar material according to any one of non-linear pilar material discussed herein.

Example 11d: The apparatus of example 1d, wherein the first plurality of capacitors and the second plurality of capacitors are planar capacitors that are arranged in a stacked and/or folded configuration.

Example 12d: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third source terminal coupled to a sense-line; a fourth transistor coupled in series with the third transistor, wherein a third drain terminal of the third transistor is coupled to a fourth source terminal of the fourth transistor, wherein a fourth drain terminal of the fourth transistor is coupled to a reference; a fifth transistor coupled to the first node and a first bit-line; and a sixth transistor coupled to the second node a second bit-line.

Example 13d: The apparatus of example 12d, wherein the fifth transistor and the sixth transistor are controllable by a word-line.

Example 14d: The apparatus of example 13d, wherein the word-line is parallel to the first individual plate-line and the second individual plate-line.

Example 15d: The apparatus of example 13d, wherein the word-line is orthogonal to the sense-line and the first bit-line.

Example 16d: The apparatus of example 12d, wherein the first individual plate-line and the second individual plate-line are electrically shorted together.

Example 17d: The apparatus of example 12d, wherein the first individual capacitor comprises a non-linear polar material.

Example 18d: The apparatus of example 12d, wherein the first plurality of capacitors and the second plurality of capacitors are planar capacitors that are arranged in a stacked and/or folded configuration.

Example 19d: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third drain terminal coupled to a reference; a fourth transistor coupled in series with the third transistor, wherein a third source terminal of the third transistor is coupled to a fourth drain terminal of the fourth transistor, wherein a fourth source terminal of the fourth transistor is coupled to a sense line; a fifth transistor coupled to the first node and a first bit-line; and a sixth transistor coupled to the second node a second bit-line.

Example 20d: The system of example 19d, wherein the first plurality of capacitors and the second plurality of capacitors are planar capacitors that are arranged in a stacked and/or folded configuration.

Example 1e: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third drain terminal coupled to a reference, and a third source terminal coupled to a sense-line; a fourth transistor coupled to the first node and a first bit-line; and a fifth transistor coupled to the second node a second bit-line.

Example 2e: The apparatus of example 1e, wherein the fourth transistor and the fifth transistor are controllable by a word-line.

Example 3e: The apparatus of example 2e, wherein the word-line is parallel to the first individual plate-line and the second individual plate-line.

Example 4e: The apparatus of example 2e, wherein the word-line is orthogonal to the sense-line and the first bit-line.

Example 5e: The apparatus of example 1e, wherein the first individual plate-line and the second individual plate-line are electrically shorted together.

Example 6e: The apparatus of example 1e, wherein the first individual capacitor comprises a non-linear polar material.

Example 7e: The apparatus of example 6e, wherein the non-linear polar material is directly on the first node.

Example 8e: The apparatus of example 6e, wherein the non-linear polar material is one of a ferroelectric material, a paraelectric material, or a non-linear dielectric material.

Example 9e: The apparatus of example 6e, wherein the non-linear polar material is doped with one or more elements of a 3d, 4d, 5d, 6d, 4f, and 5f series of a periodic table.

Example 10e: The apparatus of example 6e, wherein the non-linear polar material is according to any one of non-linear polar material discussed herein.

Example 11e: The apparatus of example 1e, wherein the first plurality of capacitors and the second plurality of capacitors are planar capacitors that are arranged in a stacked and/or folded configuration.

Example 12e: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a gain transistor having a gate terminal coupled to a third node, a source terminal coupled to a sense-line and a drain terminal coupled to a reference; and a set of transistors to controllably couple the first plurality of capacitors and the second plurality of capacitors to gain transistor via the third node.

Example 13e: The apparatus of example 12e comprising a first access transistor coupled to the first node and a first bit-line.

Example 14c: The apparatus of example 13e comprising a second access transistor coupled to the second node and a second bit-line.

Example 15e: The apparatus of example 14e, wherein the first access transistor and the second access transistor are controllable by a word-line.

Example 16e: The apparatus of example 15e, wherein the word-line is parallel to the first individual plate-line and the second individual plate-line.

Example 17c: The apparatus of example 15e, wherein the word-line is orthogonal to the sense-line and the first bit-line.

Example 18c: The apparatus of example 12e, wherein the first individual plate-line and the second individual plate-line are electrically shorted together.

Example 19c: The apparatus of example 12, wherein the first plurality of capacitors and the second plurality of capacitors are planar capacitors that are arranged in a stacked and/or folded configuration.

Example 20c: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a gain transistor having a gate terminal coupled to a third node, a source terminal coupled to a sense-line and a drain terminal coupled to a reference; and a set of transistors to controllably couple the first plurality of capacitors and the second plurality of capacitors to gain transistor via the third node.

Example 1f: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third drain terminal coupled to a reference; a fourth transistor coupled in series with the third transistor, wherein a third source terminal of the third transistor is coupled to a fourth drain terminal of the fourth transistor, wherein a fourth source terminal of the fourth transistor is coupled to a sense-line; a fifth transistor coupled to the first node and a bit-line; and a sixth transistor coupled to the second node the bit-line.

Example 2f: The apparatus of example 1f, wherein the fifth transistor and the sixth transistor are controllable by a word-line.

Example 3f: The apparatus of example 2f, further comprising: a third plurality of capacitors, wherein a third individual capacitor of the third plurality of capacitors is coupled to a fourth node and the first individual plate-line; and a fourth plurality of capacitors, wherein a fourth individual capacitor of the fourth plurality of capacitors is coupled to a fifth node and the second individual plate-line.

Example 4f: The apparatus of example 3f, further comprises: a seventh transistor having a seventh gate terminal coupled to a third control, wherein the seventh transistor is coupled to the third node and the fourth node; and an eighth transistor having an eighth gate terminal coupled to by a fourth control, wherein the eighth transistor is coupled to the third node and the fifth node.

Example 5f: The apparatus of example 4f, wherein the bit-line is a first bit-line, wherein the apparatus further comprises: a ninth transistor coupled to the fourth node and a second bit-line; and a tenth transistor coupled to the fifth node the second bit-line.

Example 6f: The apparatus of example 5f, wherein the ninth transistor and the tenth transistor are controllable by the word-line.

Example 7f: The apparatus of example 2f, wherein the word-line is parallel to the first individual plate-line and the second individual plate-line.

Example 8f: The apparatus of example 2f, wherein the word-line is orthogonal to the sense-line and the bit-line.

Example 9f: The apparatus of example 1f, wherein the first individual capacitor comprises a non-linear polar material.

Example 10f: The apparatus of example 9f, wherein the non-linear polar material is directly on the first node.

Example 11f: The apparatus of example 10f, wherein the non-linear polar material is one of a ferroelectric material, a paraelectric material, or a non-linear dielectric material.

Example 12f: The apparatus of example 10f, wherein the non-linear polar material is doped with one or more elements of a 3d, 4d, 5d, 6d, 4f, and 5f series of a periodic table.

Example 13f: The apparatus of example 10f, wherein the non-linear polar material is according to any one of non-linear polar materials discussed herein.

Example 14f: The apparatus of example 1f, wherein the first plurality of capacitors and the second plurality of capacitors are planar capacitors that are arranged in a stacked and/or folded configuration.

Example 15f: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third source terminal coupled to a sense-line; a fourth transistor coupled in series with the third transistor, wherein a third drain terminal of the third transistor is coupled to a fourth source terminal of the fourth transistor, wherein a fourth drain terminal of the fourth transistor is coupled to a reference; a fifth transistor coupled to the first node and a bit-line; and a sixth transistor coupled to the second node the bit-line.

Example 16f: The apparatus of example 14f, wherein the fifth transistor and the sixth transistor are controllable by a word-line.

Example 17f: The apparatus of example 16f, further comprising: a third plurality of capacitors, wherein a third individual capacitor of the third plurality of capacitors is coupled to a fourth node and the first individual plate-line; and a fourth plurality of capacitors, wherein a fourth individual capacitor of the fourth plurality of capacitors is coupled to a fifth node and the second individual plate-line.

Example 18f: The apparatus of example 17f, further comprises: a seventh transistor having a seventh gate terminal coupled to a third control, wherein the seventh transistor is coupled to the third node and the fourth node; and an eighth transistor having an eighth gate terminal coupled to by a fourth control, wherein the eighth transistor is coupled to the third node and the fifth node.

Example 19f: The apparatus of example 18f, wherein the bit-line is a first bit-line, wherein the apparatus further comprises: a ninth transistor coupled to the fourth node and a second bit-line; and a tenth transistor coupled to the fifth node the second bit-line.

Example 20f: The apparatus of example 19f, wherein the ninth transistor and the tenth transistor are controllable by the word-line.

Example 21f: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third drain terminal coupled to a reference, and a third source terminal coupled to a sense-line; a fourth transistor coupled to the first node and a bit-line; and a fifth transistor coupled to the second node the bit-line.

Example 22f: The system of example 21f, wherein the fourth transistor and the fifth transistor are controllable by a word-line, wherein the memory further comprises: a third plurality of capacitors, wherein a third individual capacitor of the third plurality of capacitors is coupled to a fourth node and the first individual plate-line; and a fourth plurality of capacitors, wherein a fourth individual capacitor of the fourth plurality of capacitors is coupled to a fifth node and the second individual plate-line.

Example 23f: The system of example 22f, wherein the memory further comprises: a seventh transistor having a seventh gate terminal coupled to a third control, wherein the seventh transistor is coupled to the third node and the fourth node; and an eighth transistor having an eighth gate terminal coupled to by a fourth control, wherein the eighth transistor is coupled to the third node and the fifth node.

Example 24f: The system of example 23f, wherein the bit-line is a first bit-line, wherein the memory further comprises: a ninth transistor coupled to the fourth node and a second bit-line; and a tenth transistor coupled to the fifth node the second bit-line.

Example 25f: The system of example 24f, wherein the ninth transistor and the tenth transistor are controllable by the word-line.

Example 1g: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third drain terminal coupled to a reference; a fourth transistor coupled in series with the third transistor, wherein a third source terminal of the third transistor is coupled to a fourth drain terminal of the fourth transistor, wherein a fourth source terminal of the fourth transistor is coupled to a sense-line; and a fifth transistor coupled to the third node and a bit-line.

Example 2g: The apparatus of example 1g, further comprising: a third plurality of capacitors, wherein a third individual capacitor of the third plurality of capacitors is coupled to a fourth node and the first individual plate-line; and a fourth plurality of capacitors, wherein a fourth individual capacitor of the fourth plurality of capacitors is coupled to a fifth node and the second individual plate-line.

Example 3g: The apparatus of example 2g, further comprises: a sixth transistor having a sixth gate terminal coupled to a third control, wherein the sixth transistor is coupled to the third node and the fourth node; and a seventh transistor having a seventh gate terminal coupled to by a fourth control, wherein the seventh transistor is coupled to the third node and the fifth node.

Example 4g: The apparatus of example 3g, wherein the bit-line is a first bit-line, wherein the apparatus further comprises an eighth transistor coupled to the third node and a second bit-line.

Example 5g: The apparatus of example 4g, wherein the fifth transistor and the eighth transistor are controllable by a word-line.

Example 6g: The apparatus of example 5g, wherein the word-line is parallel to the first individual plate-line and the second individual plate-line.

Example 7g: The apparatus of example 5g, wherein the word-line is orthogonal to the sense-line and the bit-line.

Example 8g: The apparatus of example 1g, wherein the first individual capacitor comprises a non-linear polar material.

Example 9g: The apparatus of example 8g, wherein the non-linear polar material is directly on the first node.

Example 10g: The apparatus of example 9g, wherein the non-linear polar material is one of a ferroelectric material, a paraelectric material, or a non-linear dielectric material.

Example 11g: The apparatus of example 9g, wherein the non-linear polar material is doped with one or more elements of a 3d, 4d, 5d, 6d, 4f, and 5f series of a periodic table.

Example 12g: The apparatus of example 9g, wherein the non-linear polar material is according to any one of non-linear polar material discussed herein.

Example 13g: The apparatus of example 1g, wherein the first plurality of capacitors and the second plurality of capacitors are planar capacitors that are arranged in a stacked and/or folded configuration.

Example 14g: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third source terminal coupled to a sense line; a fourth transistor coupled in series with the third transistor, wherein a third drain terminal of the third transistor is coupled to a fourth source terminal of the fourth transistor, wherein a fourth drain terminal of the fourth transistor is coupled to a reference; and a fifth transistor coupled to the third node and a bit-line.

Example 15g: The apparatus of example 14g, further comprising: a third plurality of capacitors, wherein a third individual capacitor of the third plurality of capacitors is coupled to a fourth node and the first individual plate-line; and a fourth plurality of capacitors, wherein a fourth individual capacitor of the fourth plurality of capacitors is coupled to a fifth node and the second individual plate-line.

Example 16g: The apparatus of example 15g, further comprises: a sixth transistor having a sixth gate terminal coupled to a third control, wherein the sixth transistor is coupled to the third node and the fourth node; and a seventh transistor having a seventh gate terminal coupled to by a fourth control, wherein the seventh transistor is coupled to the third node and the fifth node.

Example 17g: The apparatus of example 16g, wherein the bit-line is a first bit-line, wherein the apparatus further comprises an eighth transistor coupled to the third node and a second bit-line.

Example 18g: The apparatus of example 17g, wherein the fifth transistor and the eighth transistor are controllable by a word-line.

Example 19g: The apparatus of example 18g, wherein the word-line is parallel to the first individual plate-line and the second individual plate-line.

Example 20g: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor having a third gate terminal coupled to the third node, a third drain terminal coupled to a reference, and a third source terminal coupled to a sense-line; and a fourth transistor coupled to the third node and a bit-line.

Example 21g: The system of example 20g, wherein the memory further comprising: a third plurality of capacitors, wherein a third individual capacitor of the third plurality of capacitors is coupled to a fourth node and the first individual plate-line; and a fourth plurality of capacitors, wherein a fourth individual capacitor of the fourth plurality of capacitors is coupled to a fifth node and the second individual plate-line.

Example 22g: The system of example 21g, wherein the memory further comprises: a sixth transistor having a sixth gate terminal coupled to a third control, wherein the sixth transistor is coupled to the third node and the fourth node; and a seventh transistor having a seventh gate terminal coupled to by a fourth control, wherein the seventh transistor is coupled to the third node and the fifth node.

Example 23g: The system of example 22g, wherein the bit-line is a first bit-line, wherein the memory further comprises an eighth transistor coupled to the third node and a second bit-line.

Example 24g: The system of example 23g, wherein the fourth transistor and the eighth transistor are controllable by a word-line.

Example 25g: The system of example 24g, wherein the word-line is parallel to the first individual plate-line and the second individual plate-line.

Example 1h: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor coupled to the third node, and controllable by a third control; a fourth node, wherein the third transistor is coupled to the fourth node; and a fourth transistor controllable by a word-line and coupled to the fourth node and a bit-line.

Example 2h: The apparatus of example 1h comprising a fifth transistor having a fifth gate terminal coupled to the fourth node, a fifth drain terminal coupled to a reference.

Example 3h: The apparatus of example 2h comprising a sixth transistor coupled in series with the fifth transistor, wherein a fifth source terminal of the fifth transistor is coupled to a sixth drain terminal of the sixth transistor, wherein a sixth source terminal of the sixth transistor is coupled to a sense-line.

Example 4h: The apparatus of example 3h, further comprising: a third plurality of capacitors, wherein a third individual capacitor of the third plurality of capacitors is coupled to a fifth node and the first individual plate-line; and a fourth plurality of capacitors, wherein a fourth individual capacitor of the fourth plurality of capacitors is coupled to a sixth node and the second individual plate-line.

Example 5h: The apparatus of example 4h, further comprises: a seventh transistor having a seventh gate terminal coupled to a fourth control, wherein the seventh transistor is coupled to the fifth node; an eighth transistor having an eighth gate terminal coupled to by a fifth control, wherein the eighth transistor is coupled to the sixth node; a seventh node, wherein the seventh transistor and the eighth transistor are coupled to the seventh node; a ninth transistor coupled to the seventh node, and controllable by a sixth control, wherein the ninth transistor is coupled to the fourth node, wherein the bit-line is a first bit-line; and a tenth transistor controllable by the word-line and coupled to the fourth node and a second bit-line.

Example 6h: The apparatus of example 1h, wherein the word-line is parallel to the first individual plate-line and the second individual plate-line.

Example 7h: The apparatus of example 3h, wherein the word-line is orthogonal to the sense-line and the bit-line.

Example 8h: The apparatus of example 1h, wherein the first individual capacitor comprises a non-linear polar material.

Example 9h: The apparatus of example 8h, wherein the non-linear polar material is directly on the first node.

Example 10h: The apparatus of example 8h, wherein the non-linear polar material is one of a ferroelectric material, a paraelectric material, or a non-linear dielectric material.

Example 11h: The apparatus of example 8h, wherein the non-linear polar material is doped with one or more elements of a 3d, 4d, 5d, 6d, 4f, and 5f series of a periodic table.

Example 12h: The apparatus of example 8h, wherein the non-linear polar material is according to any one of non-linear polar material discussed herein.

Example 13h: The apparatus of example 1h, wherein the first plurality of capacitors and the second plurality of capacitors are planar capacitors that are arranged in a stacked and/or folded configuration.

Example 14h: An apparatus comprising: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor coupled to the third node, and controllable by a third control; a fourth node, wherein the third transistor is coupled to the fourth node; a fourth transistor controllable by a word-line and coupled to the fourth node and a bit-line; a fifth transistor having a fifth gate terminal coupled to a fifth control, a fifth drain terminal coupled to a reference; and a sixth transistor coupled in series with the fifth transistor, wherein a fifth source terminal of the fifth transistor is coupled to a sixth drain terminal of the sixth transistor, wherein a sixth source terminal of the sixth transistor is coupled to a sense line, wherein the sixth transistor has a sixth gate terminal coupled to the fourth node.

Example 15h: The apparatus of example 14h, further comprising: a third plurality of capacitors, wherein a third individual capacitor of the third plurality of capacitors is coupled to a fifth node and the first individual plate-line; and a fourth plurality of capacitors, wherein a fourth individual capacitor of the fourth plurality of capacitors is coupled to a sixth node and the second individual plate-line.

Example 16h: The apparatus of example 15h, further comprises: a seventh transistor having a seventh gate terminal coupled to a fifth control, wherein the seventh transistor is coupled to the fifth node; an eighth transistor having an eighth gate terminal coupled to by a sixth control, wherein the eighth transistor is coupled to the sixth node; a seventh node, wherein the seventh transistor and the eighth transistor are coupled to the seventh node; a ninth transistor coupled to the seventh node, and controllable by a seventh control, wherein the ninth transistor is coupled to the fourth node, wherein the bit-line is a first bit-line; and a tenth transistor controllable by the word-line and coupled to the fourth node and a second bit-line.

Example 17h: A system comprising: a memory to store instructions; a processor circuitry to execute the instructions; and a communication interface to allow the processor circuitry to communicate with another device, wherein the memory includes: a first plurality of capacitors, wherein a first individual capacitor of the first plurality of capacitors is coupled to a first node and a first individual plate-line; a second plurality of capacitors, wherein a second individual capacitor of the second plurality of capacitors is coupled to a second node and a second individual plate-line; a first transistor having a first gate terminal coupled to a first control, wherein the first transistor is coupled to the first node; a second transistor having a second gate terminal coupled to by a second control, wherein the second transistor is coupled to the second node; a third node, wherein the first transistor and the second transistor are coupled to the third node; a third transistor coupled to the third node, and controllable by a third control; a fourth node, wherein the third transistor is coupled to the fourth node; a fourth transistor controllable by a word-line and coupled to the fourth node and a bit-line; and a fifth transistor having a fifth gate terminal coupled to the fourth node, a fifth drain terminal coupled to a reference, a fifth source terminal coupled to a sense line.

Example 18h: The system of example 17h, further comprising: a third plurality of capacitors, wherein a third individual capacitor of the third plurality of capacitors is coupled to a fifth node and the first individual plate-line; and a fourth plurality of capacitors, wherein a fourth individual capacitor of the fourth plurality of capacitors is coupled to a sixth node and the second individual plate-line.

Example 19h: The system of example 18h, further comprises: a sixth transistor having a sixth gate terminal coupled to a fifth control, wherein the sixth transistor is coupled to the fifth node; a seventh transistor having a seventh gate terminal coupled to by a sixth control, wherein the seventh transistor is coupled to the sixth node; a seventh node, wherein the sixth transistor and the seventh transistor are coupled to the seventh node; an eighth transistor coupled to the seventh node, and controllable by a seventh control, wherein the eighth transistor is coupled to the fourth node, wherein the bit-line is a first bit-line; and a ninth transistor controllable by the word-line and coupled to the fourth node and a second bit-line.

Example 20h: The system of example 17h, wherein the first individual capacitor comprises a non-linear polar material.

Example 1i: An apparatus comprising: a first transistor having a first gate terminal coupled to a word-line, a first source terminal couple to a bit-line, and a first drain terminal coupled to a first node; a second transistor coupled to the first transistor, wherein the second transistor includes a second gate terminal coupled to the first node, a second source terminal couple to a sense line, and a second drain terminal coupled to a reference; a third transistor coupled to the first node and a second node, wherein the first transistor is controllable by a first control; a fourth transistor coupled to the first node and a third node, wherein the second transistor is controllable by a second control; a first plurality of capacitors having a first terminal coupled to the second node, wherein a second terminal of a first individual capacitor of the first plurality of capacitors is coupled to a first individual plate-line, wherein the first plurality of capacitors is arranged in a first stacked and folded configuration; and a second plurality of capacitors having a third terminal coupled to the third node, wherein a fourth terminal of a second individual capacitor of the second plurality of capacitors is coupled to a second individual plate-line, wherein the second plurality of capacitors is arranged in a second stacked and folded configuration.

Example 2i: The apparatus of example 1i, wherein the second node extends vertically using vias and metal layers, and wherein the second node is a point of fold in the first stacked and folded configuration.

Example 3i: The apparatus of example 1i, wherein the third node extends vertically using vias and metal layers, and wherein the third node is a point of fold in the second stacked and folded configuration.

Example 4i: The apparatus of example 3i, wherein the first plurality of capacitors has N capacitors that are divided in L number of stacked layers such that there are N/L capacitors in an individual stacked layer of the first stacked and folded configuration.

Example 5i: The apparatus of example 4i, wherein the N/L capacitors are shorted together with an electrode.

Example 6i: The apparatus of example 5i, wherein the electrode comprises metal, a first conducting oxide, or a combination of a second conducting oxide and an insulative material.

Example 7i: The apparatus of example 6i, wherein the electrode is a shared bottom electrode that extends on either side of the point of fold.

Example 8i: The apparatus of example 7i, wherein the first individual capacitor includes a top electrode which is coupled to the first individual plate-line.

Example 9i: The apparatus of example 8i, wherein the top electrode is coupled to the first individual plate-line using a pedestal.

Example 10i: The apparatus of example 9i, wherein the first individual capacitor includes: a first layer coupled to the shared bottom electrode which is coupled to the second node, wherein the first layer comprises a first refractive inter-metallic material, wherein the first layer extends along an x-plane; a second layer on the first layer, wherein the second layer comprises a first conductive oxide, wherein the second layer extends along the x-plane; a third layer comprising non-linear polar material, wherein the third layer is on the second layer, wherein the third layer extends along the x-plane; a fourth layer on the third layer, wherein the fourth layer comprises a second conductive oxide, wherein the fourth layer extends along the x-plane; and a fifth layer on the fourth layer, wherein the fifth layer comprises a second refractive inter-metallic material.

Example 11i: The apparatus of example 10i, wherein the first individual plate-line is coupled to the fifth layer through a switch.

Example 12i: The apparatus of example 10i, wherein: the first refractive inter-metallic material and the second refractive inter-metallic material include one or more of Ta, Ti, Al, W, Ni, Ga, Mn, Fe, B, C, N, or Co; and the first conductive oxide and the second conductive oxide include one or more of: Ir, In, Fe, Ru, Pd, Os, or Re, wherein the apparatus comprises a sixth layer extending along a z-plane, wherein the sixth layer is adjacent to side walls of the first layer, the second layer, the third layer, and the fourth layer, wherein the sixth layer includes one of: Ti—Al—O, Al2O3, or MgO.

Example 13i: The apparatus of example 9i, wherein the first individual capacitor includes: a first layer coupled to the shared bottom electrode which is coupled to the second node, wherein the first layer comprises a first conductive oxide, wherein the first layer extends along an x-plane; a second layer comprising non-linear polar material, wherein the second layer is on the first layer, wherein the second layer extends along the x-plane; and a third layer on the second layer, wherein the third layer comprises a second conductive oxide, wherein the third layer extends along the x-plane, wherein the first individual plate-line is coupled to the third layer.

Example 14i: The apparatus of example 1i, wherein the first individual plate-line is parallel to the word-line.

Example 15i: The apparatus of example 1i, wherein the third transistor and the fourth transistor are back-end-of-line transistors.

Example 16i: The apparatus of example 1i comprising a fifth transistor coupled to the first node and the third transistor and the fourth transistor, wherein the fifth transistor is operable to decouple the third transistor from the first node.

Example 17i: The apparatus of example 1i, wherein the first plurality of capacitors comprises non-linear polar material.

Example 18i: The apparatus of example 17i, wherein the non-linear polar material is doped with one or more elements of a 3d, 4d, 5d, 6d, 4f, and 5f series of a periodic table.

Example 19i: The apparatus of example 17i, wherein the non-linear polar material is according to any one of non-linear polar materials discussed herein.

Example 20i: An apparatus comprising: a first transistor having a first gate terminal coupled to a word-line, a first source terminal couple to a bit-line, and a first drain terminal coupled to a first node; a second transistor coupled to the first transistor, and a second drain terminal coupled to a reference, wherein a second gate terminal of the second transistor is coupled to first control; a third transistor coupled in series with the second transistor, wherein the third transistor includes a third gate terminal coupled to the first node, wherein a second source terminal of the second transistor is coupled to a third drain terminal of the third transistor, wherein a third source terminal of the third transistor is coupled to a sense line; a fourth transistor coupled to the first node and a second node, wherein the fourth transistor is controllable by a second control; a fifth transistor coupled to the first node and a third node, wherein the fifth transistor is controllable by a third control; a first plurality of capacitors arranged in a first stacked and folded configuration and couple to the second node; and a second plurality of capacitors arranged in a second stacked and folded configuration and coupled to the third node.

Example 21i: A system comprising: a memory to store instructions; a processor circuitry to execute the instructions; and a communication interface to allow the processor circuitry to communicate with another device, wherein the memory includes: a first transistor having a first gate terminal coupled to a word-line, a first source terminal couple to a bit-line, and a first drain terminal coupled to a first node; a second transistor coupled to the first transistor, wherein the second transistor includes a second gate terminal coupled to a first control; a third transistor coupled in series with the second transistor, wherein a second source terminal of the second transistor is coupled to a third drain terminal of the third transistor, wherein a third source terminal of the third transistor is coupled to a sense line, wherein a third gate terminal of the third transistor is coupled to the first node; a fourth transistor coupled to the first node and a second node, wherein the fourth transistor is controllable by a second control; a fifth transistor coupled to the first node and a third node, wherein the fifth transistor is controllable by a third control; a first plurality of capacitors arranged in a first stacked and folded configuration and couple to the second node; and a second plurality of capacitors arranged in a second stacked and folded configuration and coupled to the third node.

An abstract is provided that will allow reader to ascertain nature and gist of technical disclosure. Abstract is submitted with an understanding that it will not be used to limit scope or meaning of claims. Following claims are hereby incorporated into detailed description, with each claim standing on its own as a separate embodiment.

We claim:

1. An apparatus comprising:
a first plurality of capacitors, wherein a first individual capacitor of the first plurality of capacitors is coupled to a first node and a first individual plate-line;
a second plurality of capacitors, wherein a second individual capacitor of the second plurality of capacitors is coupled to a second node and a second individual plate-line;
a first transistor having a first gate terminal coupled to a first control, wherein the first transistor is coupled to the first node;
a second transistor having a second gate terminal coupled to by a second control, wherein the second transistor is coupled to the second node;
a third node, wherein the first transistor and the second transistor are coupled to the third node;
a third transistor having a third gate terminal coupled to the third node;
a fourth transistor coupled in series with the third transistor, wherein the fourth transistor is coupled to a sense-line; and
a fifth transistor coupled to the third node and a bit-line.

2. The apparatus of claim 1, wherein the third transistor has a third drain terminal coupled to a reference.

3. The apparatus of claim 1, wherein the fourth transistor is controllable to reduce leakage through the third node.

4. The apparatus of claim 1, wherein the fifth transistor is controllable by a word-line, and wherein the fourth transistor is smaller in size than the third transistor.

5. The apparatus of claim 1, wherein the fourth transistor is controllable by a word-line.

6. The apparatus of claim 1, wherein the fourth transistor is controllable by a read word-line.

7. The apparatus of claim 1, wherein the first individual capacitor comprises a non-linear polar material.

8. The apparatus of claim 7, wherein the non-linear polar material is directly on the first node.

9. The apparatus of claim 7, wherein the non-linear polar material is one of a ferroelectric material, a paraelectric material, or a non-linear dielectric material.

10. The apparatus of claim 7, wherein the non-linear polar material is doped with one or more elements of a 3d, 4d, 5d, 6d, 4f, and 5f series of a periodic table.

11. The apparatus of claim 7, wherein the non-linear polar material includes one of:
a perovskite material which includes one of: $BaTiO_3$, $PbTiO_3$, $KNbO_3$, or $NaTaO_3$;
bismuth ferrite (BFO);
barium titanate (BTO);
BFO doped with one of: Sc, Ti, V, Cr, Mn, Fe, Co, Ni, Cu, or Zn;
BTO doped with one of: Sc, Ti, V, Cr, Mn, Fe, Co, Ni, Cu, or Zn;
LBFO doped with Mn;
lead zirconium titanate (PZT) or PZT with a first doping material, wherein the first doping material is one of La, Nb, Mn, or 5d series elements;
bismuth ferrite (BFO) with a second doping material, wherein the second doping material is one of lanthanum, elements from lanthanide series of a periodic table, or elements of a 3d, 4d, 5d, 6d, 4f, and 5f series of the periodic table;
a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
a hexagonal ferroelectric which includes one of: $YMnO_3$ or $LuFeO_3$;
hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;
hafnium oxides as $Hf_{(1-x)} E_x O_y$, where E includes one of Al, Ca, Ce, Dy, Er, Gd, Ge, La, Sc, Si, Sr, Sn, Zr, or Y, where x and y are first and second fractions, respectively;
$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where x and y are third and fourth fractions, respectively;
y doped $HfO_2$, where y includes one of: Al, Ca, Ce, Dy, Er, Gd, Ge, La, Sc, Si, Sr, Sn, or Y; or niobate type compounds $LiNbO_3$, $LiTaO_3$, lithium iron tantalum oxyfluoride, barium strontium niobate, sodium barium niobate, or potassium strontium niobate;

an improper ferroelectric material which includes one of: [PTO/STO]n or [LAO/STO]n, wherein 'n' is between 1 and 100, or a paraelectric material that comprises $SrTiO_3$, $Ba_{(x)}Sr_{(y)}TiO_3$, $HfZrO_2$, Hf—Si—O, La-substituted $PbTiO_3$, or a PMN-PT based relaxor ferroelectric; or a paraelectric material that comprises $SrTiO_3$, $Ba_{(x)}Sr_{(y)}TiO_3$, $HfZrO_2$, Hf—Si—O, or a PMN-PT based relaxor ferroelectric.

12. The apparatus of claim 1, wherein the first plurality of capacitors and the second plurality of capacitors are planar capacitors that are arranged in a stacked and/or folded configuration.

13. The apparatus of claim 12, wherein the first individual capacitor comprises a non-linear polar material.

14. An apparatus comprising:

a first plurality of capacitors, wherein a first individual capacitor of the first plurality of capacitors is coupled to a first node and a first individual plate-line;

a second plurality of capacitors, wherein a second individual capacitor of the second plurality of capacitors is coupled to a second node and a second individual plate-line;

a first transistor having a first gate terminal coupled to a first control, wherein the first transistor is coupled to the first node;

a second transistor having a second gate terminal coupled to by a second control, wherein the second transistor is coupled to the second node;

a third node, wherein the first transistor and the second transistor are coupled to the third node;

a third transistor having a third gate terminal coupled to the third node and to a sense-line;

a fourth transistor coupled in series with the third transistor, wherein the fourth transistor is coupled to a reference; and a fifth transistor coupled to the third node and a bit-line.

15. The apparatus of claim 14, wherein the fifth transistor is controllable by a word-line, wherein the first individual plate-line is parallel to the word-line.

16. The apparatus of claim 15, wherein the fourth transistor has a fourth gate terminal controllable by the word-line.

17. The apparatus of claim 15, wherein the fourth transistor has a fourth gate terminal controllable by a read word-line.

18. The apparatus of claim 14, wherein the fourth transistor is controllable to reduce leakage through the third node to the sense-line.

19. The apparatus of claim 14, wherein the fourth transistor is smaller in size than the third transistor.

20. A system comprising:

a memory to store instructions;

a processor circuitry to execute the instructions; and a communication interface to allow the processor circuitry to communicate with another device, wherein the memory includes:

a first plurality of capacitors, wherein a first individual capacitor of the first plurality of capacitors is coupled to a first node and a first individual plate-line;

a second plurality of capacitors, wherein a second individual capacitor of the second plurality of capacitors is coupled to a second node and a second individual plate-line;

a first transistor having a first gate terminal coupled to a first control, wherein the first transistor is coupled to the first node;

a second transistor having a second gate terminal coupled to by a second control, wherein the second transistor is coupled to the second node;

a third node, wherein the first transistor and the second transistor are coupled to the third node;

a third transistor having a third gate terminal coupled to the third node;

a fourth transistor coupled in series with the third transistor, wherein the fourth transistor is coupled to a sense-line; and a fifth transistor coupled to the third node and a bit-line.

* * * * *